United States Patent
Furue

(10) Patent No.: US 12,557,547 B2
(45) Date of Patent: Feb. 17, 2026

(54) LIGHT EMITTING ELEMENT AND POLYCYCLIC COMPOUND FOR LIGHT EMITTING ELEMENT

(71) Applicant: Samsung Display Co., Ltd., Yongin-si (KR)

(72) Inventor: Ryuhei Furue, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 797 days.

(21) Appl. No.: 17/932,594

(22) Filed: Sep. 15, 2022

(65) Prior Publication Data

US 2023/0217819 A1 Jul. 6, 2023

(30) Foreign Application Priority Data

Jan. 4, 2022 (KR) .................. 10-2022-0001151

(51) Int. Cl.
| | |
|---|---|
| H01L 51/54 | (2006.01) |
| C07D 471/22 | (2006.01) |
| H10K 50/11 | (2023.01) |
| H10K 85/60 | (2023.01) |

(52) U.S. Cl.
CPC ....... *H10K 85/6572* (2023.02); *C07D 471/22* (2013.01); *H10K 50/11* (2023.02); *H10K 85/615* (2023.02); *H10K 85/633* (2023.02); *H10K 85/654* (2023.02); *H10K 85/657* (2023.02); *H10K 85/6574* (2023.02); *H10K 85/6576* (2023.02)

(58) Field of Classification Search
None
See application file for complete search history.

(56) References Cited

U.S. PATENT DOCUMENTS

| | | |
|---|---|---|
| 7,842,406 B2 | 11/2010 | Huo et al. |
| 9,422,287 B2 | 8/2016 | Parham et al. |
| 11,121,327 B2 | 9/2021 | Parham et al. |
| 2020/0044159 A1 | 2/2020 | Yamatani |
| 2020/0185626 A1 | 6/2020 | Yuuki |
| 2020/0190115 A1 | 6/2020 | Hatakeyama et al. |

FOREIGN PATENT DOCUMENTS

| | | |
|---|---|---|
| JP | 4380277 B2 | 12/2009 |
| JP | WO2018/212169 A1 | 3/2020 |
| KR | 10-1663527 B1 | 10/2016 |
| KR | 10-2020-0014451 A | 2/2020 |
| KR | 10-2020-0071192 A | 6/2020 |
| WO | 2011/128017 A1 | 10/2011 |
| WO | WO 2015/000542 A1 | 1/2015 |

OTHER PUBLICATIONS

Zhou, Leyong et al.; "A Nanoboat with Fused Concave N-Heterotriangulene"; Angewandte Chemie; 2020; pp. 9048-9053.
Zhao, Jianfeng et al.; "Pi-Extended Diindole-Fused Azapentacenone: Synthesis, Characterization, and Photophysical and Lithium-Storage Properties"; Chem. Asian J.; 2016; 11; pp. 1382-1387.
Zhu, Guanxing et al.; "Acess to benzo-fused aza[7]helicene via unexpected indolization of alkyne-amine"; Org. Chem. Fron.; 2021; 8; pp. 5336-5344.

*Primary Examiner* — Andrew K Bohaty
(74) *Attorney, Agent, or Firm* — Womble Bond Dickinson (US) LLP

(57) ABSTRACT

A light emitting element that includes a first electrode, a second electrode, and an emission layer between the first electrode and the second electrode is provided. The emission layer includes a polycyclic compound represented by Formula 1. The light emitting element shows a high emission efficiency and long-life characteristics.

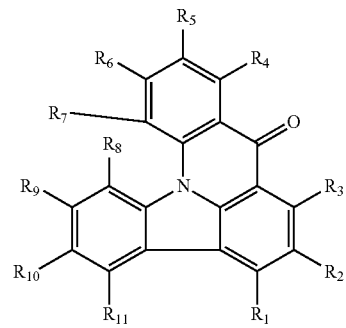

Formula 1

20 Claims, 8 Drawing Sheets

LIGHT EMITTING ELEMENT AND POLYCYCLIC COMPOUND FOR LIGHT EMITTING ELEMENT

CROSS-REFERENCE TO RELATED APPLICATION

This application claims priority to and the benefit of Korean Patent Application No. 10-2022-0001151, filed on Jan. 4, 2022, the entire content of which is hereby incorporated by reference.

BACKGROUND

1. Field

Aspects of one or more embodiments of the present disclosure relate to a light emitting element and a polycyclic compound for a light emitting element, and for example, to a light emitting element including a polycyclic compound in an emission layer and a polycyclic compound used therein.

2. Description of the Related Art

Recently, the development of an organic electroluminescence display as an image display is being actively conducted. The organic electroluminescence display is different from a liquid crystal display and is a display of a self-luminescent type or kind in which holes and electrons injected from a first electrode and a second electrode recombine in an emission layer so that a light emitting material in the emission layer emits light to achieve display.

In the application of a light emitting element to a display, the decrease of a driving voltage and the increase of emission efficiency and life of the light emitting element are required, and development on materials for a light emitting element, stably achieving the requirements is being continuously required (sought).

SUMMARY

An aspect of one or more embodiments of the present disclosure is directed toward a light emitting element having a high emission efficiency and long-life characteristics at the same time (concurrently), and a polycyclic compound used therein.

Additional aspects will be set forth in part in the description which follows and, in part, will be apparent from the description, or may be learned by practice of the presented embodiments of the disclosure.

An embodiment of the present disclosure is directed toward a light emitting element including a first electrode, a second electrode on the first electrode, and an emission layer between the first electrode and the second electrode and including a first compound represented by Formula 1, and at least one selected from among a second compound to a fourth compound, wherein the first compound to the fourth compound are different from each other.

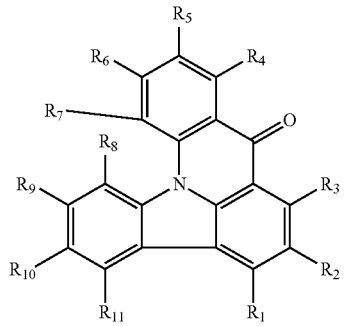

Formula 1

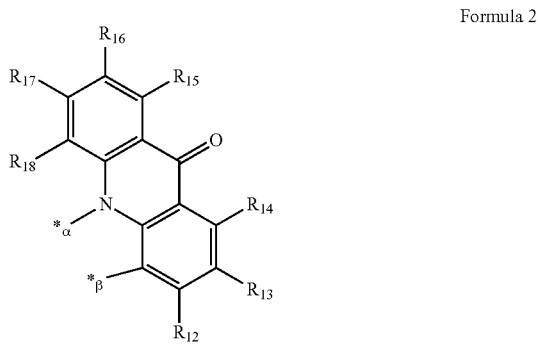

Formula 2

In Formula 1, $R_1$ to $R_{11}$ may each independently be a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 3 to 30 ring-forming carbon atoms, or combined with an adjacent group to form a ring, at least one pair selected from among pairs of two neighboring substituents selected from among $R_8$ to $R_{11}$ may be bonded to *α and *β of Formula 2, respectively, an embodiment in which *α is bonded to $R_{10}$, and *β is bonded to $R_9$ is excluded, and $R_{12}$ to $R_{18}$ may each independently be a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 3 to 30 ring-forming carbon atoms.

In an embodiment, Formula 1 may be represented by any one selected from among Formula 3-1 to Formula 3-4.

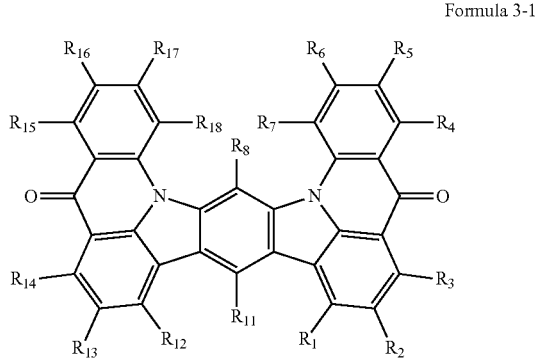

Formula 3-1

Formula 3-2

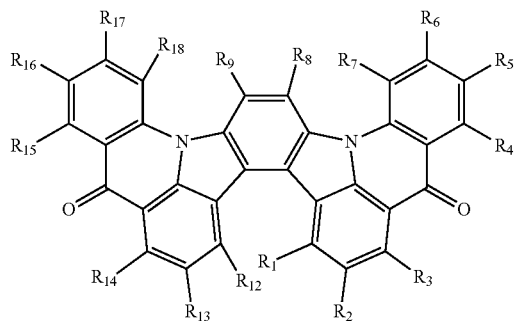

Formula 3-3

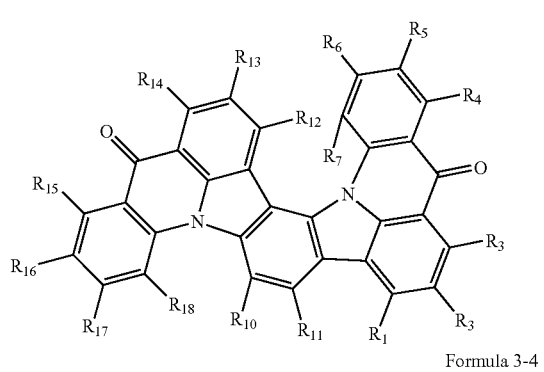

Formula 3-4

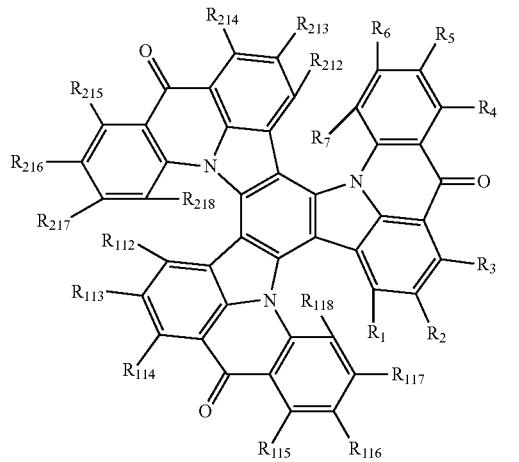

In Formula 3-1 to Formula 3-4, $R_1$ to $R_{11}$ are the same as defined in Formula 1, in Formula 3-1 to Formula 3-3, $R_{12}$ to $R_{18}$ are the same as defined in Formula 2, and in Formula 3-4, $R_{112}$ to $R_{118}$, and $R_{212}$ to $R_{218}$ may each independently be a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 3 to 30 ring-forming carbon atoms.

In an embodiment, in Formula 3-1, $R_8$ and $R_{11}$ may all be hydrogen atoms.

In an embodiment, in Formula 3-3, $R_{10}$ and $R_{11}$ may be the same.

In an embodiment, remaining parts excluding bonded parts to Formula 2 among $R_8$ to $R_{11}$ of Formula 1 (i.e., substituents selected from among $R_8$ to $R_{11}$ that are not bonded to Formula 2) may each independently be a hydrogen atom, a deuterium atom, a substituted or unsubstituted phenyl group, a substituted or unsubstituted naphthyl group, a substituted or unsubstituted phenanthryl group, a substituted or unsubstituted diphenyl amine group, a substituted or unsubstituted carbazole group, a substituted or unsubstituted acridine group, a substituted or unsubstituted phenothiazine group, or a substituted or unsubstituted phenoxazine group.

In an embodiment, $R_1$ to $R_7$ of Formula 1 and $R_{12}$ to $R_{18}$ of Formula 2 may each independently be an amine group comprising at least two selected from among a substituted or unsubstituted phenyl group, an unsubstituted naphthyl group, an unsubstituted dibenzofuran group, an unsubstituted carbazole group, and a substituted or unsubstituted dibenzothiopen group, a hydrogen atom, a deuterium atom, a substituted or unsubstituted phenyl group, a substituted or unsubstituted carbazole group, a substituted or unsubstituted isopropyl group, and a substituted or unsubstituted t-butyl group.

In an embodiment, the emission layer may emit blue light.

In an embodiment, the first compound may emit thermally activated delayed fluorescence.

In an embodiment, the emission layer may include the second compound and the third compound, and the second compound may be represented by any one selected from among HT-1 to HT-4.

HT-3

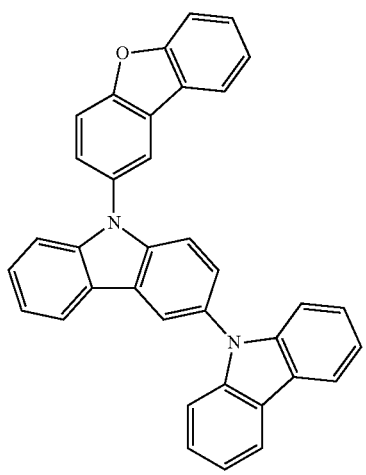

HT-4

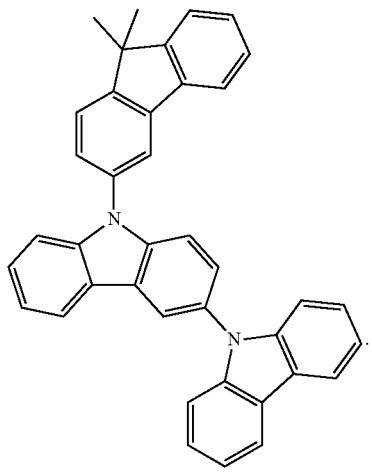

In an embodiment, the third compound may be represented by any one selected from among ET-1 to ET-3.

ET-1

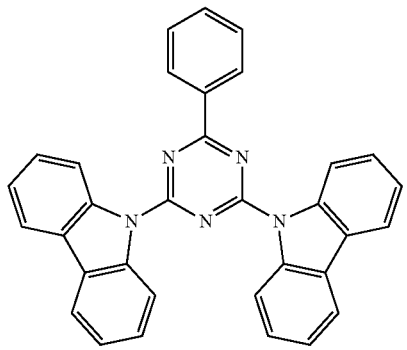

ET-2

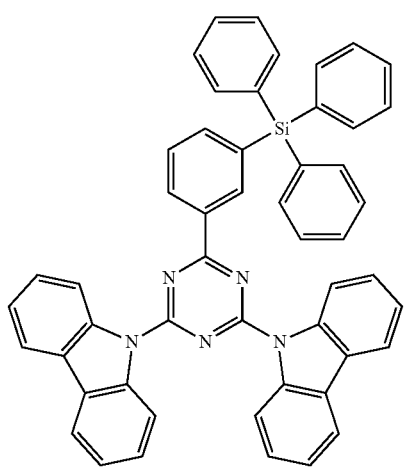

ET-3

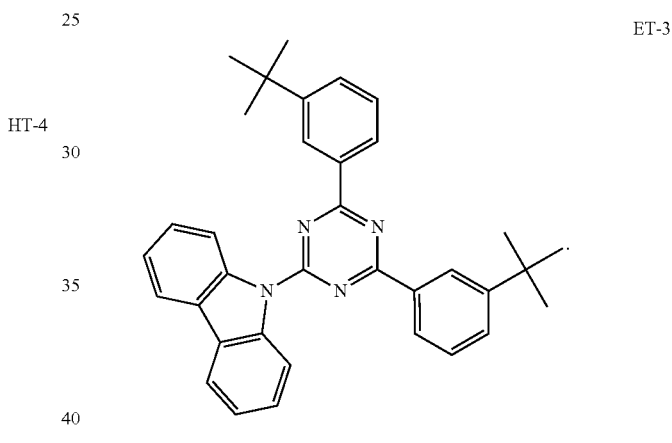

In an embodiment, a fourth compound may be further included, and the fourth compound may be represented by Formula M-b.

Formula M-b

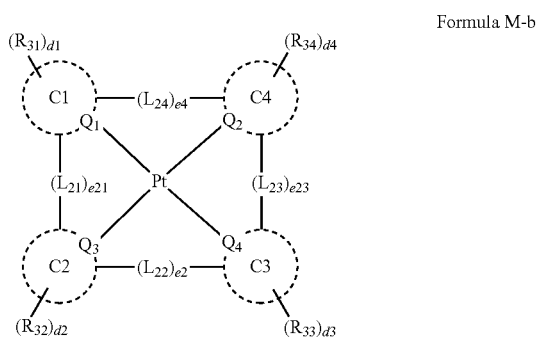

In Formula M-b, Q1 to Q4 may each independently be C or N, C1 to C4 may each independently be a substituted or unsubstituted hydrocarbon ring of 5 to 30 ring-forming carbon atoms, or a substituted or unsubstituted heterocycle of 2 to 30 ring-forming carbon atoms, $L_{21}$ to $L_{24}$ may each independently be a direct linkage,

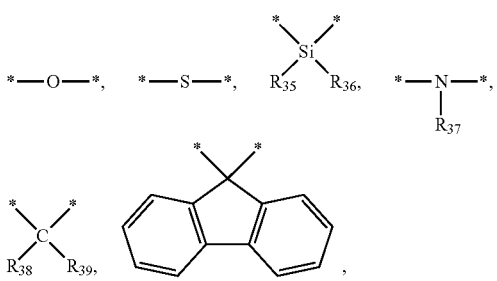

a substituted or unsubstituted divalent alkyl group of 1 to 20 carbon atoms, a substituted or unsubstituted arylene group of 6 to 30 ring-forming carbon atoms, or a substituted or unsubstituted heteroarylene group of 2 to 30 ring-forming carbon atoms, e1 to e4 may each independently be 0 or 1, $R_{31}$ to $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring, and d1 to d4 may each independently be an integer from 0 to 4.

In an embodiment, the first compound may be a light emitting dopant, the second compound may be a hole transport host, the third compound may be an electron transport host, and the fourth compound may be an auxiliary dopant.

According to another embodiment of the present disclosure, there is provided a polycyclic compound represented by Formula 1.

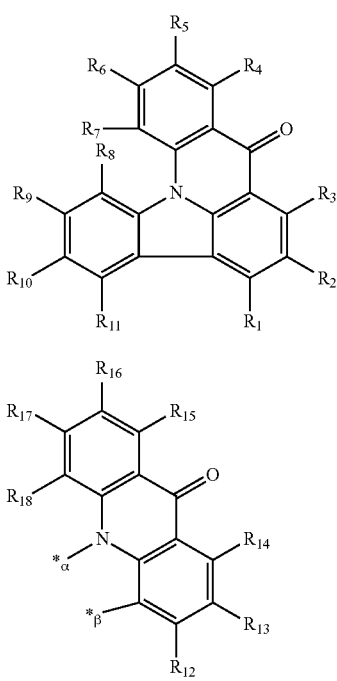

Formula 1

Formula 2

In Formula 1, $R_1$ to $R_{11}$ may each independently be a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 3 to 30 ring-forming carbon atoms, or combined with an adjacent group to form a ring, at least one pair selected from among pairs of two neighboring substituents selected from among $R_8$ to $R_{11}$ may be bonded to *α and *β of Formula 2, respectively, an embodiment in which *α is bonded to $R_{10}$, and *β is bonded to $R_9$ is excluded, and $R_{12}$ to $R_{18}$ may each independently be a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 3 to 30 ring-forming carbon atoms.

In an embodiment, Formula 1 may be represented by any one selected from among Formula 3-1 to Formula 3-4.

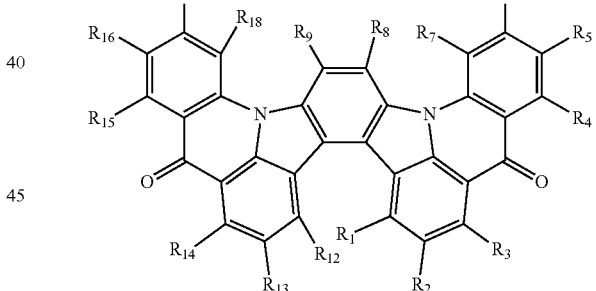

Formula 3-1

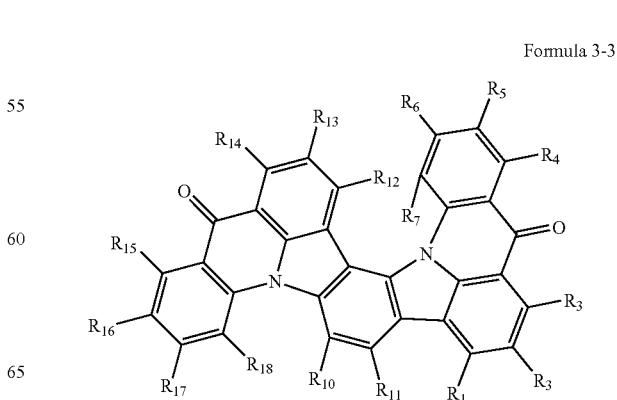

Formula 3-2

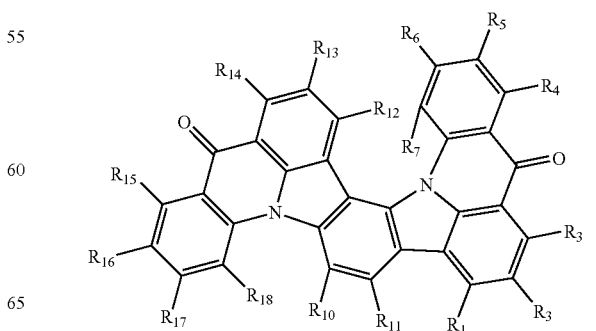

Formula 3-3

Formula 3-4

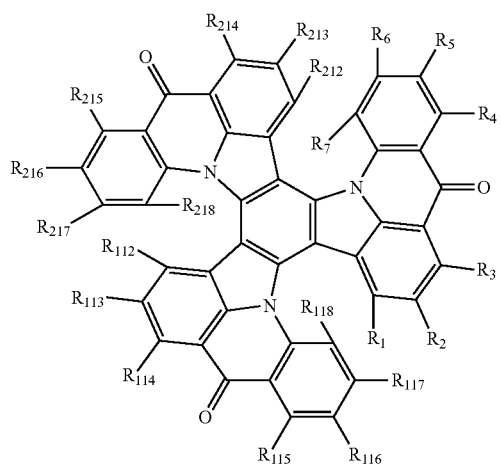

58

In Formula 3-1 to Formula 3-4, $R_1$ to $R_{11}$ are the same as defined in Formula 1, in Formula 3-1 to Formula 3-3, $R_{12}$ to $R_{18}$ are the same as defined in Formula 2, and in Formula 3-4, $R_{112}$ to $R_{118}$, and $R_{212}$ to $R_{218}$ may each independently be a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 3 to 30 ring-forming carbon atoms.

In an embodiment, in Formula 3-1, $R_8$ and $R_{11}$ may all be hydrogen atoms.

In an embodiment, remaining parts excluding bonded parts to Formula 2 among $R_8$ to $R_{11}$ of Formula 1 (i.e., substituents selected from among $R_8$ to $R_{11}$ that are not bonded to Formula 2) may each independently be represented by any one selected from among compounds in Compound Group A.

Compound Group A

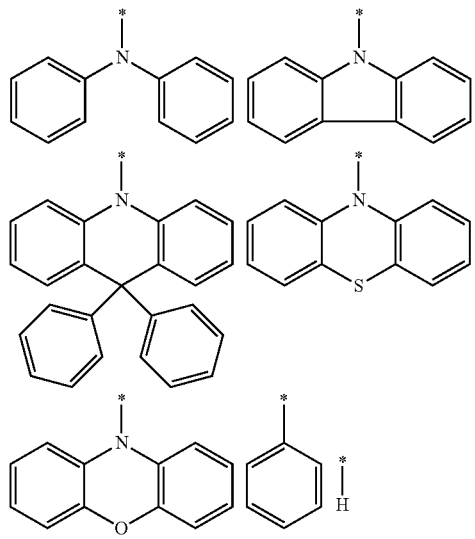

In an embodiment, $R_1$ to $R_7$ of Formula 1 and $R_{12}$ to $R_{18}$ of Formula 2 may each independently be represented by any one selected from among compounds in Compound Group B.

Compound Group B

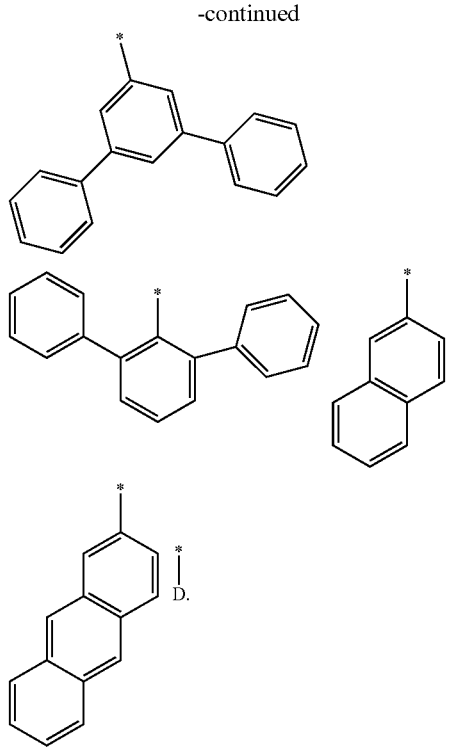

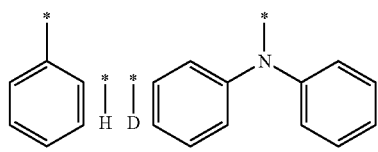

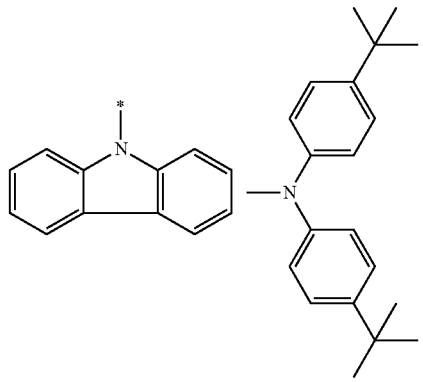

-continued

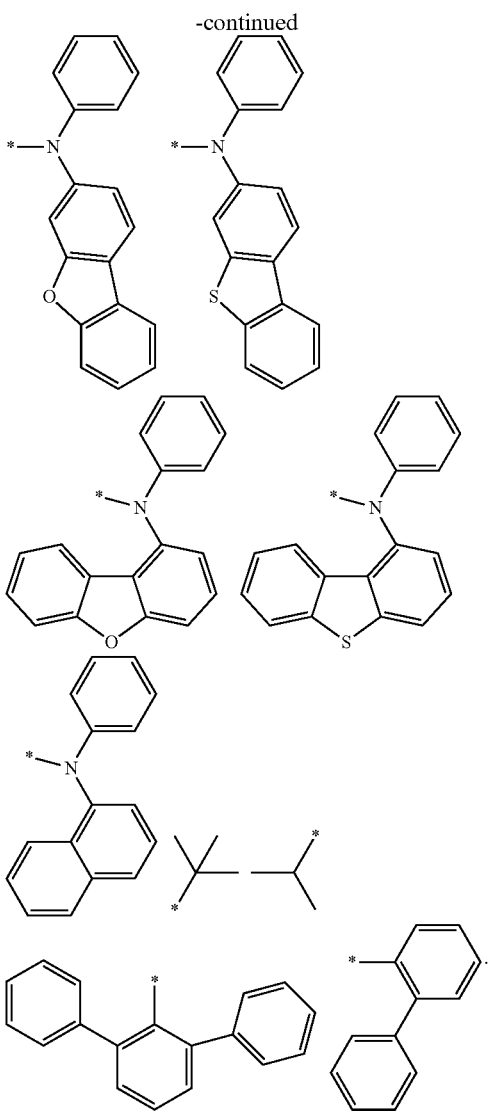

In an embodiment, the polycyclic compound may be a blue emitting material.

BRIEF DESCRIPTION OF THE DRAWINGS

The accompanying drawings are included to provide a further understanding of the present disclosure and are incorporated in and constitute a part of this specification. The drawings illustrate embodiments of the present disclosure and, together with the description, serve to explain principles of the present disclosure. In the drawings.

DETAILED DESCRIPTION

Figure 1:
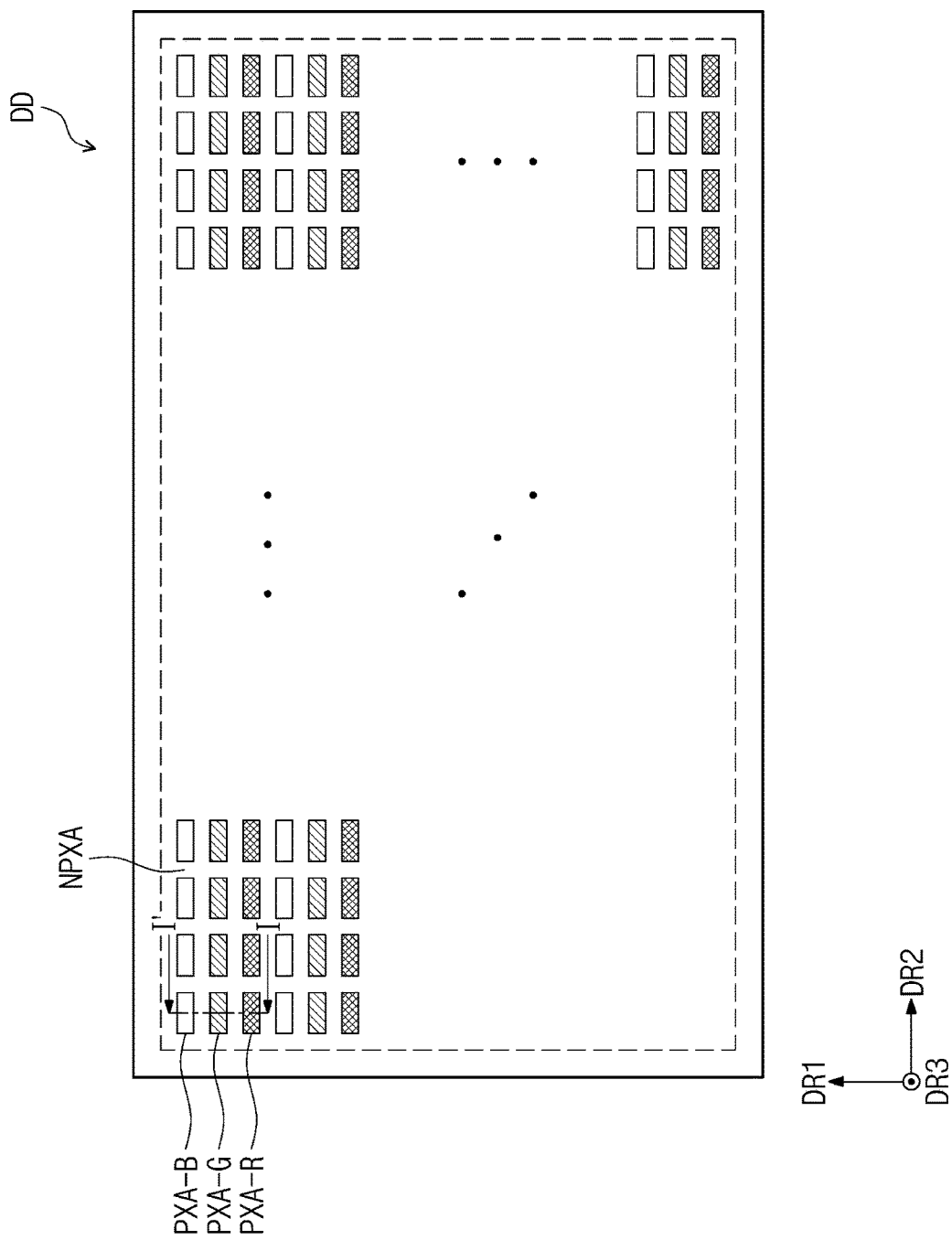
FIG. 1 is a plan view showing a display apparatus according to an embodiment.

The present disclosure may have one or more suitable modifications and may be embodied in different forms, and example embodiments will be explained in more detail with reference to the accompanying drawings. The present disclosure may, however, be embodied in different forms and should not be construed as limited to the embodiments set forth herein. Rather, all modifications, equivalents, and substituents which are included in the spirit and technical scope of the present disclosure should be included in the present disclosure.

Like reference numerals refer to like elements throughout. In the drawings, the dimensions of structures may be exaggerated for clarity of illustration. It will be understood that, although the terms first, second, etc. may be used herein to describe various elements, these elements should not be limited by these terms. These terms are only used to distinguish one element from another element. Thus, a first element could be termed a second element without departing from the teachings of the present invention. Similarly, a second element could be termed a first element. As used herein, the singular forms are intended to include the plural forms as well, unless the context clearly indicates otherwise.

In the disclosure, it will be further understood that the terms "comprises" and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof.

In the disclosure, when a layer, a film, a region, a plate, etc. is referred to as being "on" or "above" another part, it can be "directly on" the other part, or intervening layers may also be present. In contrast, when a layer, a film, a region, a plate, etc. is referred to as being "under" or "below" another part, it can be "directly under" the other part, or intervening layers may also be present. Also, when an element is referred to as being disposed "on" another element, it can be disposed under the other element.

In the disclosure, the term "substituted or unsubstituted" corresponds to substituted or unsubstituted with at least one substituent selected from the group including (e.g., consisting of) a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. In addition, each of the exemplified substituents may be substituted or unsubstituted. For example, a biphenyl group may be interpreted as an aryl group or a phenyl group substituted with a phenyl group.

In the disclosure, the term "forming a ring via the combination with an adjacent group" may refer to forming a substituted or unsubstituted hydrocarbon ring, or a substituted or unsubstituted heterocycle via the combination with an adjacent group. The hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may be monocycles or polycycles. In addition, the ring formed via the combination with an adjacent group may be combined with another ring to form a spiro structure.

In the disclosure, the term "adjacent group" may refer to a substituent substituted for an atom which is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, two methyl groups may be interpreted as "adjacent groups" to each other, and in 1,1-diethylcyclopentene, two ethyl groups may be interpreted as "adjacent groups" to each other. In addition, in 4,5-dimethylphenanthrene, two methyl groups may be interpreted as "adjacent groups" to each other.

In the disclosure, a halogen atom may be a fluorine atom, a chlorine atom, a bromine atom or an iodine atom.

In the disclosure, an alkyl group may be a linear, branched, or cyclic type or kind. The carbon number of the alkyl group may be 1 to 50, 1 to 30, 1 to 20, 1 to 10, or 1 to 6. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the disclosure, an alkyl group may be a linear or branched type or kind. The carbon number of the alkyl group may be 1 to 50, 1 to 30, 1 to 20, 1 to 10, or 1 to 6. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, 1-methylpentyl, 3-methylpentyl, 2-ethylpentyl, 4-methyl-2-pentyl, n-hexyl, 1-methylhexyl, 2-ethylhexyl, 2-butylhexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the disclosure, a cycloalkyl group may refer to a ring-type or kind alkyl group. The carbon number of the cycloalkyl group may be 3 to 50, 3 to 30, 3 to 20, or 3 to 10. Examples of the cycloalkyl group may include a cyclopropyl group, a cyclobutyl group, a cyclopentyl group, a cyclohexyl group, a 4-methylcyclohexyl group, a 4-t-butylcyclohexyl group, a cycloheptyl group, a cyclooctyl group, a cyclononyl group, a cyclodecyl group, a norbornyl group, a 1-adamantyl group, a 2-adamantyl group, an isobornyl group, a bicycloheptyl group, etc., without limitation.

In the disclosure, an alkenyl group refers to a hydrocarbon group including one or more carbon double bonds in the middle or at the terminal of an alkyl group having a carbon number of 2 or more. The alkenyl group may be a linear chain or a branched chain. The carbon number is not limited, but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styrylvinyl group, etc., without limitation.

In the disclosure, an alkynyl group refers to a hydrocarbon group including one or more carbon triple bonds in the middle or at the terminal of an alkyl group having a carbon number of 2 or more. The alkynyl group may be a linear chain or a branched chain. The carbon number is not limited, but may be 2 to 30, 2 to 20, or 2 to 10. Examples of the alkynyl group may include an ethynyl group, a propynyl group, etc., without limitation.

In the disclosure, a hydrocarbon ring group refers to an optional functional group or substituent derived from an aliphatic hydrocarbon ring. The hydrocarbon ring group may be a saturated hydrocarbon ring group of 5 to 20 ring-forming carbon atoms.

In the disclosure, an aryl group refers to an optional functional group or substituent derived from an aromatic hydrocarbon ring. The aryl group may be a monocyclic aryl group or a polycyclic aryl group. The carbon number for forming rings in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, etc., without limitation.

In the disclosure, a fluorenyl group may be substituted, and two substituents may be combined with each other to form a spiro structure. Examples of a substituted fluorenyl group are as follows, but an embodiment of the present disclosure is not limited thereto

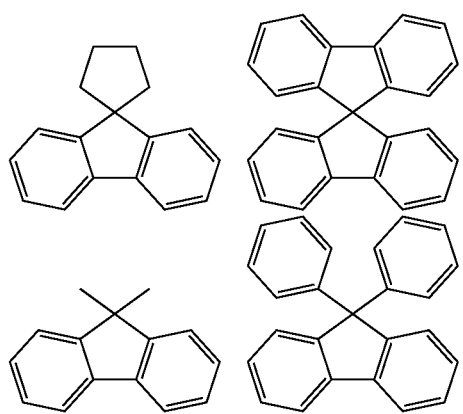

In the disclosure, a heterocyclic group refers to an optional functional group or substituent derived from a ring including one or more selected from among B, O, N, P, Si, and S as heteroatoms. The heterocyclic group may include an aliphatic heterocyclic group and/or an aromatic heterocyclic group. The aromatic heterocyclic group may be a heteroaryl group. The aliphatic heterocyclic group and the aromatic heterocyclic group may be a monocycle or a polycycle.

In the disclosure, a heterocyclic group may include one or more selected from among B, O, N, P, Si and S as heteroatoms. When the heterocyclic group includes two or more heteroatoms, two or more heteroatoms may be the same or different. The heterocyclic group may be a monocyclic heterocyclic group or a polycyclic heterocyclic group, and has the concept including a heteroaryl group. The carbon number for forming rings of the heterocyclic group may be 2 to 30, 2 to 20, and 2 to 10.

In the disclosure, an aliphatic heterocyclic group may include one or more selected from among B, O, N, P, Si, and S as heteroatoms. The number of ring-forming carbon atoms of the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., without limitation.

In the disclosure, a heteroaryl group may include one or more selected from among B, O, N, P, Si, and S as heteroatoms. When the heteroaryl group includes two or more heteroatoms, two or more heteroatoms may be the same or different. The heteroaryl group may be a monocyclic heterocyclic group or polycyclic heterocyclic group. The carbon number for forming rings of the heteroaryl group may be 2 to 30, 2 to 20, or 2 to 10. Examples of the heteroaryl group may include thiophene, furan, pyrrole, imidazole, triazole, pyridine, bipyridine, pyrimidine, triazine, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuran, phenanthroline, thiazole, isoxazole, oxazole, oxadiazole, thiadiazole, phenothiazine, dibenzosilole, dibenzofuran, etc., without limitation.

In the disclosure, the same explanation on the above-described aryl group may be applied to an arylene group except that the arylene group is a divalent group. The same explanation on the above-described heteroaryl group may be applied to a heteroarylene group except that the heteroarylene group is a divalent group.

In the disclosure, a silyl group may include an alkyl silyl group and/or an aryl silyl group. Examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc., without limitation.

In the disclosure, the carbon number of an amino group is not limited, but may be 1 to 30. The amino group may include an alkyl amino group, an aryl amino group, or a heteroaryl amino group. Examples of the amino group may include a methylamino group, a dimethylamino group, a phenylamino group, a diphenylamino group, a naphthylamino group, a 9-methyl-anthracenylamino group, a triphenylamino group, etc., without limitation.

In the disclosure, the carbon number of a carbonyl group is not limited, but the carbon number may be 1 to 40, 1 to 30, or 1 to 20. For example, the carbonyl group may have the structures below but is not limited thereto

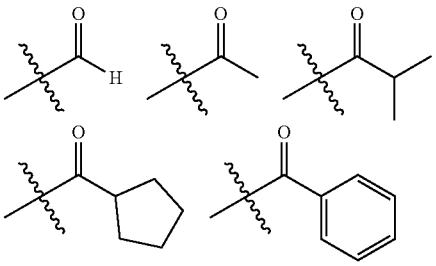

In the disclosure, the carbon number of a sulfinyl group and sulfonyl group is not limited, but may be 1 to 30. The sulfinyl group may include an alkyl sulfinyl group and/or an aryl sulfinyl group. The sulfonyl group may include an alkyl sulfonyl group and/or an aryl sulfonyl group.

In the disclosure, a thio group may include an alkyl thio group and/or an aryl thio group. The thio group may refer to the above-defined alkyl group or aryl group combined with a sulfur atom. Examples of the thio group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, etc., without limitation.

In the disclosure, an oxy group may refer to the above-defined alkyl group or aryl group which is combined with an oxygen atom. The oxy group may include an alkoxy group and/or an aryl oxy group. The alkoxy group may be a linear, branched or cyclic chain. The carbon number of the alkoxy group is not limited but may be, for example, 1 to 20 or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc. However, an embodiment of the present disclosure is not limited thereto.

In the disclosure, a boron group may refer to the above-defined alkyl group or aryl group, combined with a boron atom. The boron group may include an alkyl boron group and/or an aryl boron group. Examples of the boron group may include a trimethylboron group, a triethylboron group, a t-butylmethylboron group, a triphenylboron group, a diphenylboron group, a phenylboron group, etc., without limitation.

In the disclosure, an alkenyl group may be a linear chain or a branched chain. The carbon number is not limited but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styryl vinyl group, etc., without limitation.

In the disclosure, the carbon number of an amine group is not limited, but may be 1 to 30. The amine group may include an alkyl amine group and/or an aryl amine group. Examples of the amine group may include a methylamine group, a dimethylamine group, a phenylamine group, a diphenylamine group, a naphthylamine group, a 9-methyl-anthracenylamine group, a triphenylamine group, etc., without limitation.

In the disclosure, alkyl groups in an alkylthio group, alkylsulfoxy group, alkylaryl group, alkylamino group, alkylboron group, alkyl silyl group, and alkyl amine group may be the same as the examples of the above-described alkyl group.

In the disclosure, aryl groups in an aryloxy group, arylthio group, arylsulfoxy group, aryl amino group, arylboron group, and aryl silyl group may be the same as the examples of the above-described aryl group.

In the disclosure, a direct linkage may refer to a single bond.

In some embodiments, in the disclosure,

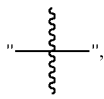

and ———• refer to positions to be connected.

Hereinafter, embodiments of the present disclosure will be explained referring to the drawings.

Figure 2:
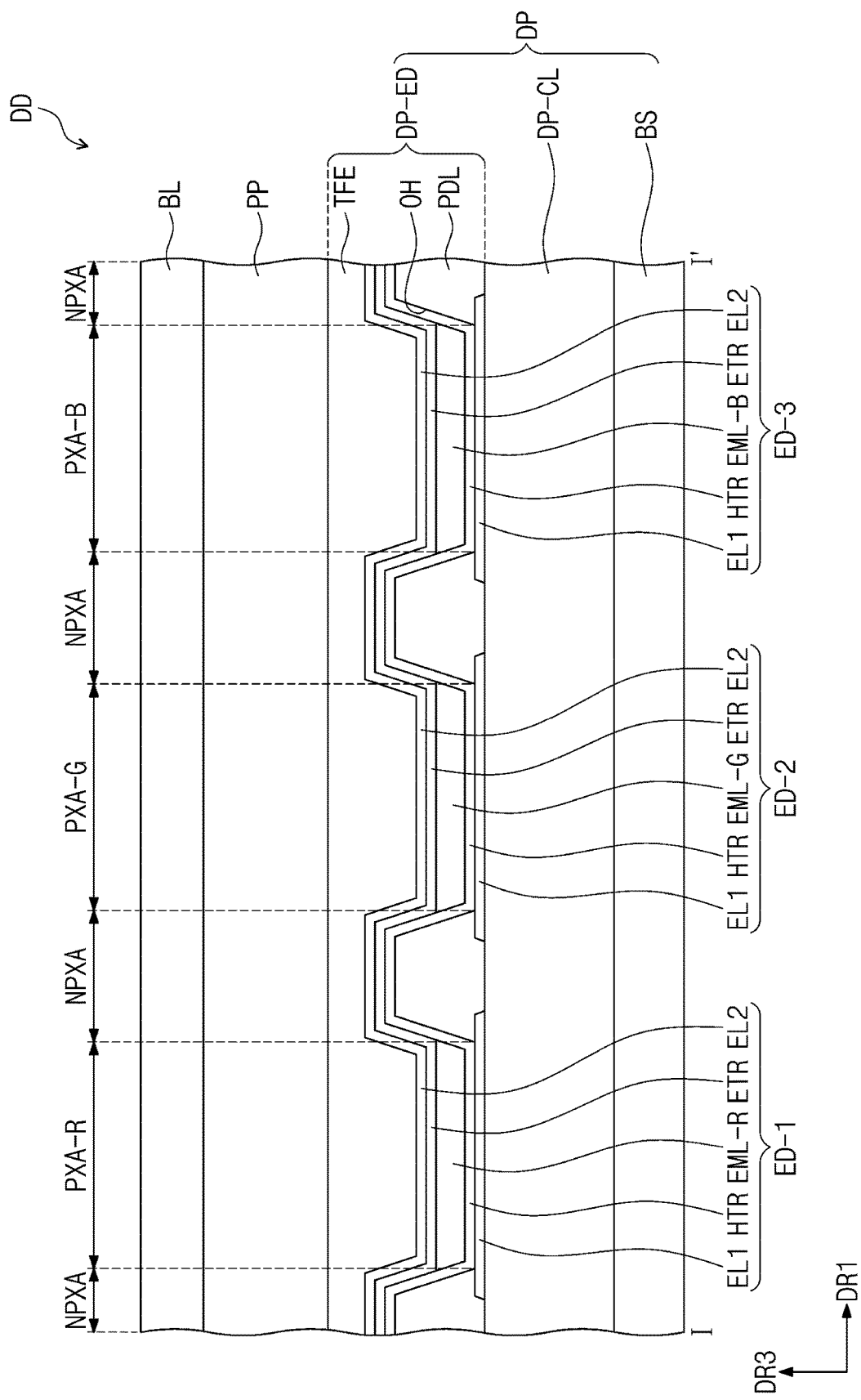
FIG. 2 is a cross-sectional view showing a display apparatus according to an embodiment.

FIG. 1 is a plan view showing an embodiment of a display apparatus DD. FIG. 2 is a cross-sectional view of a display apparatus DD of an embodiment. FIG. 2 is a cross-sectional view showing a part corresponding to line I-I' of FIG. 1.

The display apparatus DD may include a display panel DP and an optical layer PP on the display panel DP. The display panel DP includes light emitting elements ED-1, ED-2 and ED-3. The display apparatus DD may include multiple light emitting elements ED-1, ED-2 and ED-3. The optical layer PP may be on the display panel DP and control reflected light by external light at the display panel DP. The optical layer PP may include, for example, a polarization layer or a color filter layer. In some embodiments, the optical layer PP may not be provided in the display apparatus DD of an embodiment.

On the optical layer PP, a base substrate BL may be disposed. The base substrate BL may be a member providing a base surface in which the optical layer PP is disposed. The base substrate BL may be a glass substrate, a metal substrate, a plastic substrate, etc. However, an embodiment of the present disclosure is not limited thereto, and the base substrate BL may be an inorganic layer, an organic layer or a composite material layer. In some embodiments, the base substrate BL may not be provided.

The display apparatus DD according to an embodiment may further include a plugging layer. The plugging layer may be between a display device layer DP-ED and a base substrate BL. The plugging layer may be an organic layer. The plugging layer may include at least one selected from among an acrylic resin, a silicon-based resin and an epoxy-based resin.

The display panel DP may include a base layer BS, a circuit layer DP-CL provided on the base layer BS and a display device layer DP-ED. The display device layer DP-ED may include a pixel definition layer PDL, light emitting elements ED-1, ED-2 and ED-3 in the pixel definition layer PDL, and an encapsulating layer TFE on the light emitting elements ED-1, ED-2 and ED-3.

The base layer BS may be a member providing a base surface in which the display device layer DP-ED is disposed. The base layer BS may be a glass substrate, a metal substrate, a plastic substrate, etc. However, an embodiment of the present disclosure is not limited thereto, and the base layer BS may be an inorganic layer, an organic layer or a composite material layer.

In an embodiment, the circuit layer DP-CL is on the base layer BS, and the circuit layer DP-CL may include multiple transistors. Each of the transistors may include a control electrode, an input electrode, and an output electrode. For example, the circuit layer DP-CL may include switching transistors and driving transistors for driving the light emitting elements ED-1, ED-2 and ED-3 of the display device layer DP-ED.

Each of the light emitting elements ED-1, ED-2 and ED-3 may have the structures of light emitting elements ED of embodiments according to FIG. 3 to FIG. 6, which will be explained in more detail. Each of the light emitting elements ED-1, ED-2 and ED-3 may include a first electrode EL1, a hole transport region HTR, emission layers EML-R, EML-G and EML-B, an electron transport region ETR, and a second electrode EL2.

In FIG. 2, shown is an embodiment in which the emission layers EML-R, EML-G and EML-B of light emitting elements ED-1, ED-2 and ED-3 are in opening portions OH defined in a pixel definition layer PDL, and a hole transport region HTR, an electron transport region ETR and a second electrode EL2 are provided as common layers in all light emitting elements ED-1, ED-2 and ED-3. However, an embodiment of the present disclosure is not limited thereto. Different from FIG. 2, in an embodiment, the hole transport region HTR and the electron transport region ETR may be patterned and provided in the opening portions OH defined in the pixel definition layer PDL. For example, in an embodiment, the hole transport region HTR, the emission layers EML-R, EML-G and EML-B, and the electron transport region ETR of the light emitting elements ED-1, ED-2 and ED-3 may be patterned by an inkjet printing method and provided.

An encapsulating layer TFE may cover the light emitting elements ED-1, ED-2 and ED-3. The encapsulating layer TFE may encapsulate the display device layer DP-ED. The encapsulating layer TFE may be a thin film encapsulating layer. The encapsulating layer TFE may be one layer or a stacked layer of multiple layers. The encapsulating layer TFE includes at least one insulating layer. The encapsulating layer TFE according to an embodiment may include at least one inorganic layer (hereinafter, encapsulating inorganic layer). In some embodiments, the encapsulating layer TFE may include at least one organic layer (hereinafter, encapsulating organic layer) and at least one encapsulating inorganic layer.

The encapsulating inorganic layer protects (reduces the amount of moisture/oxygen) the display device layer DP-ED from moisture/oxygen, and the encapsulating organic layer protects (reduces the amount of foreign materials) the display device layer DP-ED from foreign materials such as dust particles. The encapsulating inorganic layer may include silicon nitride, silicon oxy nitride, silicon oxide, titanium oxide, or aluminum oxide, without specific limitation. The encapsulating organic layer may include an acrylic compound, an epoxy-based compound, etc. The encapsulating organic layer may include a photopolymerizable organic material, without limitation.

The encapsulating layer TFE may be on the second electrode EL2 and may be disposed while filling the opening portion OH.

Referring to FIG. 1 and FIG. 2, the display apparatus DD may include a non-luminous area NPXA and luminous areas (light emitting regions) PXA-R, PXA-G and PXA-B. The luminous areas PXA-R, PXA-G and PXA-B may be areas emitting light produced from the light emitting elements ED-1, ED-2 and ED-3, respectively. The luminous areas PXA-R, PXA-G and PXA-B may be separated from each other on a plane.

The luminous areas PXA-R, PXA-G and PXA-B may be areas separated by the pixel definition layer PDL. The non-luminous areas NPXA may be areas between neighboring luminous areas PXA-R, PXA-G and PXA-B and may be areas corresponding to the pixel definition layer PDL. In some embodiments, in the disclosure, each of the luminous areas PXA-R, PXA-G and PXA-B may correspond to each pixel. The pixel definition layer PDL may divide the light emitting elements ED-1, ED-2 and ED-3. The emission layers EML-R, EML-G and EML-B of the light emitting elements ED-1, ED-2 and ED-3 may be disposed and divided in the opening portions OH defined in the pixel definition layer PDL.

The luminous areas PXA-R, PXA-G and PXA-B may be divided into multiple groups according to the color of light produced from the light emitting elements ED-1, ED-2 and ED-3. In the display apparatus DD of an embodiment, shown in FIG. 1 and FIG. 2, three luminous areas PXA-R, PXA-G and PXA-B emitting red light, green light and blue light are illustrated as an embodiment. For example, the display apparatus DD of an embodiment may include a red luminous area PXA-R, a green luminous area PXA-G and a blue luminous area PXA-B, which are separated from each other.

In the display apparatus DD according to an embodiment, multiple light emitting elements ED-1, ED-2 and ED-3 may emit light having different wavelength regions. For example, in an embodiment, the display apparatus DD may include a first light emitting element ED-1 emitting red light, a second light emitting element ED-2 emitting green light, and a third light emitting element ED-3 emitting blue light. For example, each of the red luminous area PXA-R, the green luminous area PXA-G, and the blue luminous area PXA-B of the display apparatus DD may correspond to the first light emitting element ED-1, the second light emitting element ED-2, and the third light emitting element ED-3.

However, an embodiment of the present disclosure is not limited thereto, and the first to third light emitting elements ED-1, ED-2 and ED-3 may emit light in substantially the same wavelength region, or at least one thereof may emit light in a different wavelength region. For example, all the first to third light emitting elements ED-1, ED-2 and ED-3 may emit blue light.

The luminous areas PXA-R, PXA-G and PXA-B in the display apparatus DD according to an embodiment may be arranged in a stripe shape. Referring to FIG. 1, multiple red luminous areas PXA-R may be arranged with each other along a second direction axis DR2, multiple green luminous areas PXA-G may be arranged with each other along the second direction axis DR2, and multiple blue luminous areas PXA-B may be arranged with each other along the second direction axis DR2. In some embodiments, the red luminous area PXA-R, the green luminous area PXA-G and the blue luminous area PXA-B may be arranged by turns (alternately arranged) along a first direction axis DR1. (DR3 is a third direction which is normal or perpendicular to the plane defined by the first direction DR1 and the second direction DR2).

In FIG. 1 and FIG. 2, the areas of the luminous areas PXA-R, PXA-G and PXA-B are shown similar, but an embodiment of the present disclosure is not limited thereto. The areas of the luminous areas PXA-R, PXA-G and PXA-B may be different from each other according to the wavelength region of light emitted. In some embodiments, the areas of the luminous areas PXA-R, PXA-G and PXA-B may refer to areas on a plane defined by the first direction axis DR1 and the second direction axis DR2 (e.g., when viewed in a plan view).

In some embodiments, the arrangement type or kind of the luminous areas PXA-R, PXA-G and PXA-B is not limited to the configuration shown in FIG. 1, and the arrangement order of the red luminous areas PXA-R, the green luminous areas PXA-G and the blue luminous areas PXA-B may be provided in one or more suitable combinations according to the properties of display quality required for the display apparatus DD. For example, the arrangement type or kind of the luminous areas PXA-R, PXA-G and PXA-B may be a pentile arrangement type (PENTILE® arrangement form, for example, an RGBG matrix, an RGBG structure, or RGBG matrix structure), or a diamond arrangement type (Diamond Pixel™ arrangement form). PENTILE® is a duly registered trademark of Samsung Display Co., Ltd. Diamond Pixel™ is a trademark of Samsung Display Co., Ltd.

In some embodiments, the areas of the luminous areas PXA-R, PXA-G and PXA-B may be different from each other. For example, in an embodiment, the area of the green luminous area PXA-G may be smaller than the area of the blue luminous area PXA-B, but an embodiment of the present disclosure is not limited thereto.

Hereinafter, FIG. 3 to FIG. 6 are cross-sectional views schematically showing light emitting elements according to embodiments. The light emitting element ED according to an embodiment may include a first electrode EL1, a hole transport region HTR, an emission layer EML, an electron transport region ETR and a second electrode EL2, stacked in order.

Figure 3:
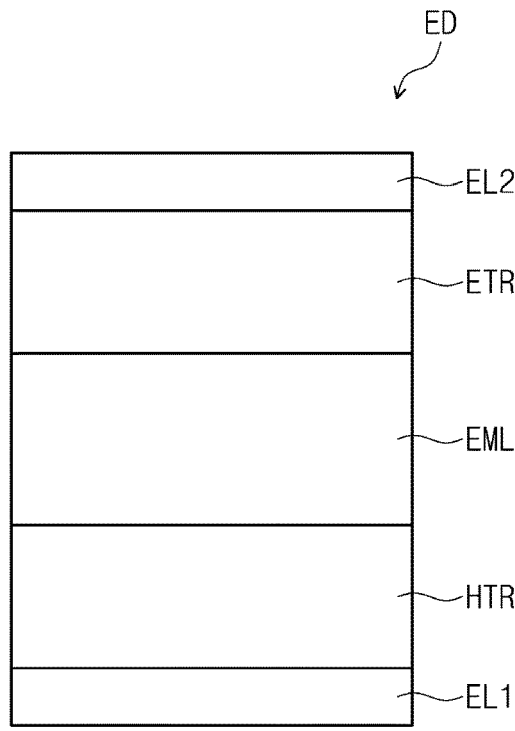
FIG. 3 is a cross-sectional view schematically showing a light emitting element according to an embodiment.
Figure 4:
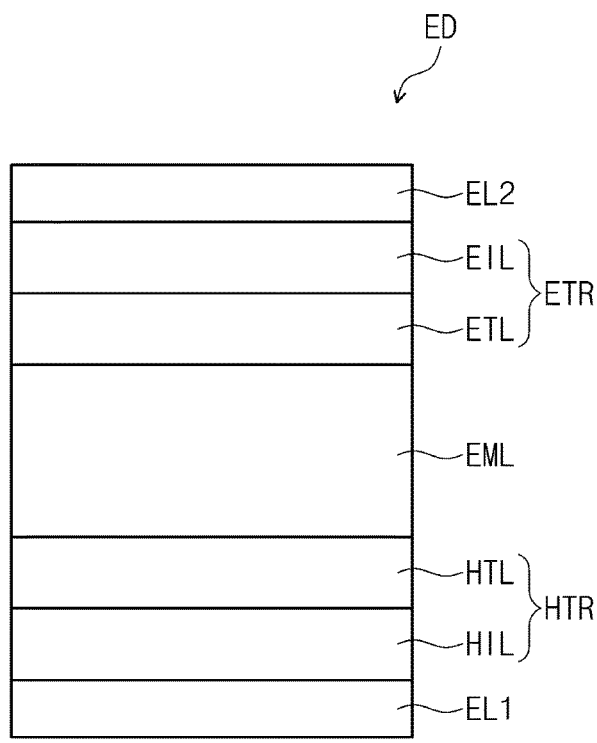
FIG. 4 is a cross-sectional view schematically showing a light emitting element according to an embodiment.
Figure 5:
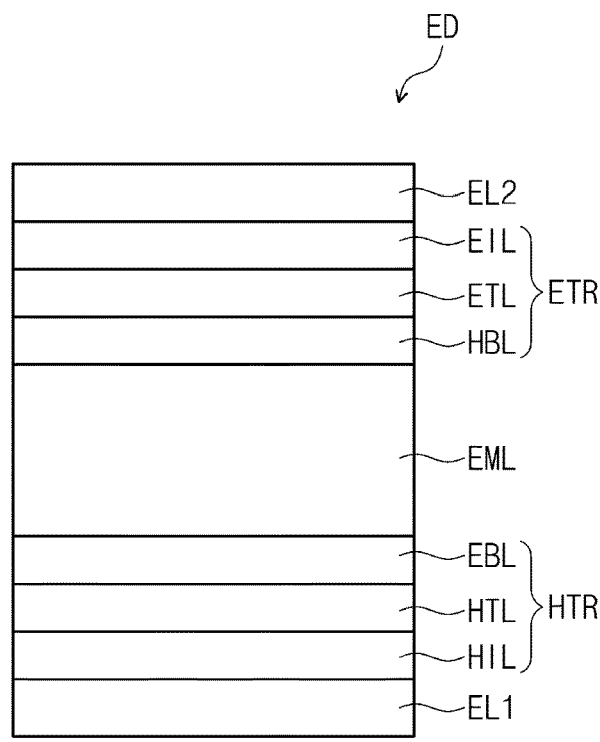
FIG. 5 is a cross-sectional view schematically showing a light emitting element according to an embodiment.
Figure 6:
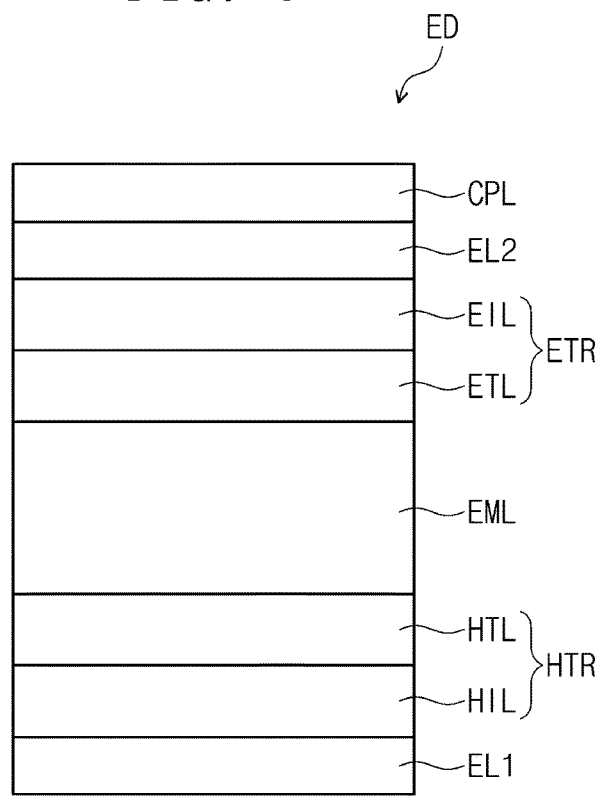
FIG. 6 is a cross-sectional view schematically showing a light emitting element according to an embodiment.

When compared to FIG. 3, FIG. 4 shows the cross-sectional view of a light emitting element ED of an embodiment, wherein a hole transport region HTR includes a hole injection layer HIL and a hole transport layer HTL, and an electron transport region ETR includes an electron injection layer EIL and an electron transport layer ETL. In some embodiments, when compared to FIG. 3, FIG. 5 shows the cross-sectional view of a light emitting element ED of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. When compared to FIG. 4, FIG. 6 shows the cross-sectional view of a light emitting element ED of an embodiment, including a capping layer CPL on the second electrode EL2.

The first electrode EL1 has conductivity. The first electrode EL1 may be formed using a metal material, a metal alloy or a conductive compound. The first electrode EL1 may be an anode or a cathode. However, an embodiment of the present disclosure is not limited thereto. In some embodiments, the first electrode EL1 may be a pixel electrode. The first electrode EL1 may be a transmissive electrode, a transflective electrode, or a reflective electrode. When the first electrode EL1 is the transmissive electrode, the first electrode EL1 may include a transparent metal oxide such as indium tin oxide (ITO), indium zinc oxide (IZO), zinc oxide (ZnO), and/or indium tin zinc oxide (ITZO). When the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, one or more compounds thereof, or one or more mixtures thereof (for example, a mixture of Ag and Mg). Also, the first electrode EL1 may have a structure including multiple layers including a reflective layer or a transflective layer formed using the above materials, and a transmissive conductive layer formed using ITO, IZO, ZnO, or ITZO. For example, the first electrode EL1 may have a three-layer structure of ITO/Ag/ITO. However, an embodiment of the present disclosure is not limited thereto. The first electrode EL1 may include the above-described metal materials, combinations of two or more metal materials selected from the above-described metal materials, or oxides of the above-described metal materials. The thickness of the first electrode EL1 may be from about 700 Å to about 10,000 Å. For example, the thickness of the first electrode EL1 may be from about 1,000 Å to about 3,000 Å.

The hole transport region HTR may be provided on the first electrode EL1. The hole transport region HTR may include at least one of a hole injection layer HIL, a hole transport layer HTL, a buffer layer or an emission auxiliary layer, or an emission blocking layer EBL. The thickness of the hole transport region HTR may be, for example, about 50 Å to about 15,000 Å.

The hole transport region HTR may have a single layer formed using a single material, a single layer formed using multiple different materials, or a multilayer structure including multiple layers formed using multiple different materials.

For example, the hole transport region HTR may have the structure of a single layer of a hole injection layer HIL or a hole transport layer HTL, and may have a structure of a single layer formed using a hole injection material and a hole transport material. In some embodiments, the hole transport region HTR may have a structure of a single layer formed using multiple different materials, or a structure stacked from the first electrode EL1 of hole injection layer HIL/hole transport layer HTL, hole injection layer HIL/hole transport layer HTL/buffer layer, hole injection layer HIL/buffer layer, hole transport layer HTL/buffer layer, or hole injection layer HIL/hole transport layer HTL/electron blocking layer EBL, without limitation.

The hole transport region HTR may be formed using one or more suitable methods such as a vacuum deposition method, a spin coating method, a cast method, a Langmuir-Blodgett (LB) method, an inkjet printing method, a laser printing method, and/or a laser induced thermal imaging (LITI) method.

The hole transport region HTR may include a compound represented by Formula H-1.

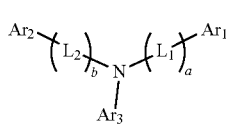

Formula H-1

In Formula H-1 above, $L_1$ and $L_2$ may each independently be a direct linkage, a substituted or unsubstituted arylene group of 6 to 30 ring-forming carbon atoms, or a substituted or unsubstituted heteroarylene group of 2 to 30 ring-forming carbon atoms. "a" and "b" may each independently be an integer from 0 to 10. In some embodiments, when "a" or "b" is an integer of 2 or more, multiple $L_1$ and $L_2$ may each independently be a substituted or unsubstituted arylene group of 6 to 30 ring-forming carbon atoms, or a substituted or unsubstituted heteroarylene group of 2 to 30 ring-forming carbon atoms.

In Formula H-1, $Ar_1$ and $Ar_2$ may each independently be a substituted or unsubstituted aryl group of 6 to 30 ring-forming carbon atoms, or a substituted or unsubstituted heteroaryl group of 2 to 30 ring-forming carbon atoms. In some embodiments, in Formula H-1, $Ar_3$ may be a substituted or unsubstituted aryl group of 6 to 30 ring-forming carbon atoms.

The compound represented by Formula H-1 may be a monoamine compound, or the compound represented by Formula H-1 may be a diamine compound in which at least one selected from among $Ar_1$ to $Ar_3$ includes an amine group as a substituent. In some embodiments, the compound represented by Formula H-1 may be a carbazole-based compound in which at least one selected from among $Ar_1$ and $Ar_2$ includes a substituted or unsubstituted carbazole group, or a fluorene-based compound in which at least one selected from among $Ar_1$ and $Ar_2$ includes a substituted or unsubstituted fluorene group.

The compound represented by Formula H-1 may be represented by any one selected from among the compounds in Compound Group H. However, the compounds shown in Compound Group H are merely examples, and the compound represented by Formula H-1 is not limited to the compounds represented in Compound Group H.

Compound Group H

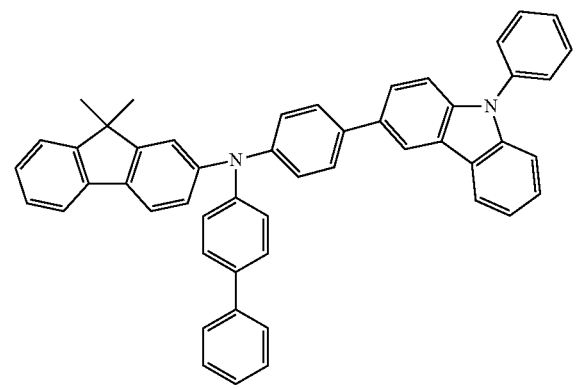

H-1-1

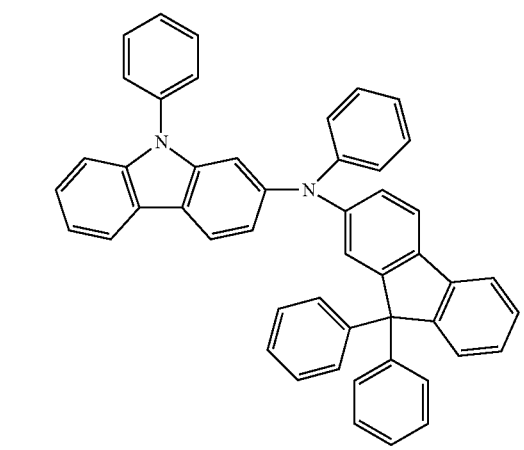

H-1-2

H-1-3
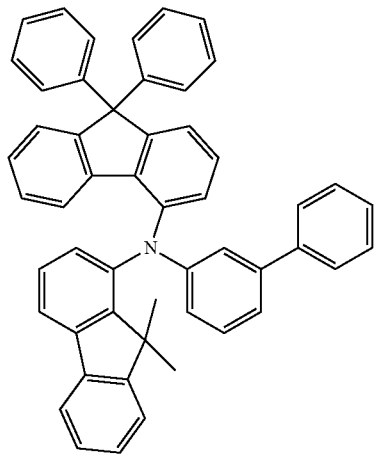
H-1-4
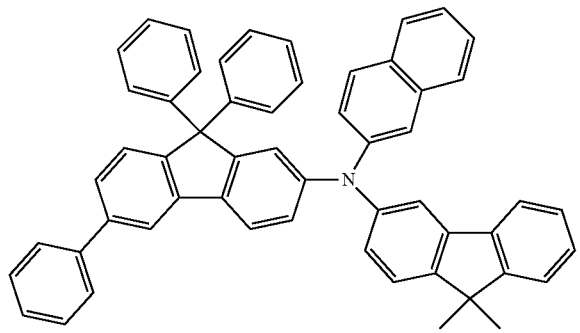
H-1-5
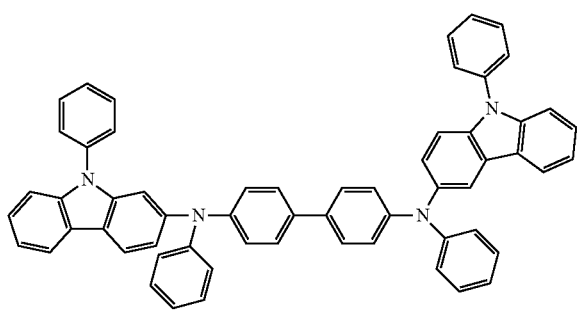
H-1-6
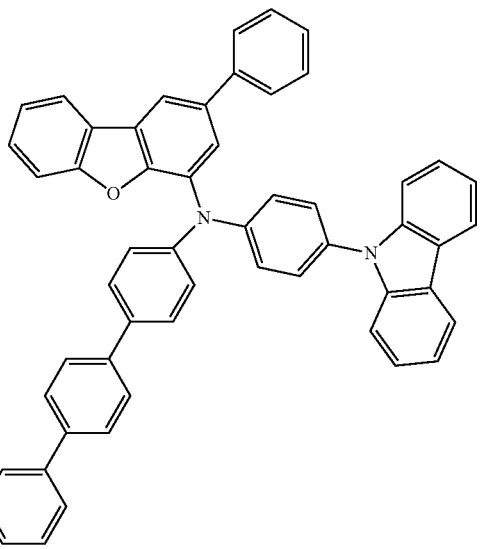
H-1-7
H-1-8
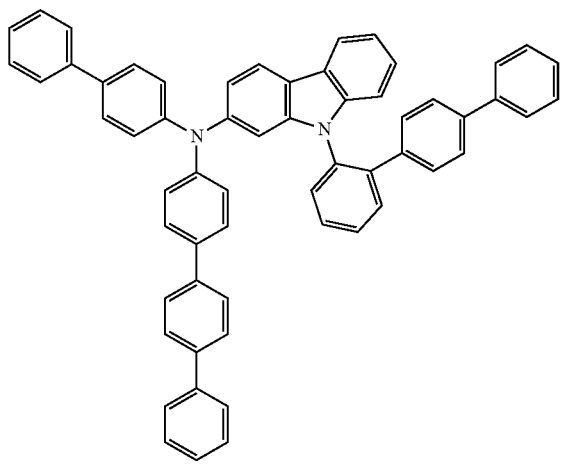

H-1-9
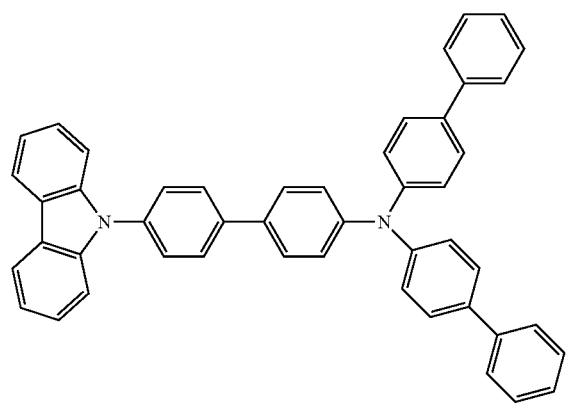
H-1-10
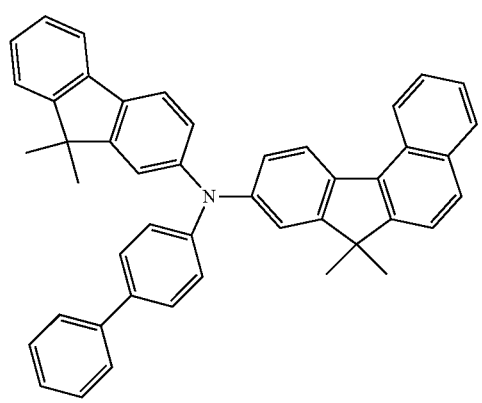
H-1-11
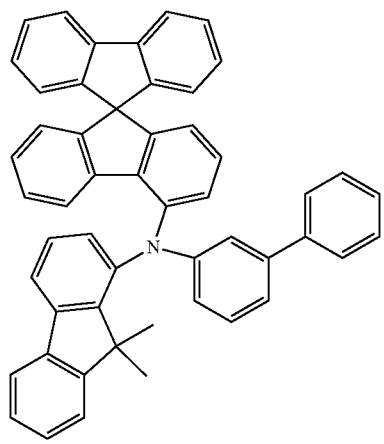
H-1-12
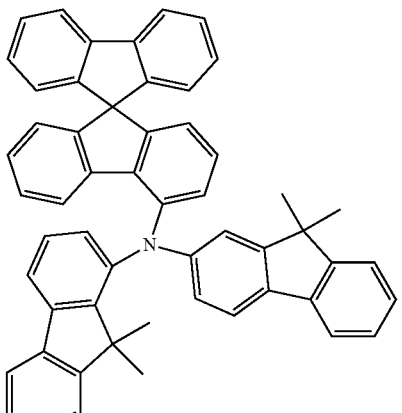
H-1-13
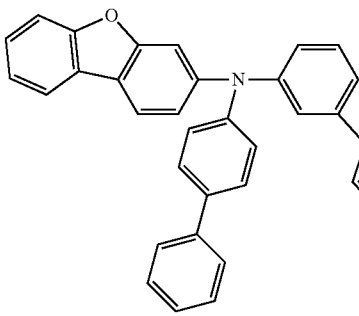
H-1-14
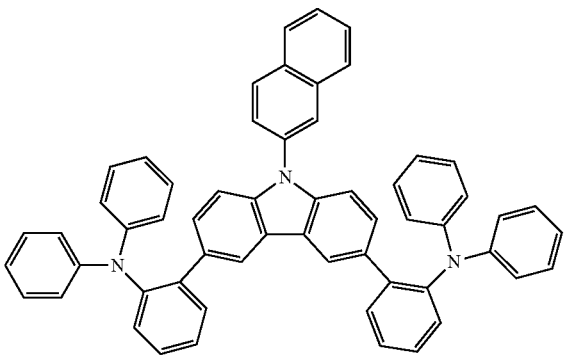
H-1-15
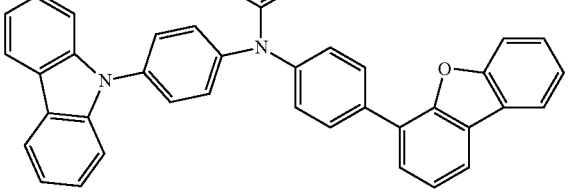

H-1-16
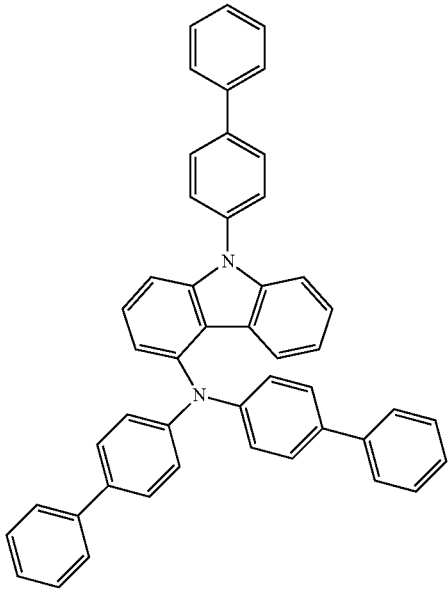

H-1-17
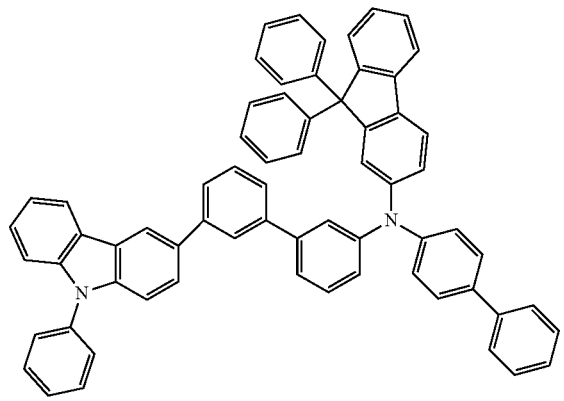

H-1-18
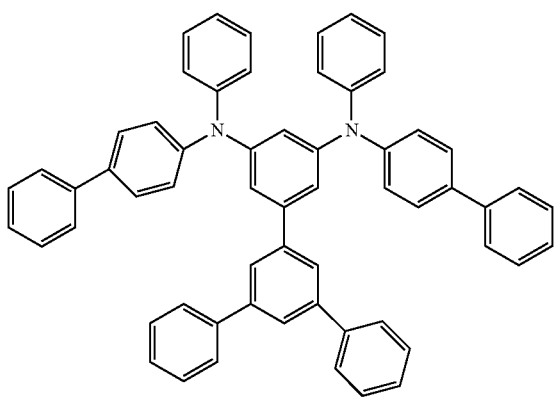

H-1-19
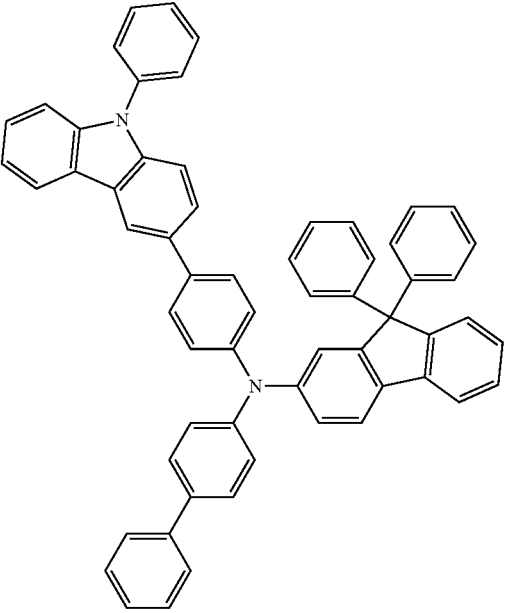

The hole transport region HTR may include a phthalocyanine compound such as copper phthalocyanine, $N^1,N^{1'}$-([1,1'-biphenyl]-4,4'-diyl)bis($N^1$-phenyl-$N^4,N^4$-di-m-tolyl-benzene-1,4-diamine) (DNTPD), 4,4',4''-[tris(3-methylphenyl)phenylamino]triphenylamine (m-MTDATA), 4,4',4''-tris(N,N-diphenylamino)triphenylamine (TDATA), 4,4',4''-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthalene-1-yl)-N,N'-diphenyl-benzidine (NPB or NPD), triphenylamine-containing polyetherketone (TPAPEK), 4-isopropyl-4'-methyldiphenyliodonium [tetrakis(pentafluorophenyl)borate], and/or dipyrazino[2,3-f:2',3'-h] quinoxaline-2,3,6,7,10,11-hexacarbonitrile (HAT-CN).

The hole transport region HTR may include carbazole derivatives such as N-phenyl carbazole and polyvinyl carbazole, fluorene-based derivatives, N,N'-bis(3-methylphenyl)-N,N'-diphenyl-[1,1'-biphenyl]-4,4'-diamine (TPD), triphenylamine-based derivatives such as 4,4',4''-tris(N-carbazolyl)triphenylamine (TCTA), N,N'-di(1-naphthalene-1-yl)-N,N'-diphenyl-benzidine (NPB), 4,4'-cyclohexylidene bis[N,N-bis(4-methylphenyl)benzeneamine] (TAPC), 4,4'-bis[N,N'-(3-tolyl)amino]-3,3'-dimethylbiphenyl (HMTPD), 1,3-bis(N-carbazolyl)benzene (mCP), etc.

In some embodiments, the hole transport region HTR may include 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the compounds of the hole transport region in at least one selected from among the hole injection layer HIL, hole transport layer HTL, and electron blocking layer EBL.

The thickness of the hole transport region HTR may be from about 100 Å to about 10,000 Å, for example, from about 100 Å to about 5,000 Å. In an embodiment in which the hole transport region HTR includes a hole injection layer HIL, the thickness of the hole injection region HIL may be, for example, from about 30 Å to about 1,000 Å. In an embodiment in which the hole transport region HTR includes a hole transport layer HTL, the thickness of the hole transport layer HTL may be from about 30 Å to about 1,000 Å. For example, in an embodiment in which the hole transport region HTR includes an electron blocking layer, the thickness of the electron blocking layer EBL may be from about 10 Å to about 1,000 Å. When the thicknesses of the hole transport region HTR, the hole injection layer HIL, the hole transport layer HTL and the electron blocking layer EBL satisfy the above-described ranges, satisfactory (suitable) hole transport properties may be achieved without substantial increase of a driving voltage.

The hole transport region HTR may further include a charge generating material to increase conductivity in addition to the above-described materials. The charge generating material may be dispersed substantially uniformly or non-uniformly in the hole transport region HTR. The charge generating material may be, for example, a p-dopant. The p-dopant may include at least one selected from among metal halide compounds, quinone derivatives, metal oxides, and cyano group-containing compounds, without limitation. For example, the p-dopant may include metal halide compounds such as CuI and RbI, quinone derivatives such as tetracyanoquinodimethane (TCNQ) and 2,3,5,6-tetrafluoro-7,7',8,8-tetracyanoquinodimethane (F4-TCNQ), metal oxides such as tungsten oxide and molybdenum oxide, cyano group-containing compounds such as dipyrazino[2,3-f: 2',3'-h] quinoxaline-2,3,6,7,10,11-hexacarbonitrile (HATCN) and 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP9), etc., without limitation.

As described above, the hole transport region HTR may further include at least one selected from among a buffer layer and an electron blocking layer EBL in addition to the hole injection layer HIL and the hole transport layer HTL. The buffer layer may compensate resonance distance according to the wavelength of light emitted from an emission layer EML and may increase emission efficiency. As materials included in the buffer layer, materials which may be included in the hole transport region HTR may be used. The electron blocking layer EBL may be a layer playing the role of (functioning as) blocking (reducing) the injection of electrons from the electron transport region ETR to the hole transport region HTR.

The emission layer EML may be provided on the hole transport region HTR. The emission layer EML may have a thickness of, for example, about 100 Å to about 1,000 Å or about 100 Å to about 300 Å. The emission layer EML may have a single layer formed using a single material, a single layer formed using multiple different materials, or a multi-layer structure having multiple layers formed using multiple different materials.

In the light emitting element ED of an embodiment, the emission layer EML may include a first compound represented by Formula 1 and at least one selected from among a second to fourth compounds. The first compound to the fourth compound may be different from each other.

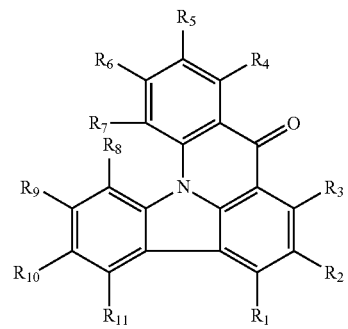

Formula 1

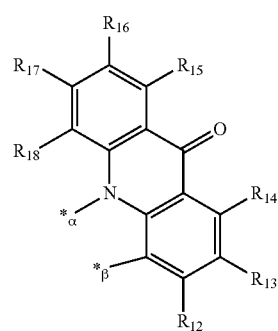

Formula 2

In Formula 1, $R_1$ to $R_{11}$ may each independently be a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 3 to 30 ring-forming carbon atoms, or combined with an adjacent group to form a ring. $R_1$ to $R_{11}$ may all be the same, or at least one may be different from the remainder (the other substituents).

At least one pair selected from among pairs of two neighboring substituents selected from among $R_8$ to $R_{11}$ may be bonded to *α and *β of Formula 2, respectively. For example, $R_8$ and $R_9$, $R_9$ and $R_{10}$, or $R_{10}$ and $R_{11}$ may make a pair and may be bonded to *α and *β of Formula 2, respectively. At least one pair selected from among pairs of two neighboring substituents selected from among $R_8$ to $R_{11}$ may be bonded to *α and *β of Formula 2 to form a ring. However, an embodiment in which *α is bonded to $R_{10}$, and *β is bonded to $R_9$ is excluded.

$R_{12}$ to $R_{18}$ may each independently be a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 3 to 30 ring-forming carbon atoms. $R_{12}$ to $R_{18}$ may all be the same, or at least one may be different from the remainder (the other substituents).

$R_1$ to $R_7$ of Formula 1 and $R_{12}$ to $R_{18}$ of Formula 2 may each independently be an amine group including at least two selected from among a substituted or unsubstituted phenyl group, an unsubstituted naphthyl group, an unsubstituted dibenzofuran group, an unsubstituted carbazole group, and a substituted or unsubstituted dibenzo thiopenyl group, a hydrogen atom, a deuterium atom, a substituted or unsubstituted phenyl group, a substituted or unsubstituted carbazole group, a substituted or unsubstituted isopropyl group, or a substituted or unsubstituted t-butyl group. For example, $R_1$ to $R_7$ of Formula 1 and $R_{12}$ to $R_{18}$ of Formula 2 may each independently be represented by any one selected from among the compounds represented in Compound Group B. In the compounds (in Compound Group B), "———*" may be a part bonded to the core structure of Formula 1 or the core structure of Formula 2.

Compound Group B

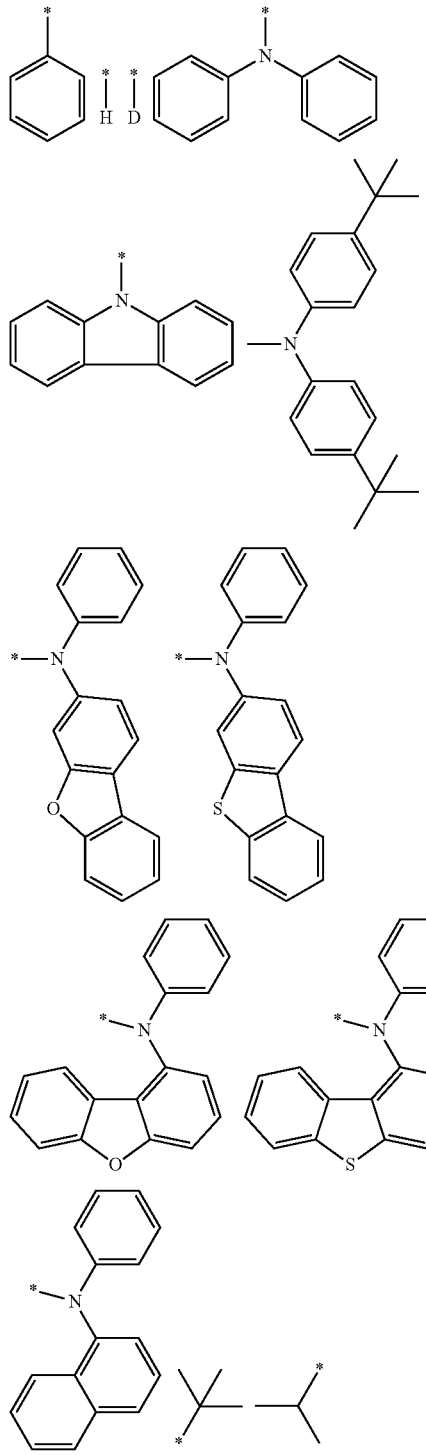

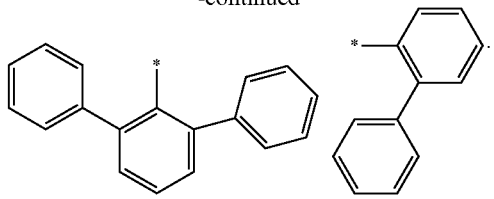

Remaining parts excluding bonded parts to Formula 2 selected from among $R_8$ to $R_{11}$ of Formula 1 (i.e., substituents selected from among $R_8$ to $R_{11}$ that are not bonded to Formula 2) may each independently be a hydrogen atom, a deuterium atom, a substituted or unsubstituted phenyl group, a substituted or unsubstituted naphthyl group, a substituted or unsubstituted phenanthryl group, a substituted or unsubstituted diphenyl amine group, a substituted or unsubstituted carbazole group, a substituted or unsubstituted acridine group, a substituted or unsubstituted phenothiazine group, or a substituted or unsubstituted phenoxazine group. For example, remaining parts excluding bonded parts to Formula 2 selected from among $R_8$ to $R_{11}$ of Formula 1 may be represented by any one selected from among the compounds represented in Compound Group A. In the compounds, "———*" may be a part bonded to the core structure of Formula 1.

Compound Group A

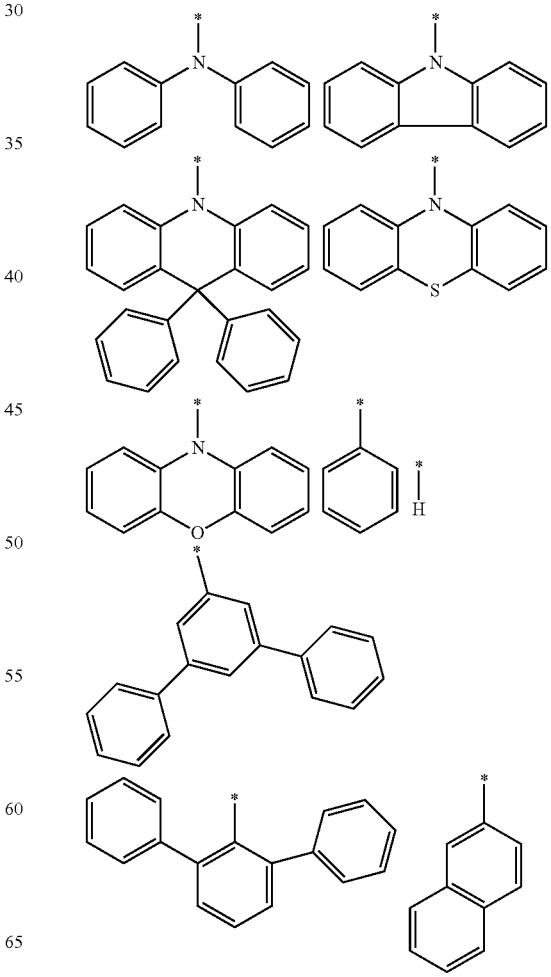

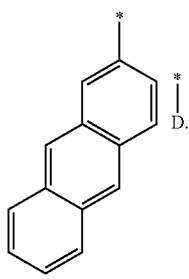

Formula 1 may be represented by any one selected from among Formula 3-1 to Formula 3-4. Formula 3-1 to Formula 3-4 correspond to Formula 1 in which the number and position bonded of Formula 2 are specified. Formula 3-1 to Formula 3-3 correspond to Formula 1 in which one of Formula 2 is bonded, and Formula 3-4 corresponds to Formula 1 in which two of Formula 2 are bonded. In Formula 3-1, *α is bonded to position $R_9$, and *β is bonded to position $R_{10}$, in Formula 3-2, *α is bonded to position $R_{10}$, and *β is bonded to position $R_{11}$, and in Formula 3-3, *α is bonded to position $R_9$, and *β is bonded to position $R_8$. In Formula 3-4, *α of one Formula 2 is bonded to position $R_9$, *β is bonded to position $R_8$, *α of another Formula 2 is bonded to position $R_{11}$, and *β is bonded to position $R_{10}$.

Formula 3-1

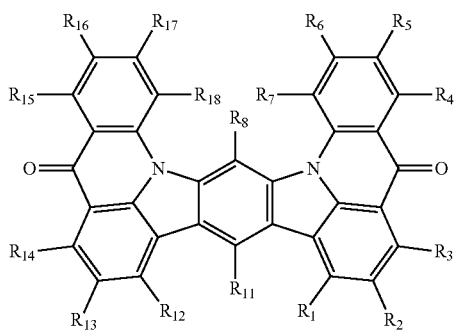

Formula 3-2

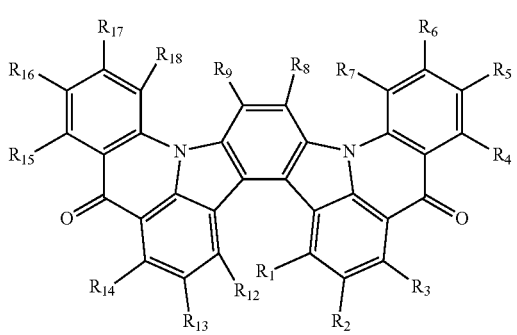

Formula 3-3

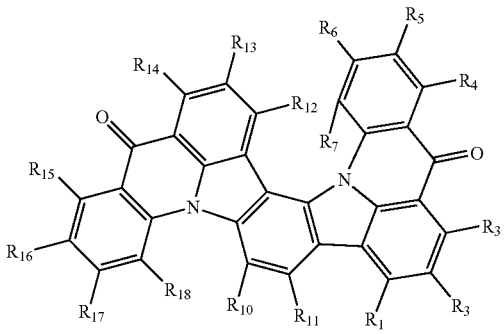

Formula 3-4

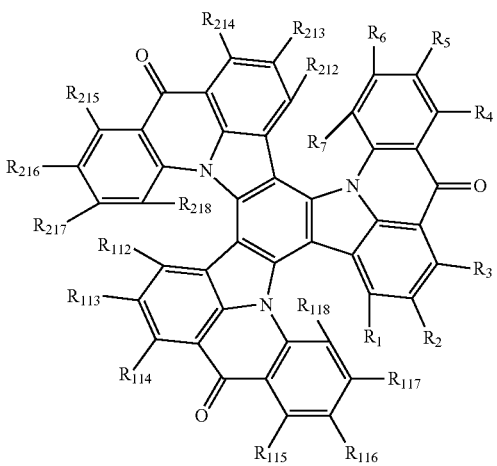

In Formula 3-1 to Formula 3-4, for $R_1$ to $R_{11}$ the definitions for Formula 1 may be applied. In Formula 3-1 to Formula 3-3, for $R_{12}$ to $R_1$ in the definitions for Formula 2 may be applied. In Formula 3-4, $R_{112}$ to $R_{118}$, and $R_{212}$ to $R_{218}$ may each independently be a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 3 to 30 ring-forming carbon atoms. $R_{112}$ to $R_{118}$, and $R_{212}$ to $R_{218}$ may all be the same, or at least one may be different from the remainder (the other substituents). In Formula 3-1, $R_8$ and $R_{11}$ may all be hydrogen atoms. In Formula 3-3, $R_{10}$ and $R_{11}$ may be the same.

In the light emitting element ED of an embodiment, the emission layer EML may include a first compound represented by Formula A.

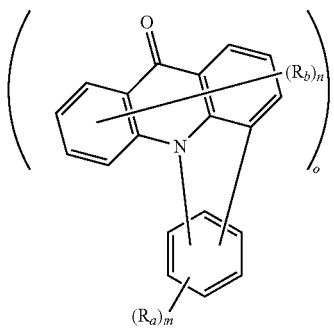

Formula A

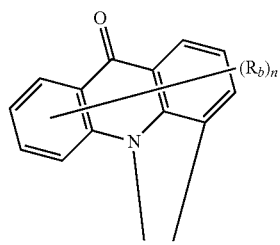

is embodied.

In Formula A, "m" may be an integer from 0 to 4. When "m" is an integer of 2 or more, multiple $R_a$ may all be the same, or one or more $R_a$ may be different from the remainder (the other substituents). "n" may be an integer from 0 to 7. "o" may be an integer from 1 to 3. When "n" and "o" are integers of 2 or more, the same explanation on the relation of "m" and $R_a$ may be applied to the relation of "n" and $R_b$, and the relation of "o" and

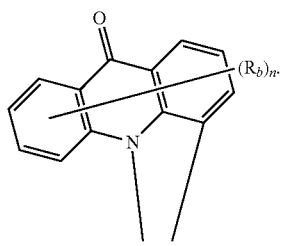

$R_a$ and $R_b$ may each independently be a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 3 to 30 ring-forming carbon atoms. $R_a$ and $R_b$ may be the same or different from each other. However, when "o" is 2 in Formula A, for the position relation of two

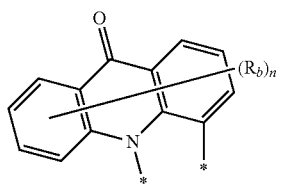

which are substituted at a benzene ring which is a core, an embodiment in which two nitrogen atoms bonded to the benzene are at para positions, and two carbon atoms bonded to the benzene ring are at para positions, is excluded.

Formula A may be represented by Formula B-1 or B-2. Formula B-1 and Formula B-2 correspond to Formula A in which the substitution number of Formula B-1

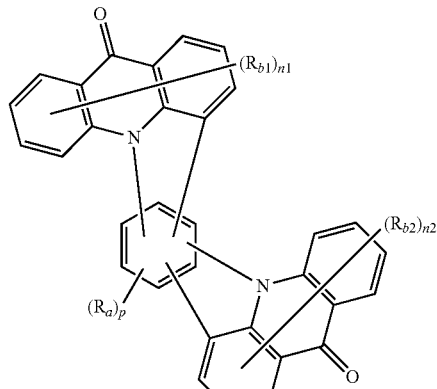

Formula B-2

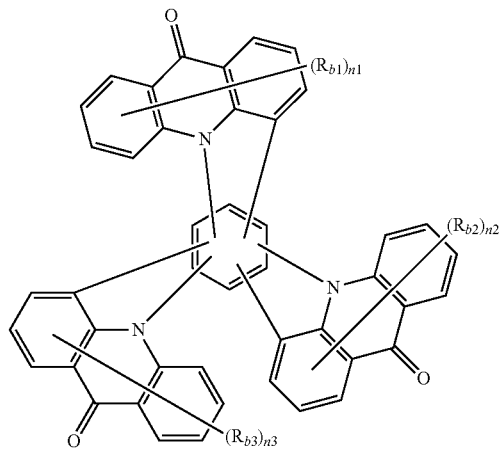

In Formula B-1 and Formula B-2, "p" may be an integer from 0 to 2. The same explanation on $R_a$ as defined in Formula A may be applied. The same explanation for $R_b$ as defined in Formula A may be applied to $R_{b1}$ to $R_{b3}$. The same explanation for "n" as defined in Formula A may be applied to n1 to n3.

Formula B-1 may be represented by any one selected from among Formula C-1 to Formula C-3. Formula C-1 to Formula C-3 correspond to Formula B-1 in which the position of

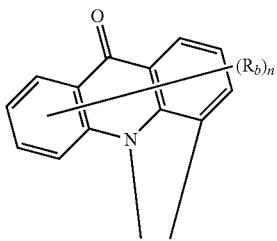

Formula C-1 bonded to a core is specified.

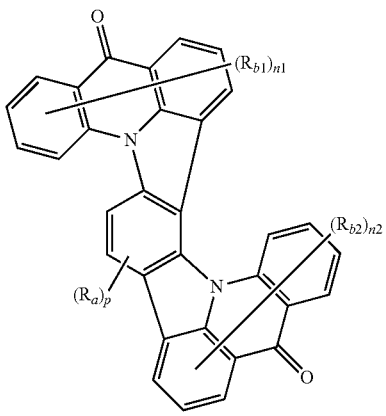

Formula C-2

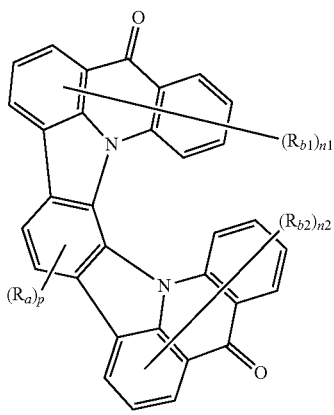

Formula C-3

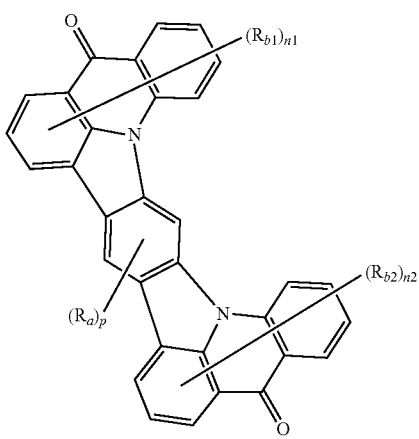

In Formulae C-1 to C-3, the same explanation for p, $R_a$, $R_{b1}$, $R_{b2}$, n1, and n2 defined in Formula 1 may be applied.

Formula B-2 may be represented by Formula D. Formula D corresponds to Formula B-2 in which the position of

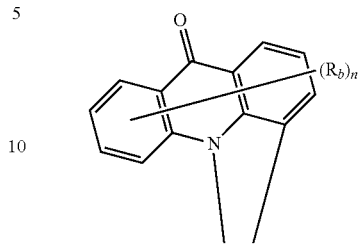

bonded to a core is specified.

Formula D

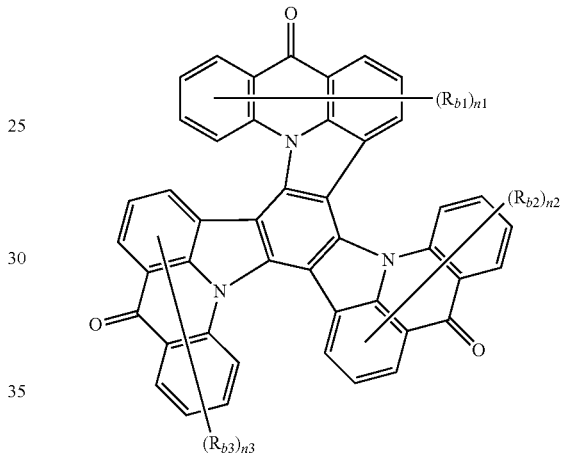

In Formula D, the same explanation for $R_{b1}$ to $R_{b3}$, and n1 to n3 defined in Formula B-2 may be applied.

In an embodiment, an emission layer EML may include at least one selected from among the polycyclic compounds represented in Compound Group 1.

Compound Group 1

1

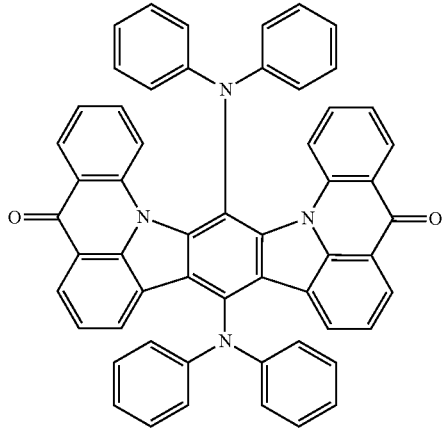

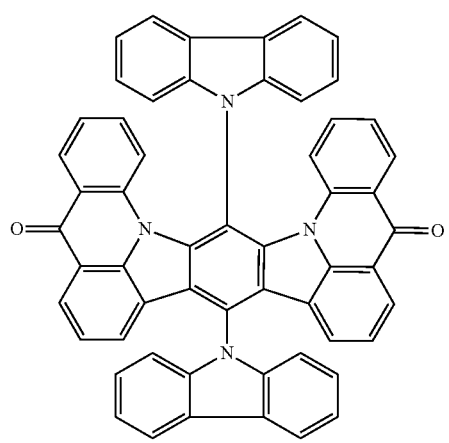
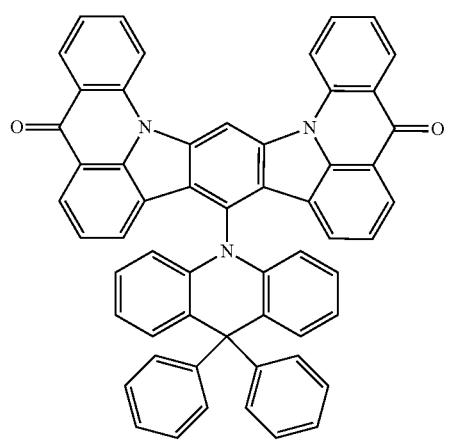
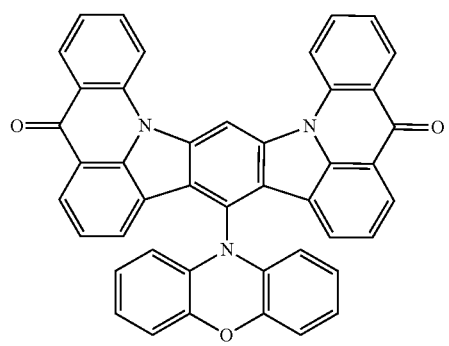
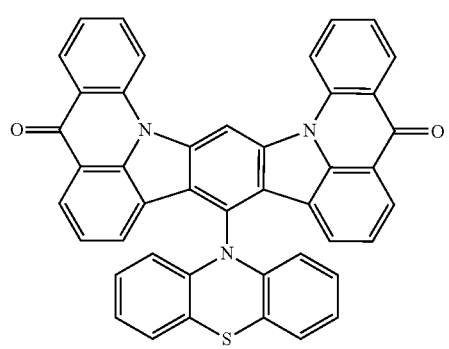
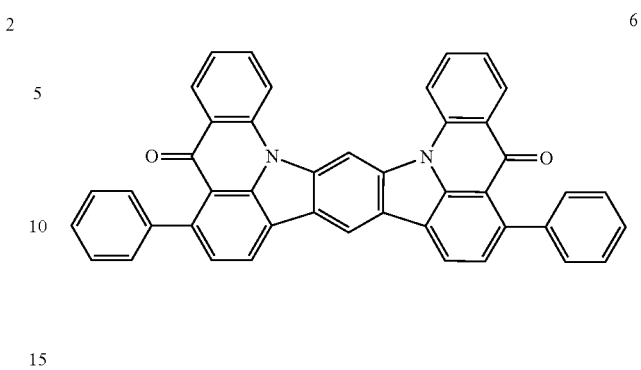
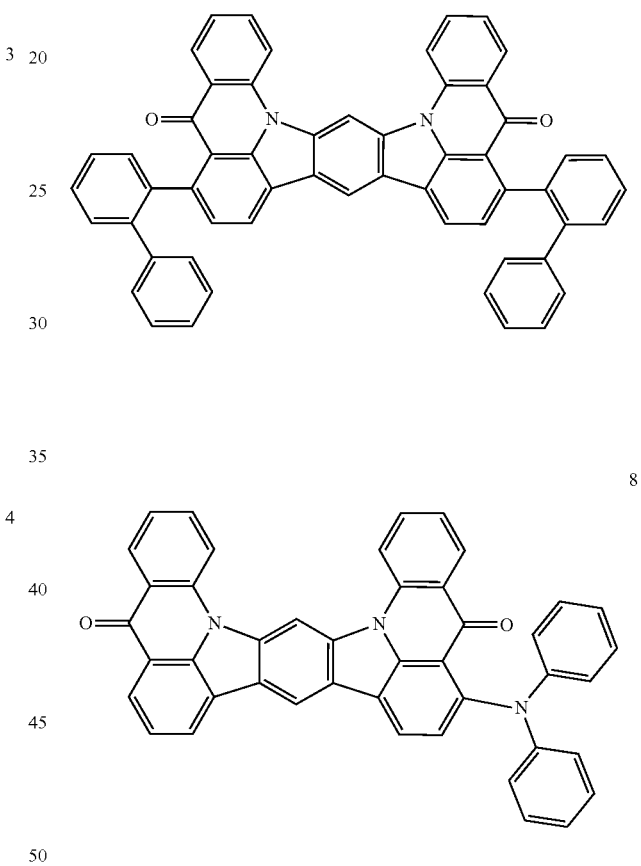
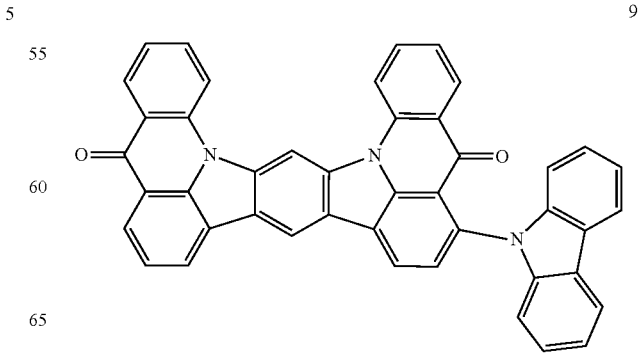

-continued
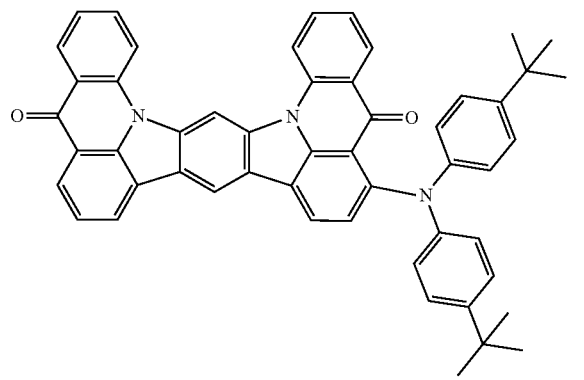
10
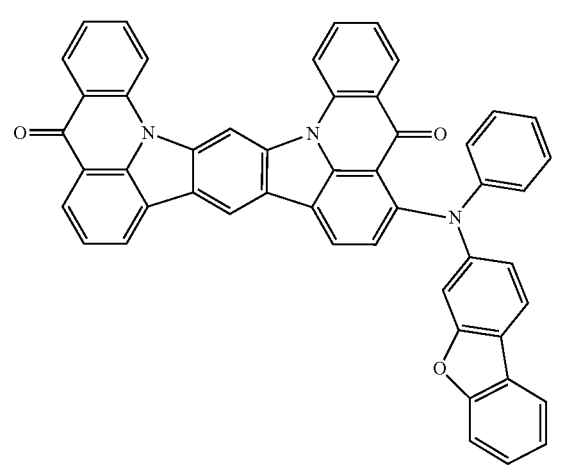
11
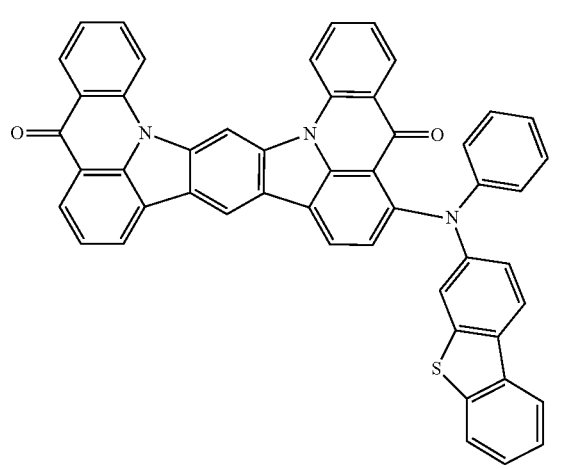
12
-continued
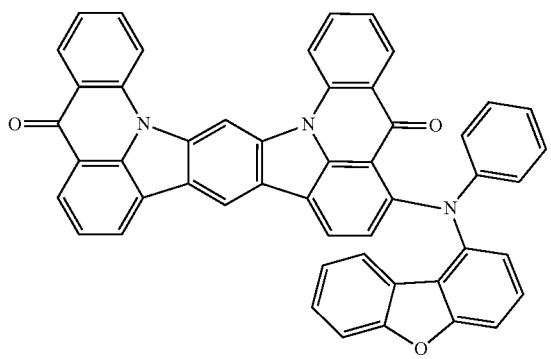
13
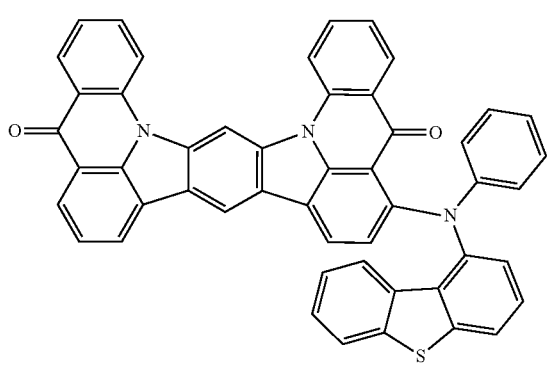
14
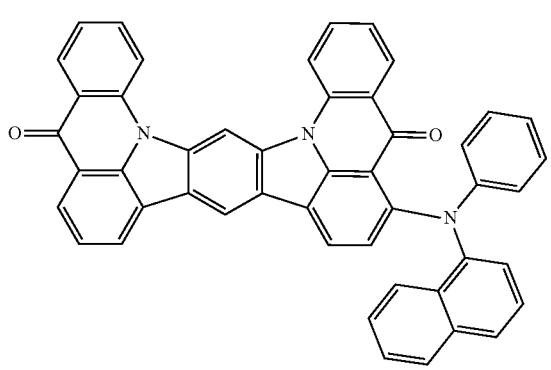
15
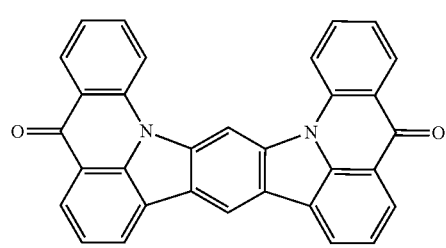
16

17
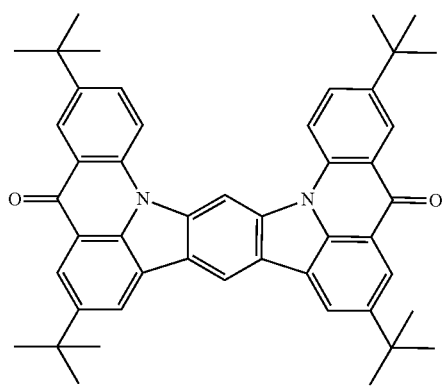
20
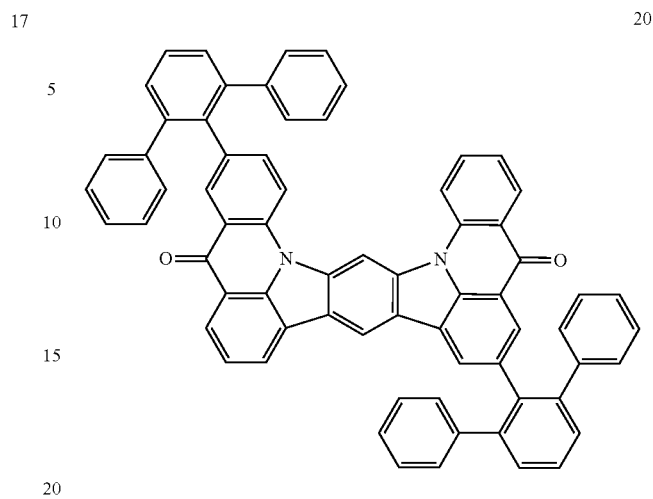
18
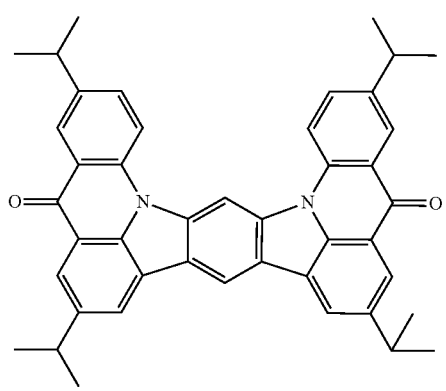
21
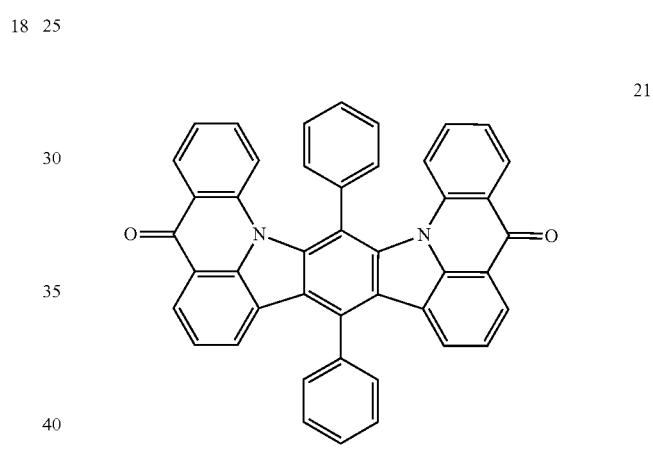
19
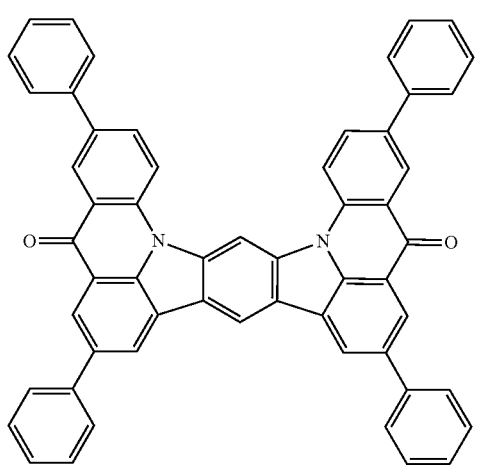
22
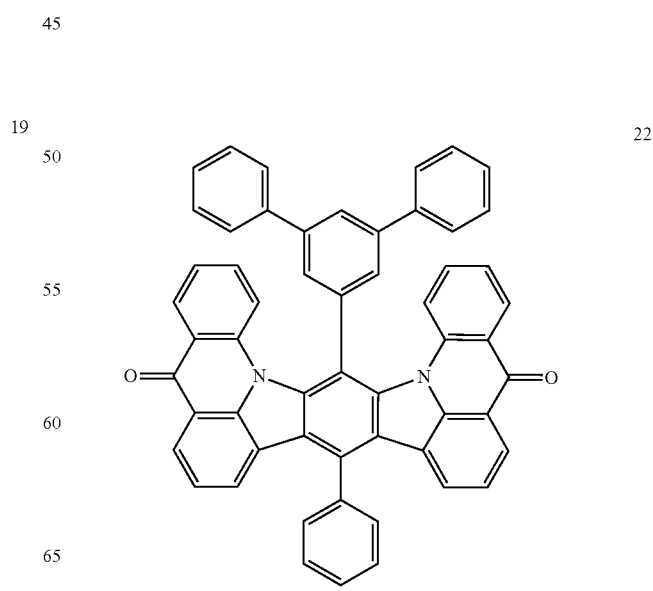

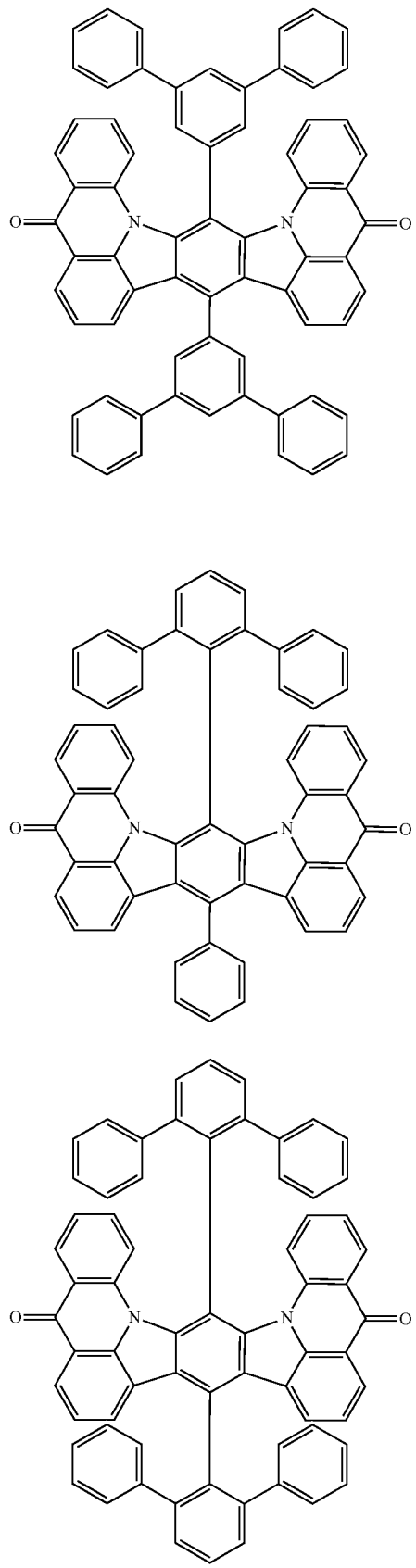
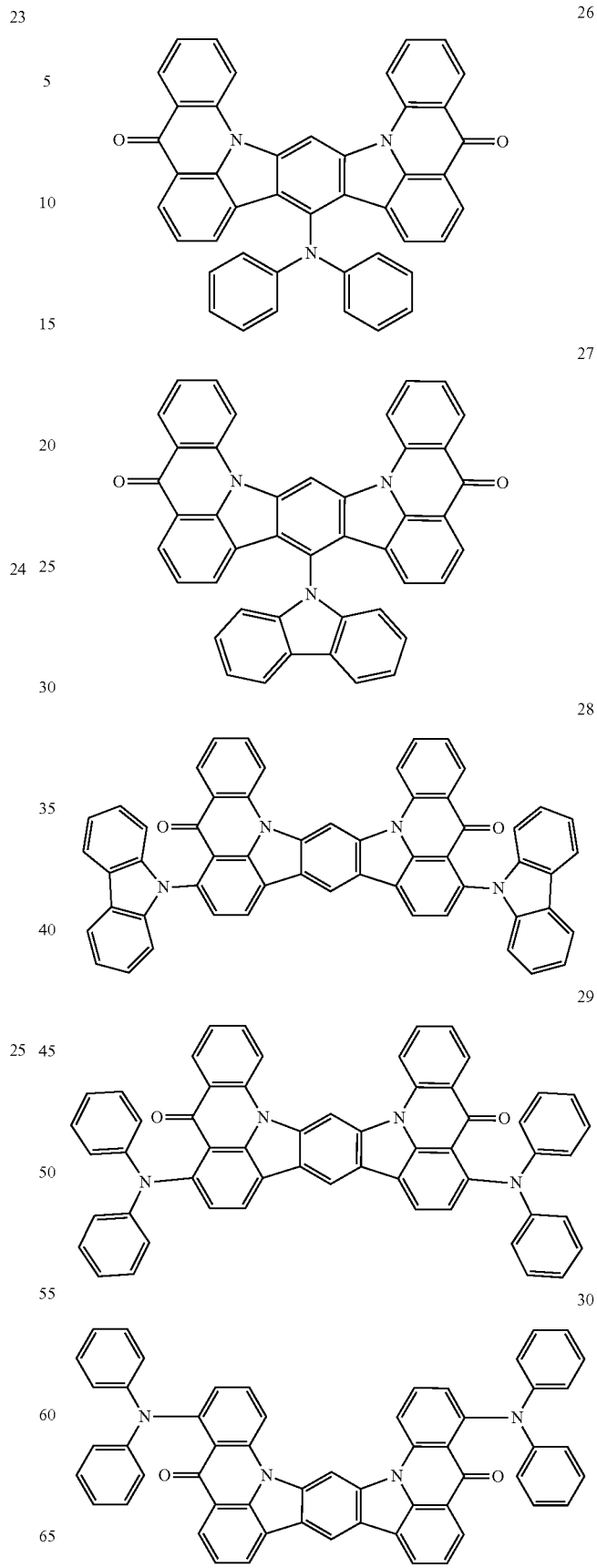

31
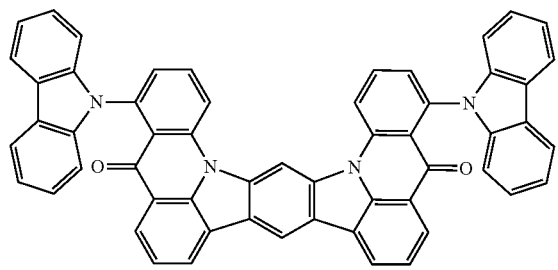
32
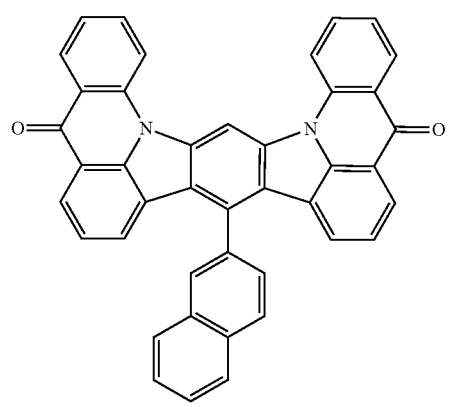
33
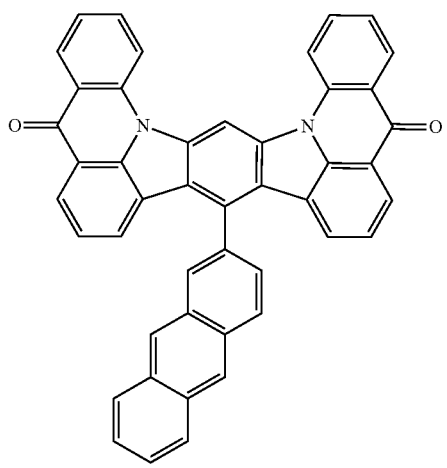
34
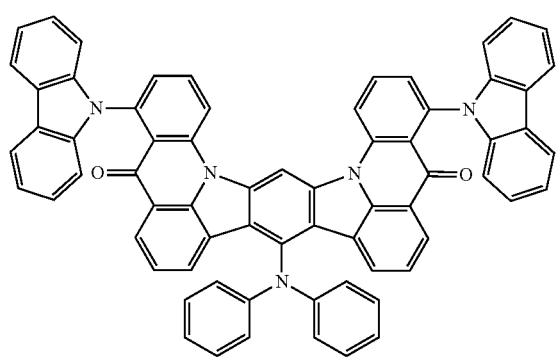
35
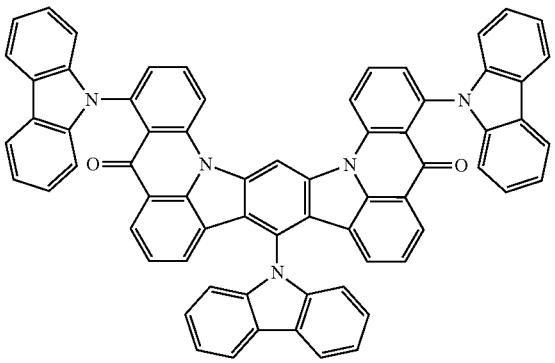
36
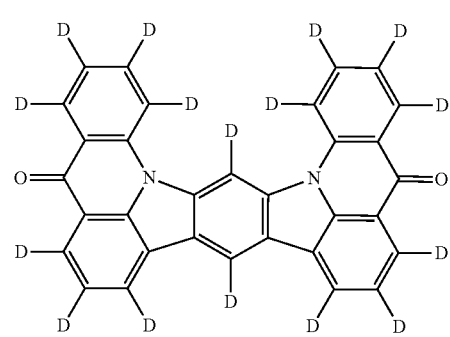
37
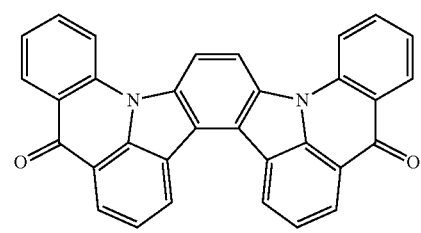
38
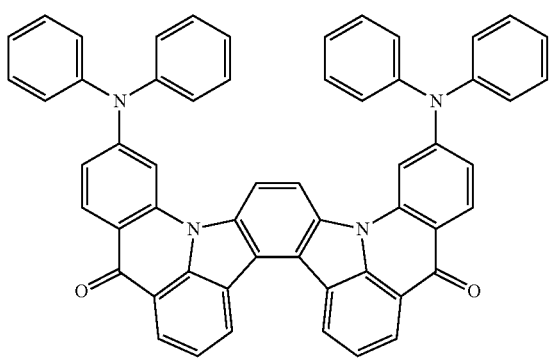
39
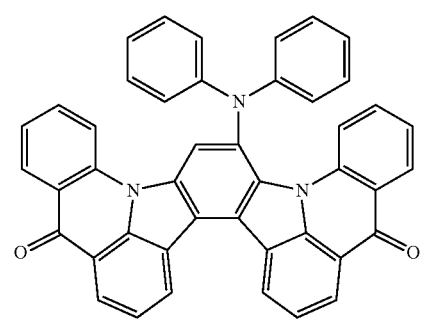

40
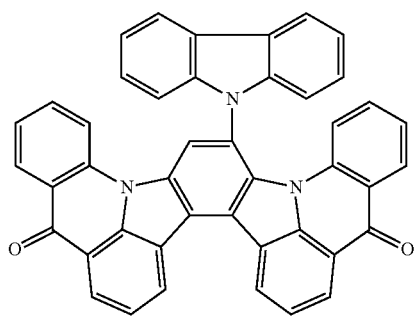
41
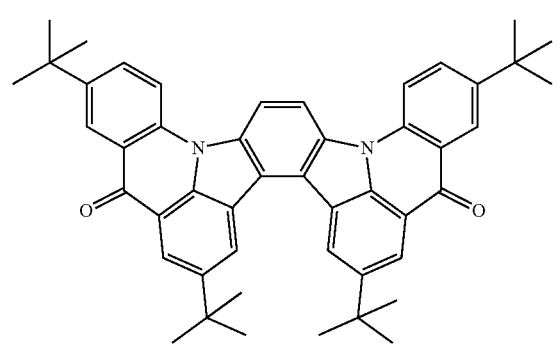
42
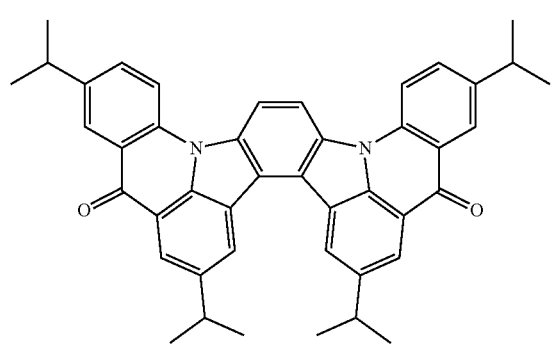
43
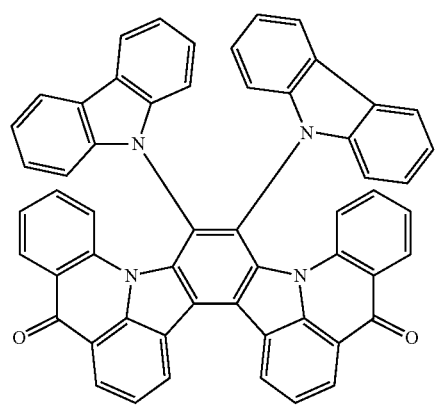
44
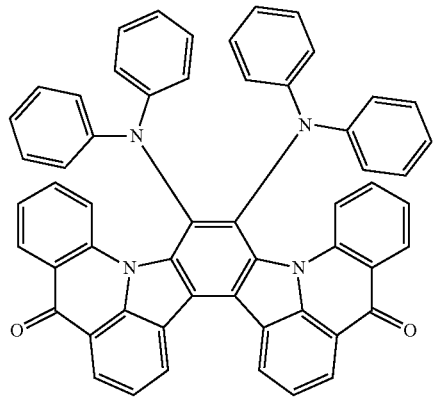
45
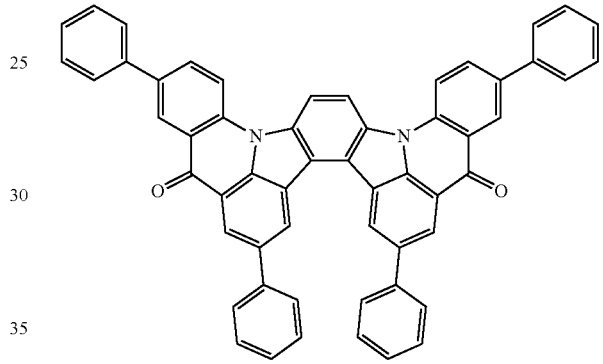
46
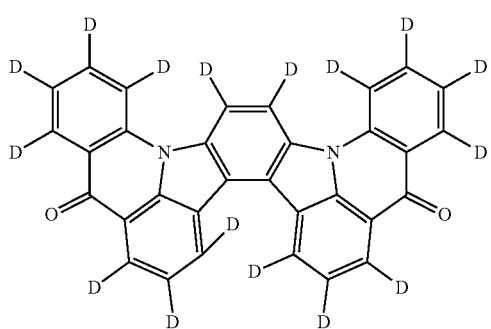
47
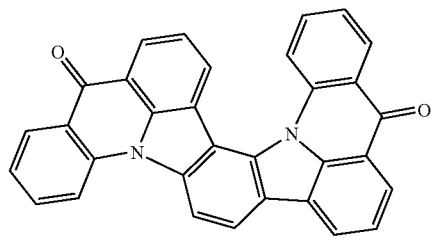

48
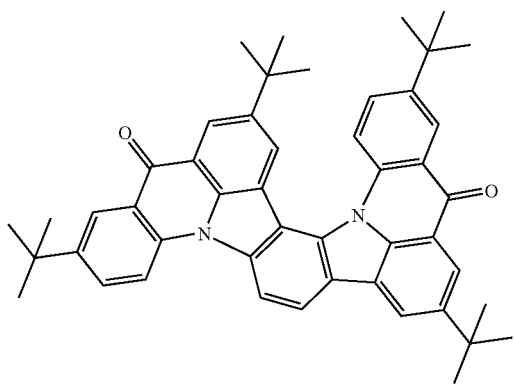
49
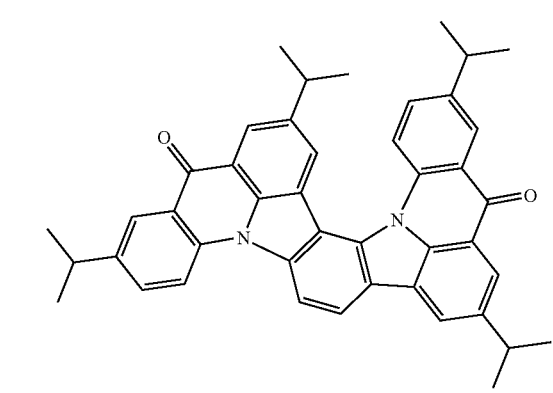
50
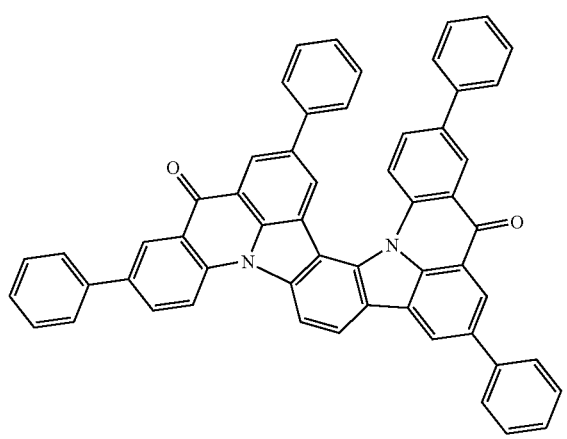
51
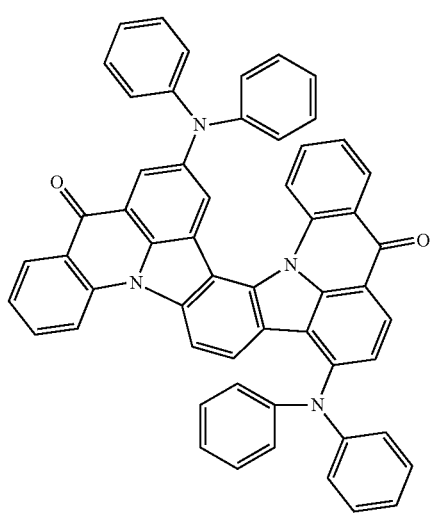
52
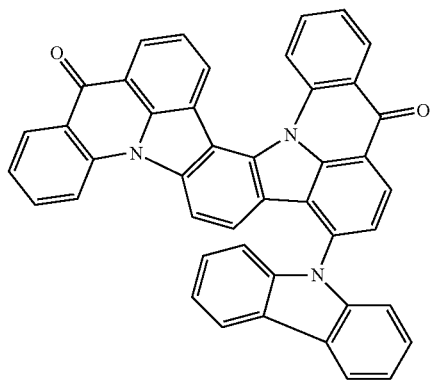
53
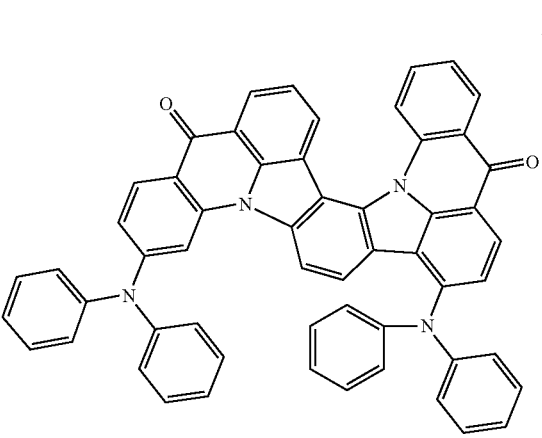
54

55

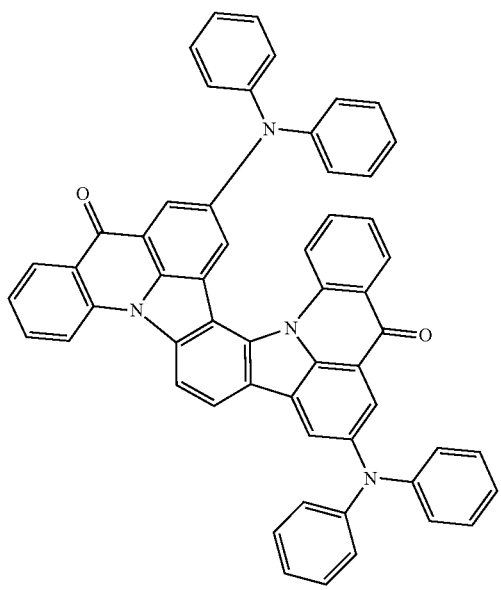

56

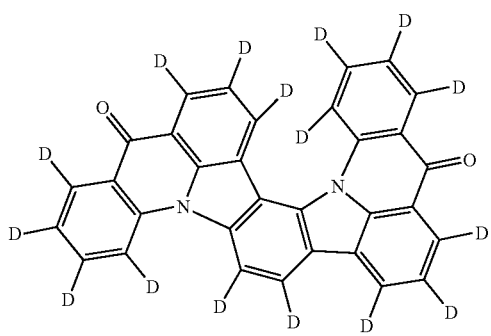

57

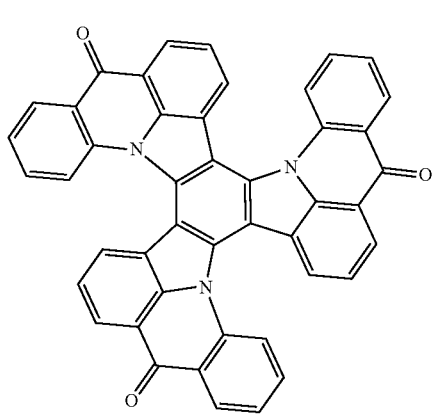

58

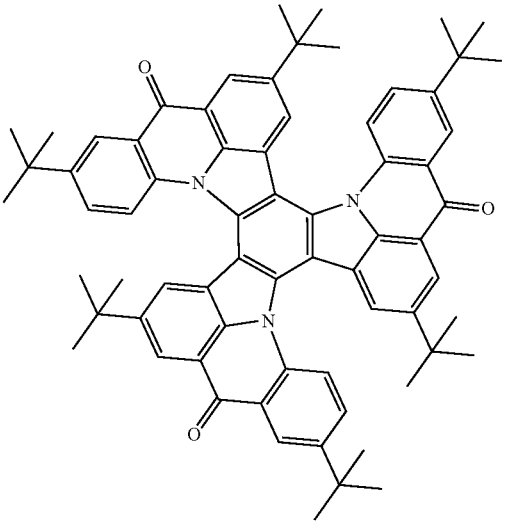

59

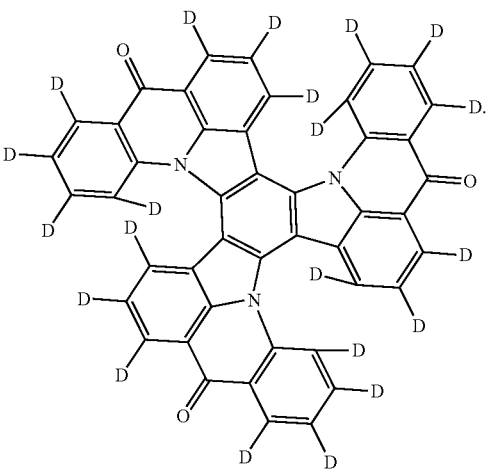

The polycyclic compound of an embodiment has a structure including two or more acridone groups including an oxygen atom and a nitrogen atom and has a structure not including a boron atom in a core. The interaction of a vacant p-orbital in a boron atom with a nucleophile is active, and a polycyclic compound including a boron atom has defects of degrading stability. An oxygen atom and a nitrogen atom are different from the boron atom in not including a vacant p-orbital. Accordingly, the polycyclic compound of an embodiment has structural stability when compared to a polycyclic compound including a boron atom. In some embodiments, the light emitting element of an embodiment includes the polycyclic compound of an embodiment, having high structural stability in an emission layer, and may have high emission efficiency and long-life characteristics when compared to a light emitting element including a polycyclic compound including a boron atom in an emission layer.

The polycyclic compound of an embodiment, represented by Formula 1 or Formula A may be used as a fluorescence emitting material or a thermally activated delayed fluorescence (TADF) material. For example, the polycyclic compound of an embodiment may be used as a light emitting dopant emitting blue light. In some embodiments, the polycyclic compound of an embodiment may be used as a TADF dopant material.

The polycyclic compound of an embodiment may be a light emitting material having maximum emission wavelength (Amax) in a wavelength region of about 490 nm or less. For example, the polycyclic compound of an embodiment, represented by Formula 1 or Formula A may be a light emitting material having maximum emission wavelength in a wavelength region of about 450 nm to about 470. For example, the polycyclic compound of an embodiment may be a blue thermally activated delayed fluorescence dopant. However, an embodiment of the present disclosure is not limited thereto.

In the light emitting elements ED of embodiments, shown in FIG. 3 to FIG. 6, an emission layer EML may include a host and a dopant, and the emission layer EML may include the polycyclic compound of an embodiment as a light emitting dopant.

In the light emitting element ED of an embodiment, an emission layer EML may include a first compound to a third compound, which are different from each other. The first compound may be represented by Formula 1 or Formula A. The first compound may be a light emitting dopant, the second compound may be a first host, and the third compound may be a second host. In an embodiment, the second compound may be a hole transport host, and the third compound may be an electron transport host.

The light emitting element ED of an embodiment may include at least one compound selected from among HT-1 to HT-4 in an emission layer EML as a hole transport host.

HT-1

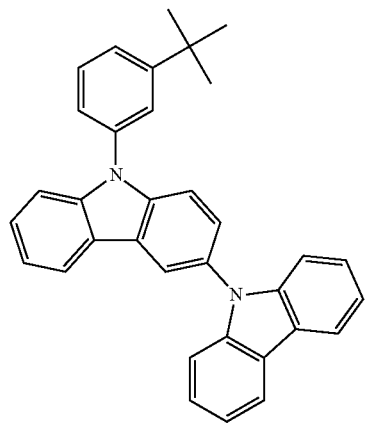

HT-2

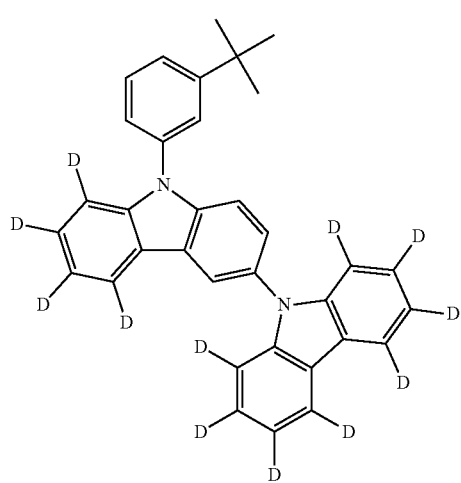

HT-3

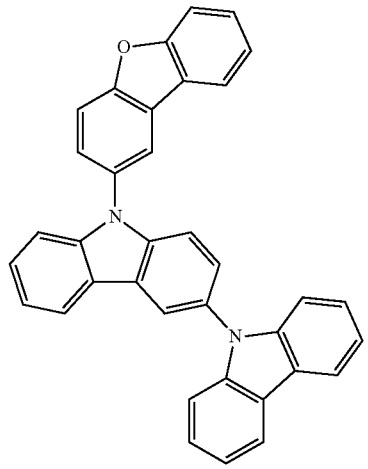

HT-4

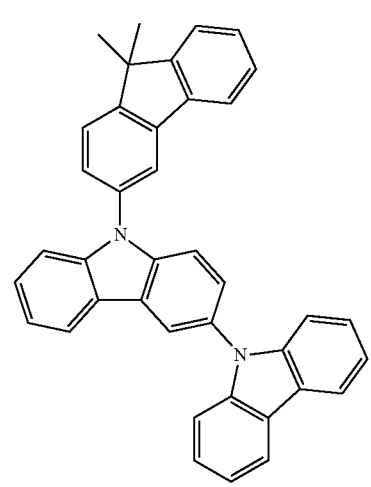

In some embodiments, the light emitting element ED of an embodiment may include at least one compound selected from among ET-1 to ET-3 in an emission layer EML as an electron transport host.

ET-1

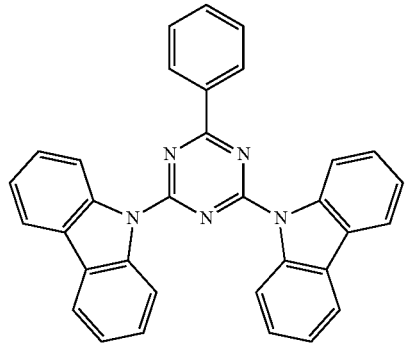

-continued

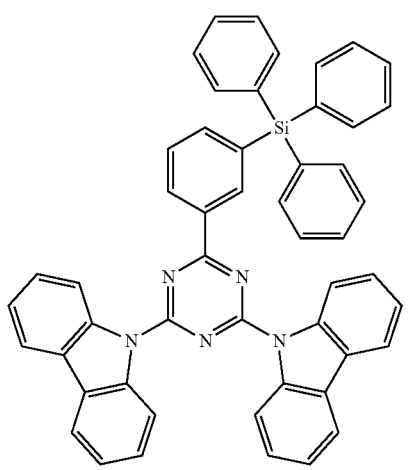
ET-2

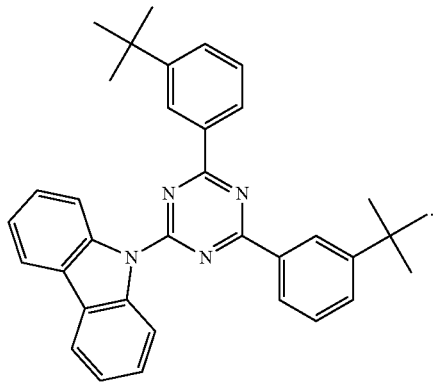
ET-3

The electron transport host and the hole transport host may be combined to form an exciplex. The exciplex may transfer energy through energy transition to a phosphorescence dopant and a thermally activated delayed fluorescence dopant to arise light emission.

The triplet energy of the exciplex formed by the hole transport host and the electron transport host may correspond to a difference between the energy level of the lowest unoccupied molecular orbital (LUMO) of the electron transport host and the energy level of the highest occupied molecular orbital (HOMO) of the hole transport host. For example, the triplet energy of the exciplex formed by the hole transport host and the electron transport host in the light emitting element may be from about 2.4 eV to about 3.0 eV. In some embodiments, the triplet energy of the exciplex may be a value smaller than the energy gap of each host material. The energy gap may be a difference between the LUMO energy level and the HOMO energy level. For example, the energy gap of each of the hole transport host and the electron transport host may be about 3.0 eV or more, and the exciplex may have the triplet energy of about 3.0 eV or less.

In the light emitting element ED of an embodiment, the emission layer EML may further include a fourth compound represented by Formula M-b. The fourth compound may be an auxiliary dopant. In the light emitting element ED of an embodiment, the auxiliary dopant included in the emission layer EML may transfer energy to a light emitting dopant to increase the ratio of emitting fluorescence by the light emitting dopant.

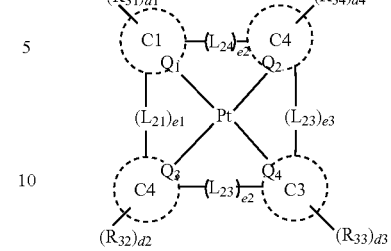
Formula M-b

In Formula M-b, Q1 to Q4 may each independently be C or N, and C1 to C4 may each independently be a substituted or unsubstituted hydrocarbon ring of 5 to 30 ring-forming carbon atoms, or a substituted or unsubstituted heterocycle of 2 to 30 ring-forming carbon atoms. $L_{21}$ to $L_{24}$ may each independently be a direct linkage, $$*-O-*,$$

$$*-S-*,$$

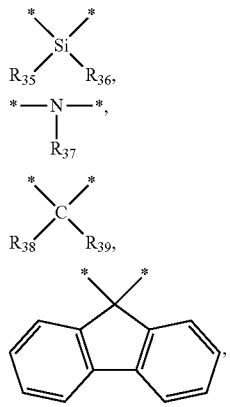

a substituted or unsubstituted divalent alkyl group of 1 to 20 carbon atoms, a substituted or unsubstituted arylene group of 6 to 30 ring-forming carbon atoms, or a substituted or unsubstituted heteroarylene group of 2 to 30 ring-forming carbon atoms.

e1 to e4 may each independently be 0 or 1, $R_{31}$ to $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring, and d1 to d4 may each independently be an integer from 0 to 4.

In the light emitting element ED, the emission layer EML may include at least one selected from among M-b-1 to M-b-13 as the auxiliary dopant.

-continued
M-b-1
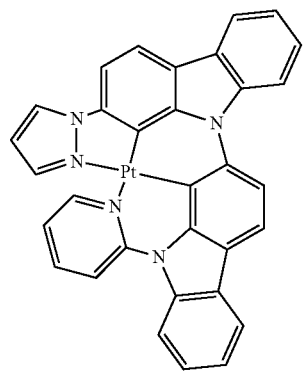
M-b-5
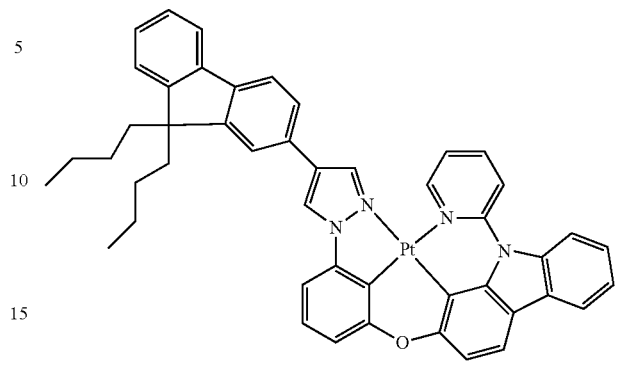
M-b-2
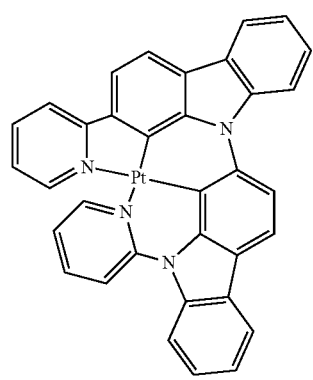
M-b-6
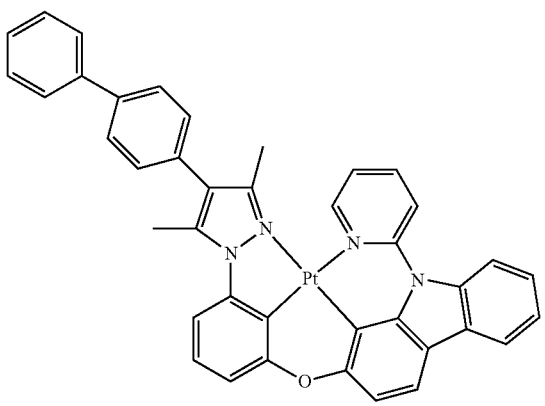
M-b-3
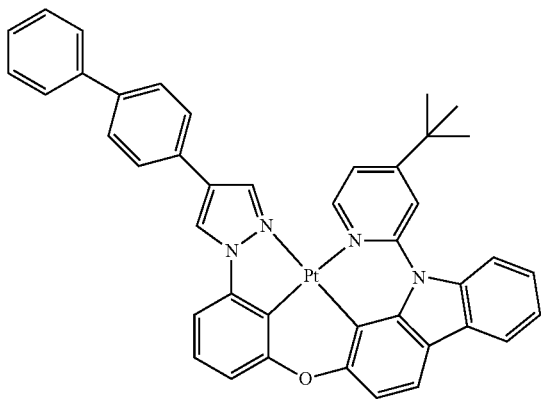
M-b-7
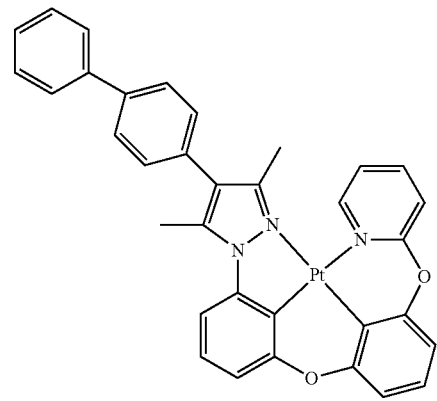
M-b-4
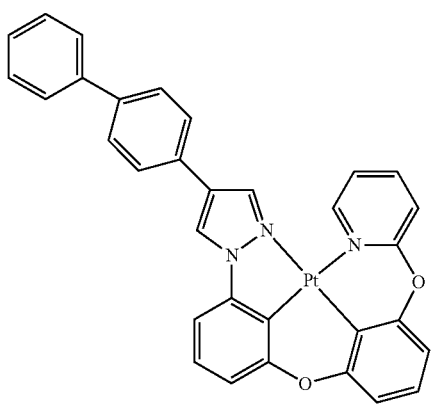
M-b-8

-continued

M-b-9
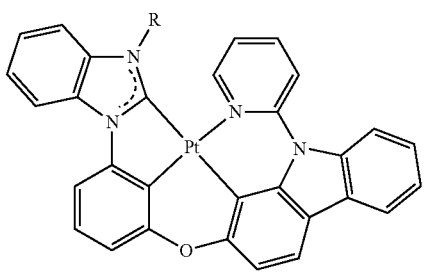

M-b-10
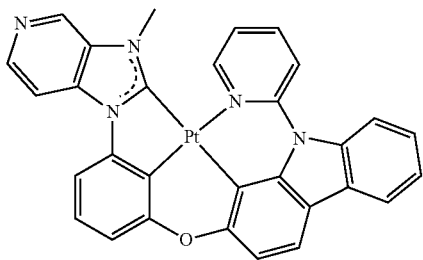

M-b-11
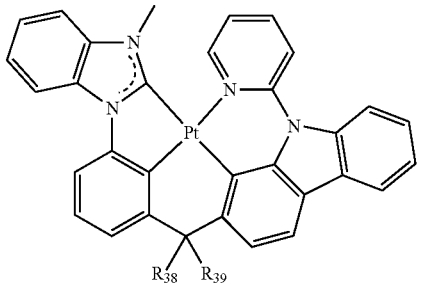

M-b-12
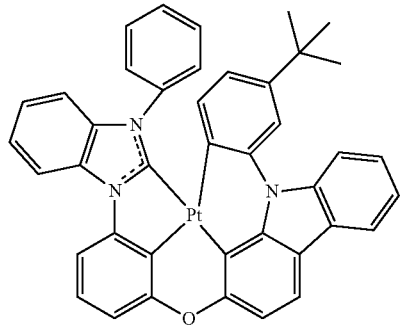

M-b-13
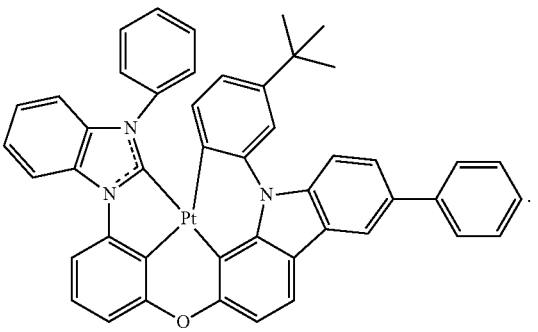

In M-b-1 to M-b-13, R, $R_{38}$, and $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

However, an embodiment of the present disclosure is not limited thereto, and the light emitting element ED of an embodiment may include a known phosphorescence dopant material which is an organometallic complex.

The light emitting element ED of an embodiment may include the first host, the second host, the auxiliary dopant and the light emitting dopant represented by the polycyclic compound of an embodiment in the emission layer EML, and may show improved emission efficiency properties.

The light emitting element ED of an embodiment may further include an emission layer material below in addition to the polycyclic compound of an embodiment, the first and second hosts, and the auxiliary dopant material. In the light emitting element ED of an embodiment, the emission layer EML may include anthracene derivatives, pyrene derivatives, fluoranthene derivatives, chrysene derivatives, dihydrobenzanthracene derivatives, or triphenylene derivatives. For example, the emission layer EML may include anthracene derivatives or pyrene derivatives.

In the light emitting elements ED of embodiments, shown in FIG. 3 to FIG. 6, the emission layer EML may include a host and a dopant, and the emission layer EML may include a compound represented by Formula E-1. The compound represented by Formula E-1 may be used as a fluorescence host material.

Formula E-1

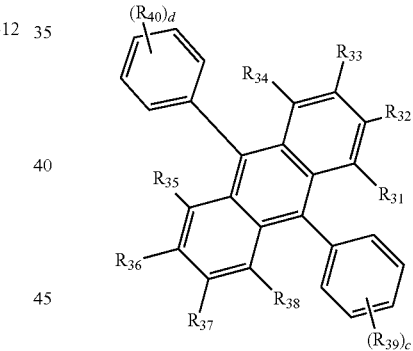

In Formula E-1, $R_{31}$ to $R_{40}$ may each independently be a hydrogen atom, a deuterium atom, a halogen atom, a substituted or unsubstituted silyl group, a substituted or unsubstituted thio group, a substituted or unsubstituted oxy group, a substituted or unsubstituted alkyl group of 1 to 10 carbon atoms, a substituted or unsubstituted alkenyl group of 2 to 10 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. In some embodiments, $R_{31}$ to $R_{40}$ may be combined with an adjacent group to form a saturated hydrocarbon ring, an unsaturated hydrocarbon ring, a saturated heterocycle, or an unsaturated heterocycle.

In Formula E-1, "c" and "d" may each independently be an integer from 0 to 5.

Formula E-1 may be represented by any one selected from among Compound E1 to Compound E19.

E1
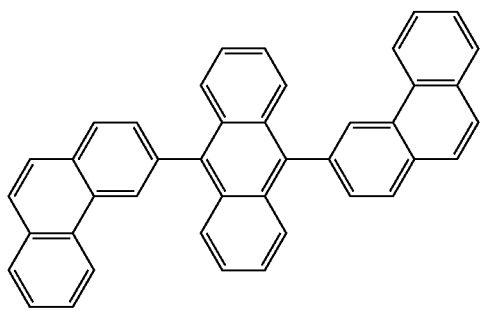
E2
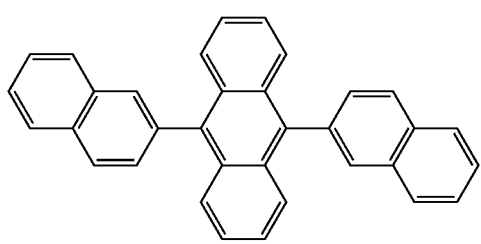
E3
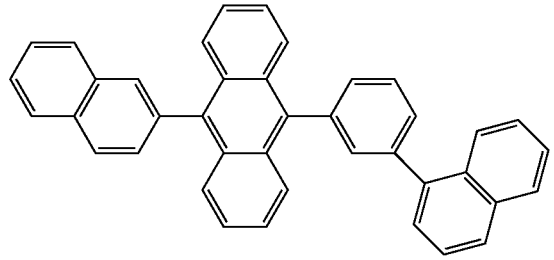
E4
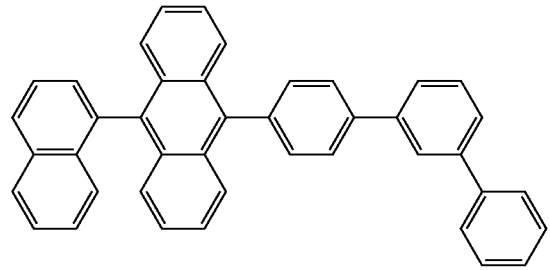
E5
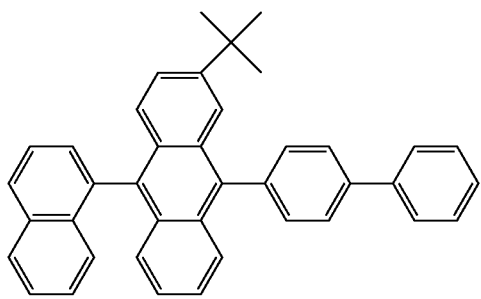
E6
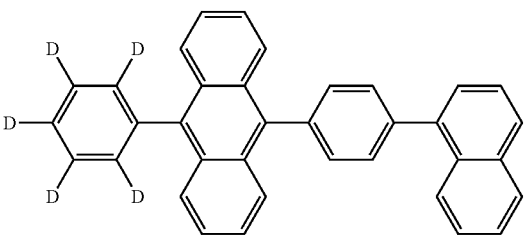
E7
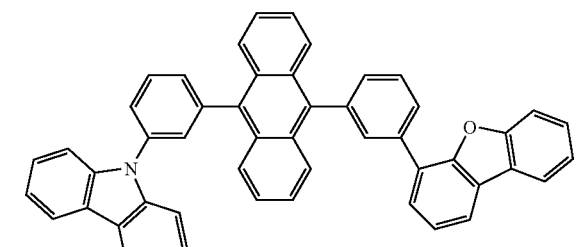
E8
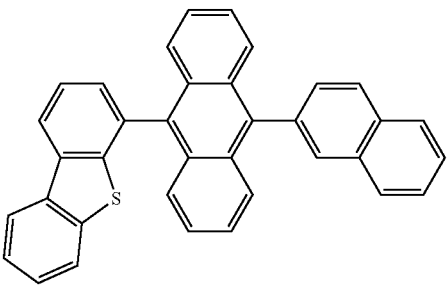
E9
E10
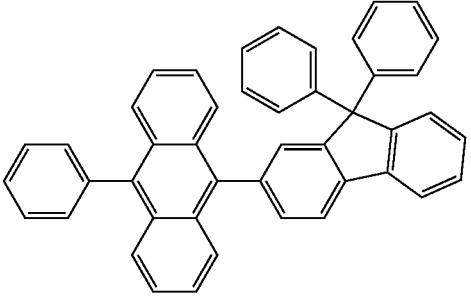

-continued
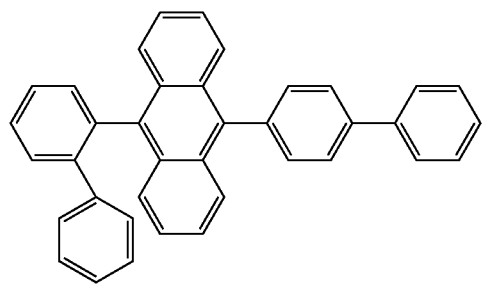
E11
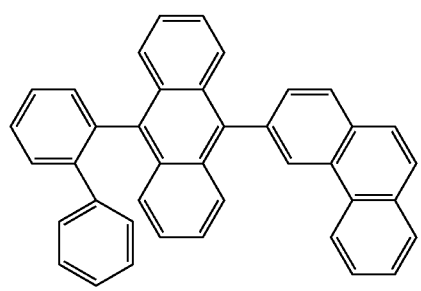
E12
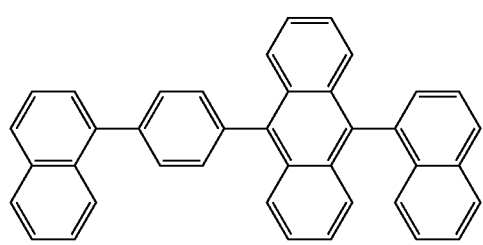
E13
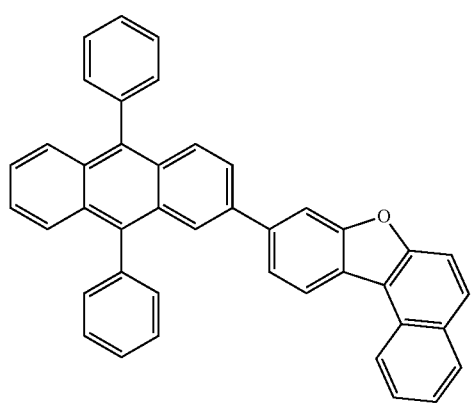
E14
-continued
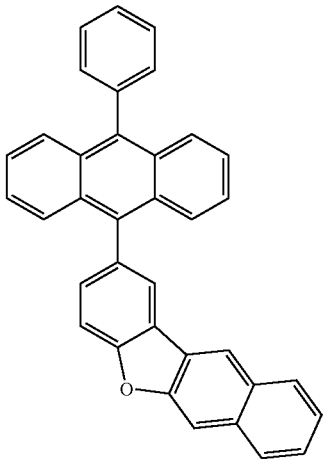
E15
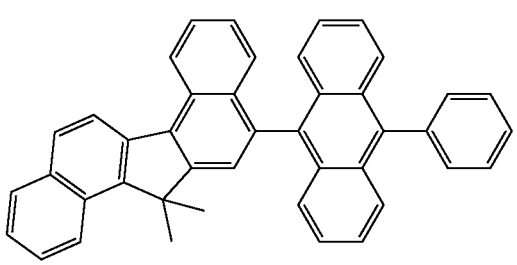
E16
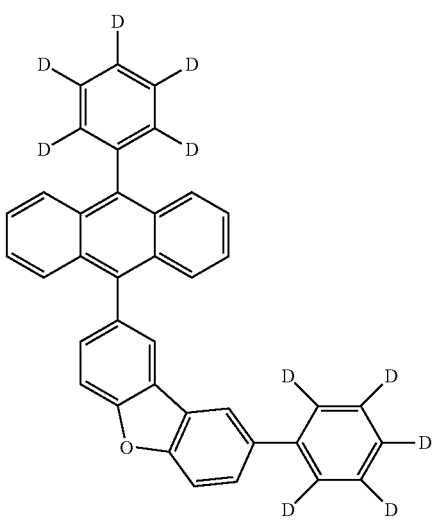
E17
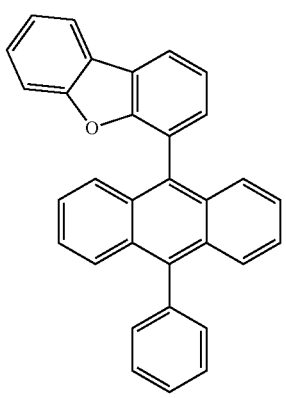
E18

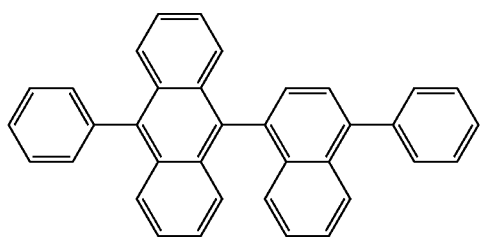

E19

In an embodiment, the emission layer EML may include a compound represented by Formula E-2a or Formula E-2b. The compound represented by Formula E-2a or Formula E-2b may be used as a phosphorescence host material.

Formula E-2a

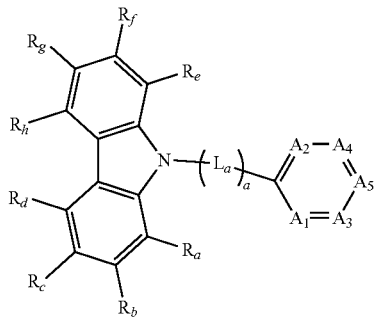

In Formula E-2a, "a" may be an integer from 0 to 10, $L_a$ may be a direct linkage, a substituted or unsubstituted arylene group of 6 to 30 ring-forming carbon atoms, or a substituted or unsubstituted heteroarylene group of 2 to 30 ring-forming carbon atoms. In some embodiments, when "a" is an integer of 2 or more, multiple $L_a$ may each independently be a substituted or unsubstituted arylene group of 6 to 30 ring-forming carbon atoms, or a substituted or unsubstituted heteroarylene group of 2 to 30 ring-forming carbon atoms.

In some embodiments, in Formula E-2a, $A_1$ to $A_5$ may each independently be N or CRi. $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. $R_a$ to $R_i$ may be combined with an adjacent group to form a hydrocarbon ring or a heterocycle including N, O, S, etc. as a ring-forming atom.

In some embodiments, in Formula E-2a, two or three selected from among $A_1$ to $A_5$ may be N, and the remainder (the substituents that are not N) may be CRI.

Formula E-2b (Cbz1)—(L$_b$)$_b$—(Cbz2)

In Formula E-2b, Cbz1 and Cbz2 may each independently be an unsubstituted carbazole group, or a carbazole group substituted with an aryl group of 6 to 30 ring-forming carbon atoms. $L_b$ may be a direct linkage, a substituted or unsubstituted arylene group of 6 to 30 ring-forming carbon atoms, or a substituted or unsubstituted heteroarylene group of 2 to 30 ring-forming carbon atoms. "b" is an integer from 0 to 10, and when "b" is an integer of 2 or more, multiple $L_b$ may each independently be a substituted or unsubstituted arylene group of 6 to 30 ring-forming carbon atoms, or a substituted or unsubstituted heteroarylene group of 2 to 30 ring-forming carbon atoms.

The compound represented by Formula E-2a or Formula E-2b may be represented by any one selected from among the compounds in Compound Group E-2. However, the compounds shown in Compound Group E-2 are merely examples, and the compound represented by Formula E-2a or Formula E-2b is not limited to the compounds represented in Compound Group E-2.

Compound Group E-2

E-2-1

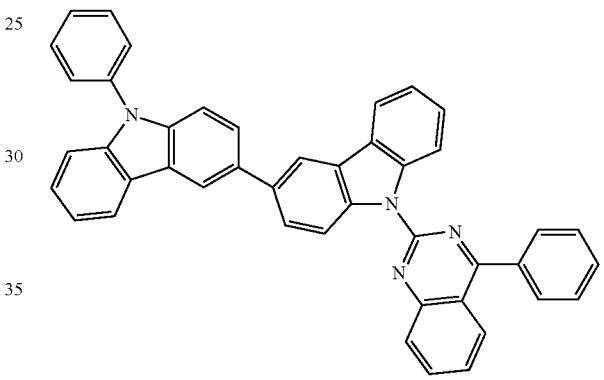

E-2-2

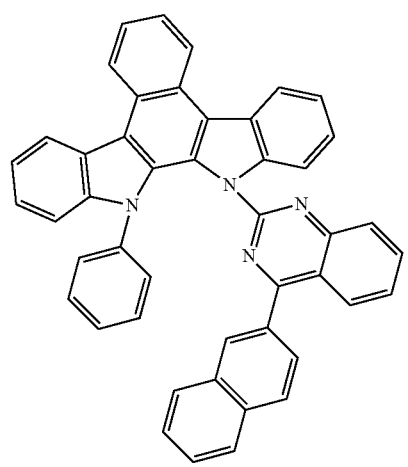

E-2-3
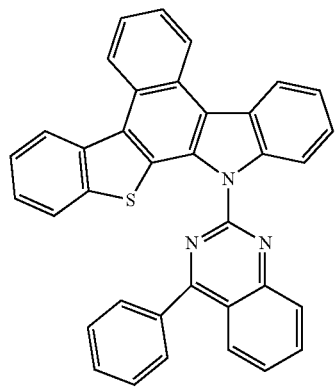
E-2-4
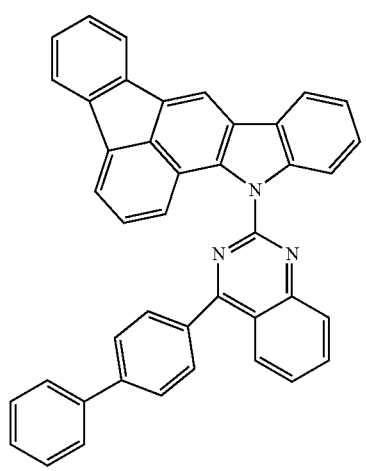
E-2-5
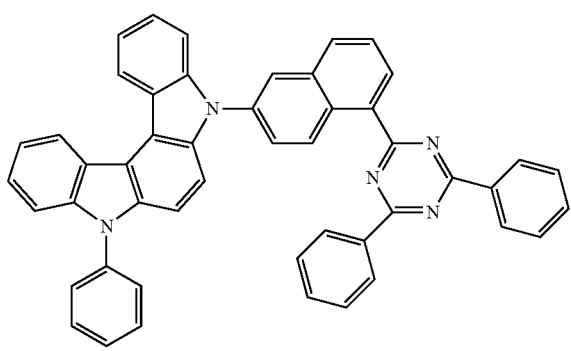
E-2-6
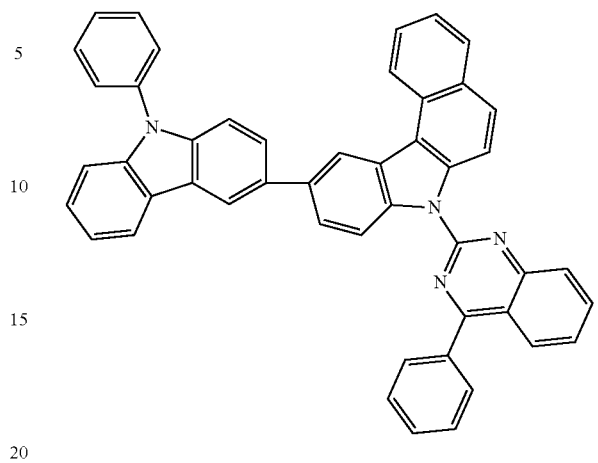
E-2-7
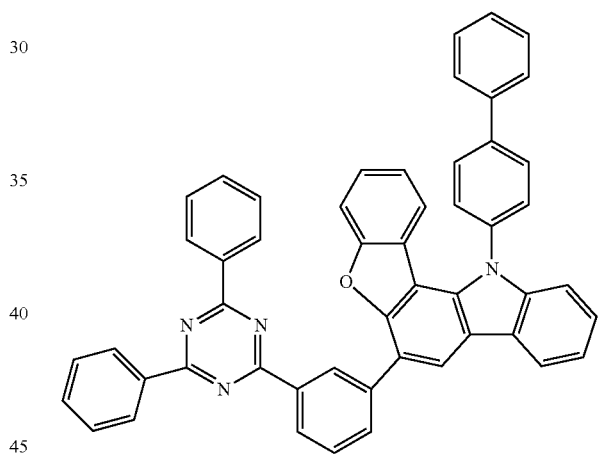
E-2-8
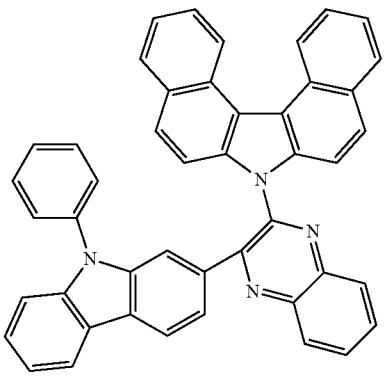

E-2-9
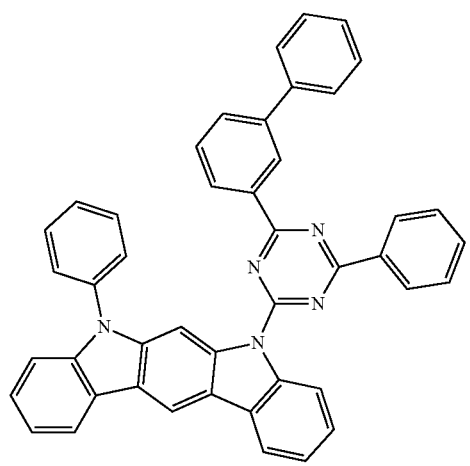
E-2-10
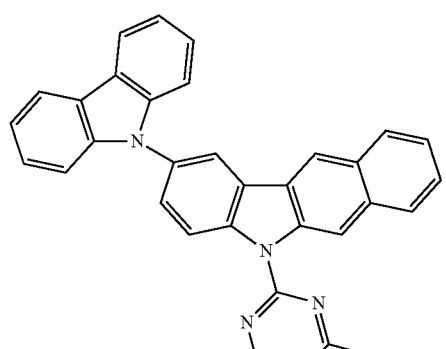
E-2-11
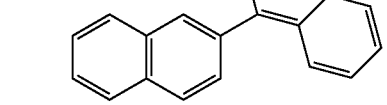
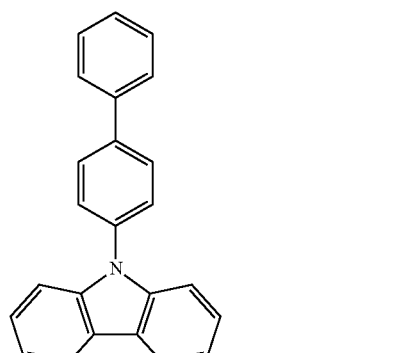
E-2-12
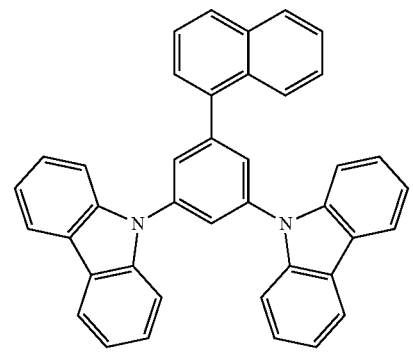
E-2-13
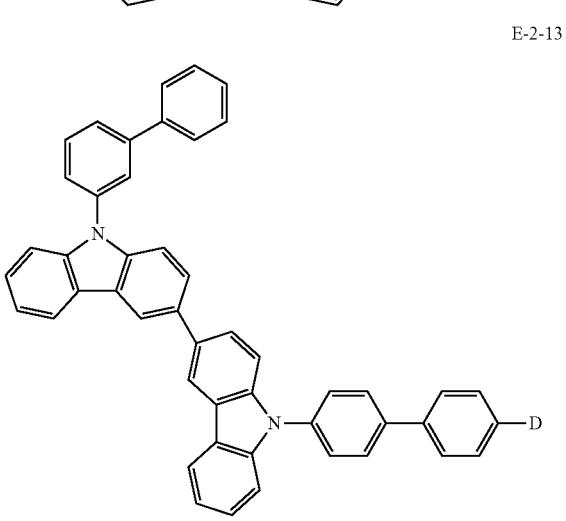
E-2-14
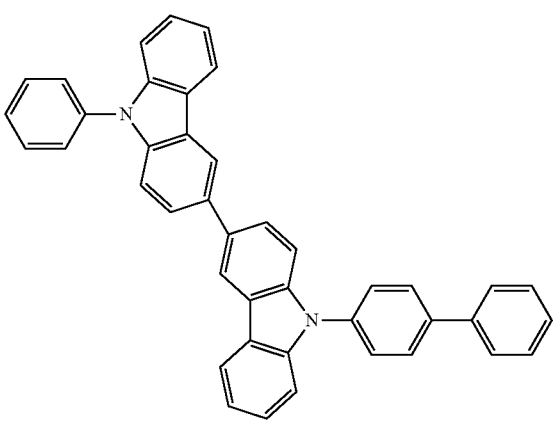
E-2-15
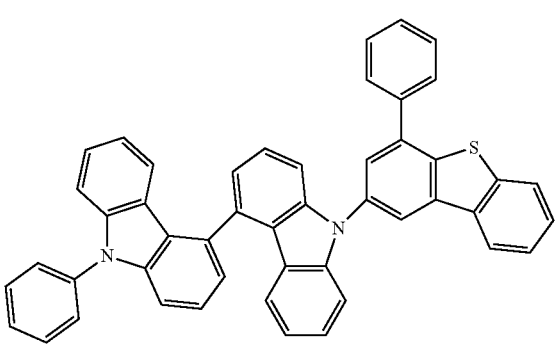

E-2-16
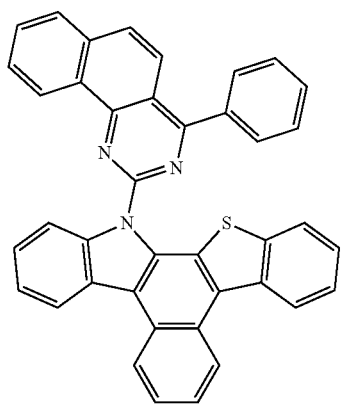
E-2-17
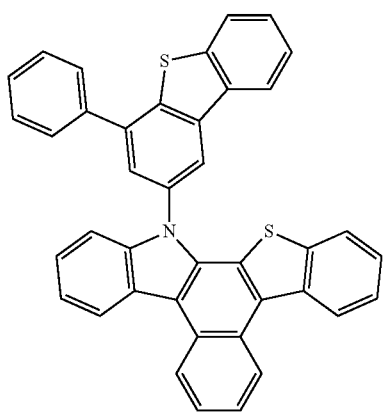
E-2-18
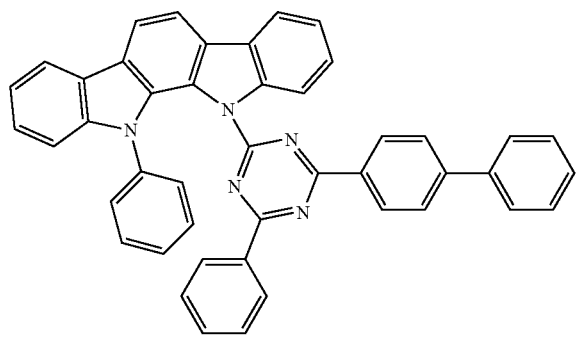
E-2-19
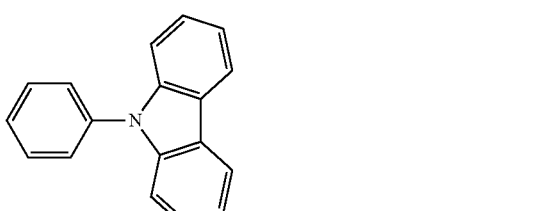
E-2-20
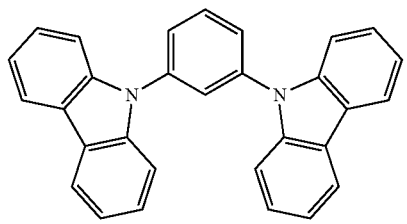
E-2-21
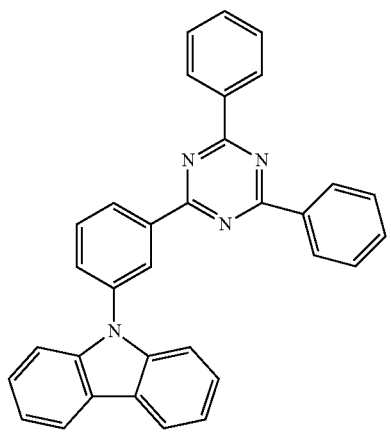
E-2-22
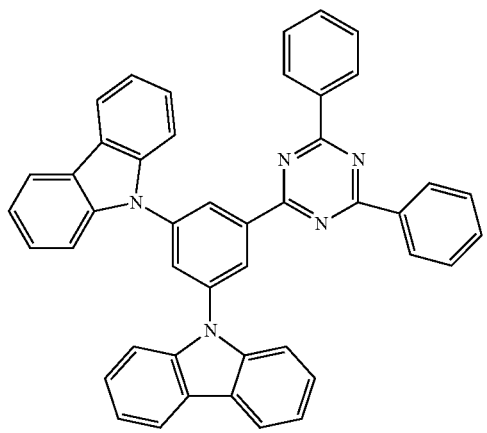
E-2-23
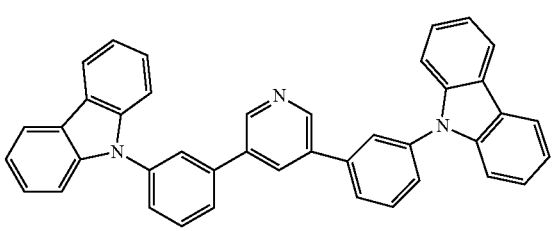

E-2-24

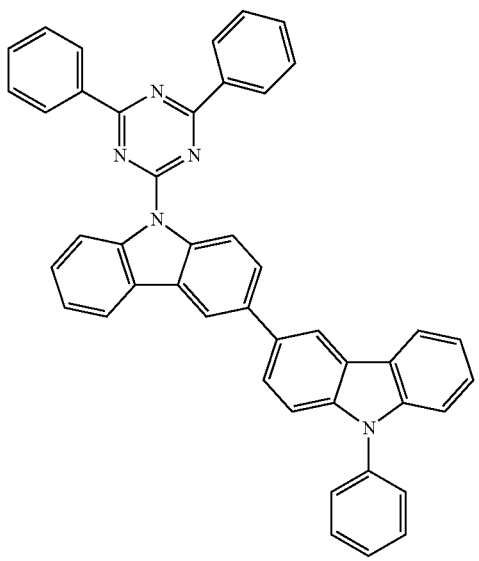

The emission layer EML may further include a common material generally used/generally available in the art as a host material. For example, the emission layer EML may include as a host material, at least one of bis (4-(9H-carbazol-9-yl) phenyl) diphenylsilane (BCPDS), (4-(1-(4-(diphenylamino) phenyl) cyclohexyl) phenyl) diphenylphosphine oxide (POPCPA), bis[2-(diphenylphosphino) phenyl] ether oxide (DPEPO), 4,4'-bis(carbazol-9-yl) biphenyl (CBP), 1,3-bis(carbazol-9-yl)benzene (mCP), 2,8-bis(diphenyl phosphoryl)dibenzo[b,d]furan (PPF), 4,4',4"-tris(carbazol-9-yl)-triphenylamine (TCTA), or 1,3,5-tris(1-phenyl-1H-benzo[d]imidazole-2-yl)benzene (TPBi). However, an embodiment of the present disclosure is not limited thereto. For example, tris(8-hydroxyquinolino)aluminum ($Alq_3$), 9,10-di(naphthalene-2-yl)anthracene (ADN), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclo-trisiloxane ($DPSiO_3$), octaphenylcyclotetra siloxane ($DPSiO_4$), etc. may be used as the host material.

The emission layer EML may include a compound represented by Formula M-a or Formula M-b. The compound represented by Formula M-a or Formula M-b may be used as a phosphorescence dopant material.

Formula M-a

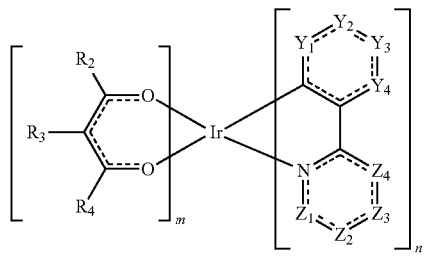

In Formula M-a, $Y_1$ to $Y_4$, and $Z_1$ to $Z_4$ may each independently be $CR_1$ or N, and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. In Formula M-a, "m" may be 0 or 1, and "n" may be 2 or 3. In Formula M-a, when "m" is 0, "n" is 3, and when "m" is 1, "n" is 2.

The compound represented by Formula M-a may be used as a phosphorescence dopant.

The compound represented by Formula M-a may be represented by any one selected from among Compounds M-a1 to M-a25. However, Compounds M-a1 to M-a25 are merely examples, and the compound represented by Formula M-a is not limited to the compounds represented by Compounds M-a1 to M-a25.

M-a1

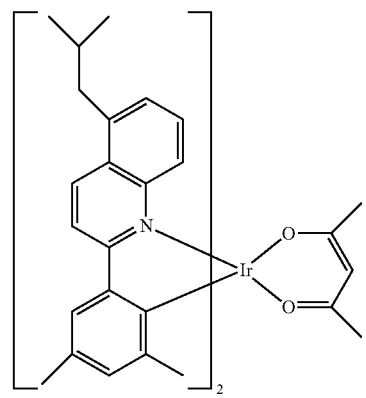

M-a2

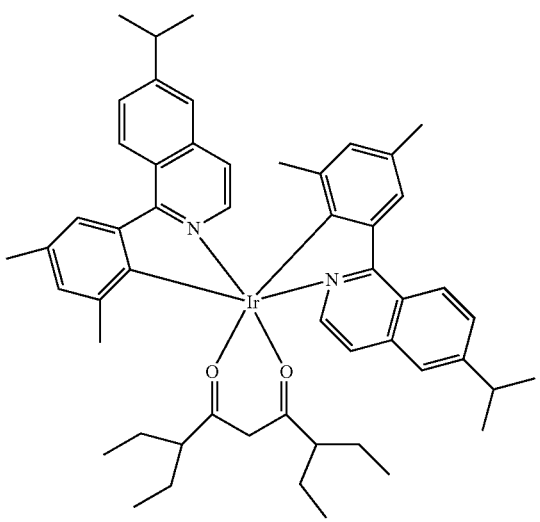

M-a3
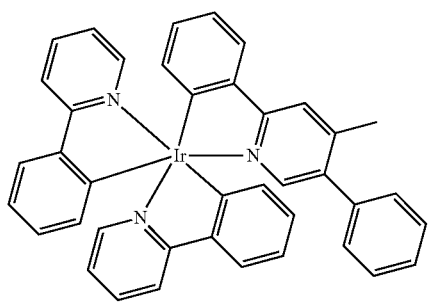
M-a4
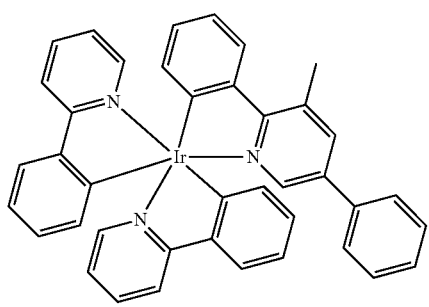
M-a5
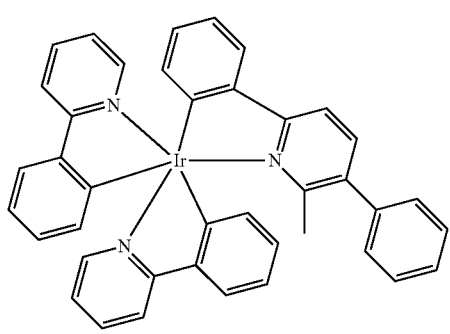
M-a6
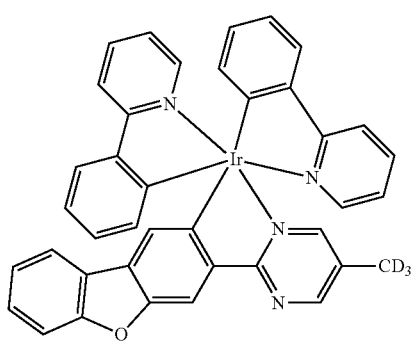
M-a7
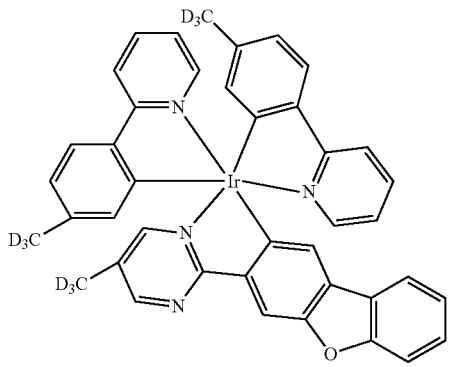
M-a8
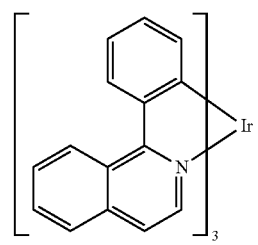
M-a9
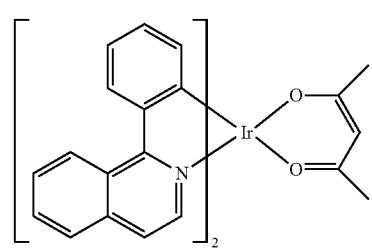
M-a10
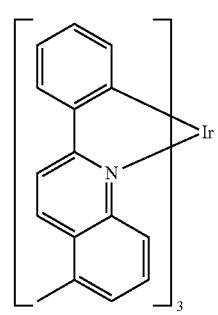
M-a11
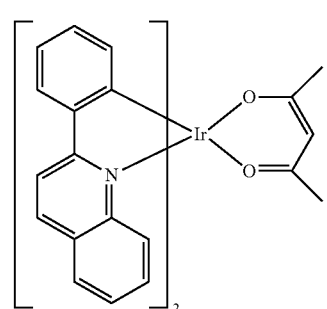
M-a12
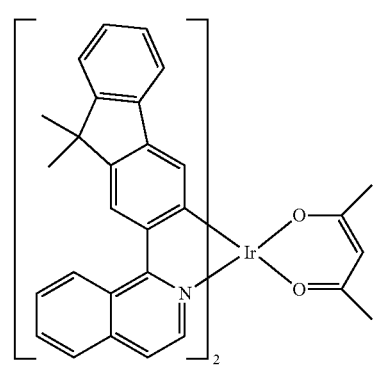

M-a13
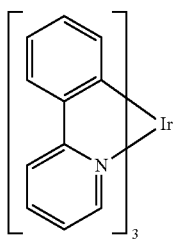
M-a14
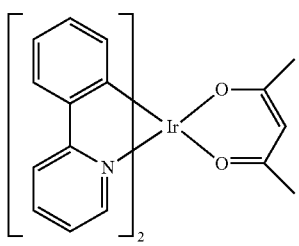
M-a15
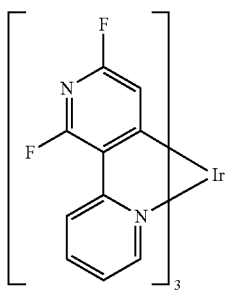
M-a16
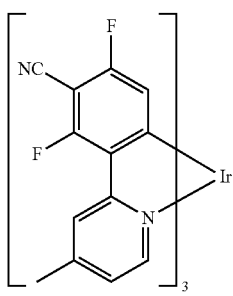
M-a17
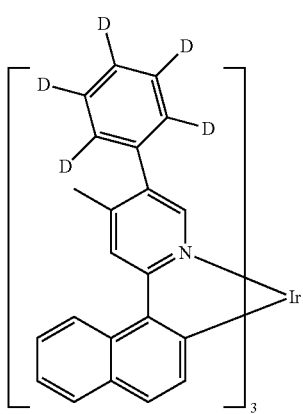
M-a18
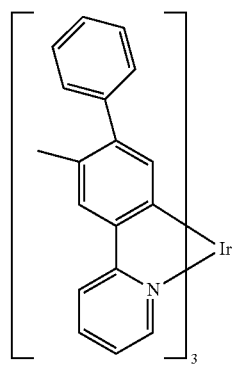
M-a19
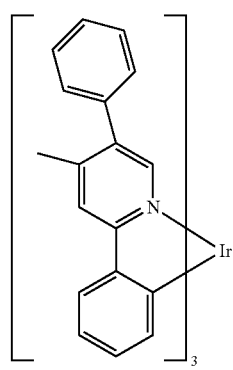
M-a20
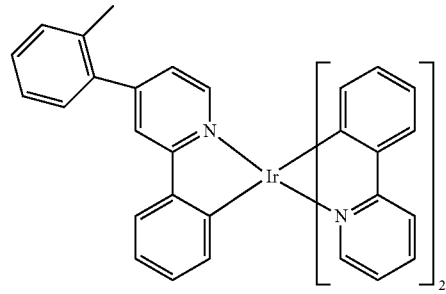
M-a21
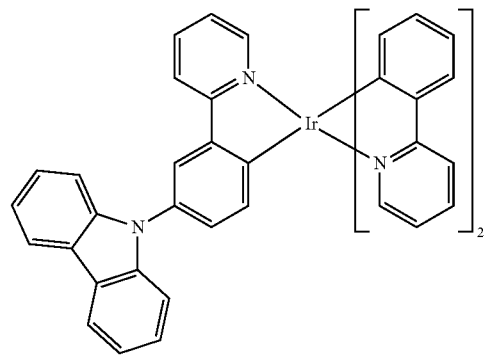

-continued

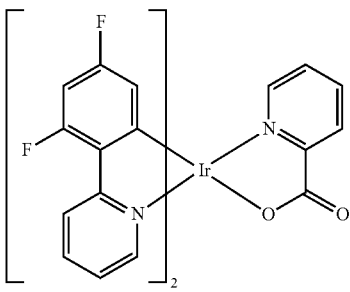
M-a22

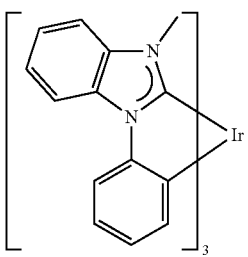
M-a23

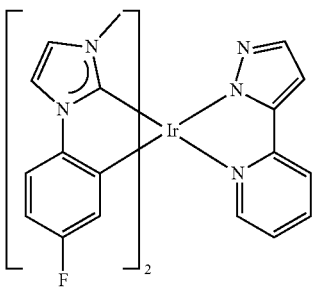
M-a24

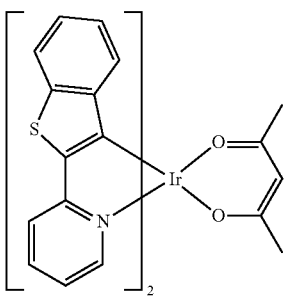
M-a25

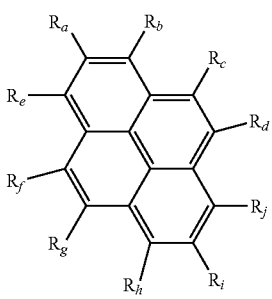

The emission layer EML may include any one selected from among Formula F-a to Formula F-c. The compounds represented by Formula F-a to Formula F-c may be used as fluorescence dopant materials.

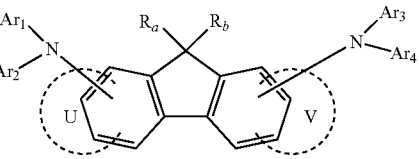

Formula F-a

In Formula F-a, two selected from $R_a$ to $R_j$ may each independently be substituted with *—$NAr_1Ar_2$. The remainder not substituted with *—$NAr_1Ar_2$ selected from among $R_a$ to $R_j$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In *—$NAr_1Ar_2$, $Ar_1$ and $Ar_2$ may each independently be a substituted or unsubstituted aryl group of 6 to 30 ring-forming carbon atoms, or a substituted or unsubstituted heteroaryl group of 2 to 30 ring-forming carbon atoms. For example, at least one selected from among $Ar_1$ and $Ar_2$ may be a heteroaryl group including O or S as a ring-forming atom.

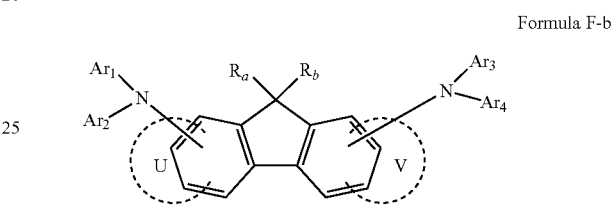

Formula F-b

In Formula F-b, $R_a$ and $R_b$ may each independently be a hydrogen atom, a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In Formula F-b, U and V may each independently be a substituted or unsubstituted hydrocarbon ring of 5 to 30 ring-forming carbon atoms, or a substituted or unsubstituted heterocycle of 2 to 30 ring-forming carbon atoms.

In Formula F-b, the number of rings represented by U and V may each independently be 0 or 1. For example, in Formula F-b, when the number of U or V is 1, one ring forms a fused ring at the designated part by U or V, and when the number of U or V is 0, a ring is not present at the designated part by U or V. For example, when the number of U is 0, and the number of V is 1, or when the number of U is 1, and the number of V is 0, a fused ring having the fluorene core of Formula F-b may be a ring compound with four rings. In some embodiments, when the number of both U and V is 0, the fused ring of Formula F-b may be a ring compound with three rings. In some embodiments, when the number of both U and V is 1, a fused ring having the fluorene core of Formula F-b may be a ring compound with five rings.

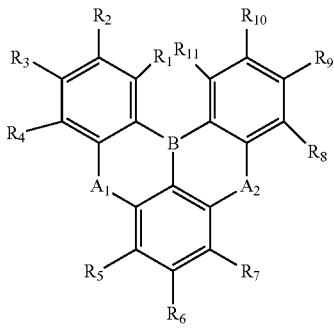

Formula F-c

In Formula F-c, $A_1$ and $A_2$ may each independently be O, S, Se, or $NR_m$, and $R_m$ may be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring.

In Formula F-c, $A_1$ and $A_2$ may each independently be combined with the substituents of an adjacent ring to form a fused ring. For example, when $A_1$ and $A_2$ may each independently be $NR_m$, $A_1$ may be combined with $R_4$ or $R_5$ to form a ring. In some embodiments, $A_2$ may be combined with $R_7$ or $R_8$ to form a ring.

In an embodiment, the emission layer EML may include as a known dopant material, styryl derivatives (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl) naphthalen-2-yl)vinyl)phenyl)-N-phenylbenzenamine (N-BDAVBi), and 4,4'-bis[2-(4-(N,N-diphenylamino)phenyl)vinyl]biphenyl (DPAVBi)), perylene and the derivatives thereof (for example, 2,5,8,11-tetra-t-butylperylene (TBP)), pyrene and the derivatives thereof (for example, 1,1-dipyrene, 1,4-dipyrenylbenzene, and 1,4-bis(N,N-diphenylamino)pyrene), etc.

The EML may include a known phosphorescence dopant material. For example, the phosphorescence dopant may use a metal complex including iridium (Ir), platinum (Pt), osmium (Os), gold (Au), titanium (Ti), zirconium (Zr), hafnium (Hf), europium (Eu), terbium (Tb) or thulium (Tm). Particularly, iridium(III) bis(4,6-difluorophenylpyridinato-N,C2') (Flrpic), bis(2,4-difluorophenylpyridinato)-tetrakis (1-pyrazolyl)borate iridium(III) (Fir6), or platinum octaethyl porphyrin (PtOEP) may be used as the phosphorescence dopant. However, an embodiment of the present disclosure is not limited thereto.

The emission layer EML may include a quantum dot material. The core of the quantum dot may be selected from among a II-VI group compound, a III-VI group compound, a I-III-VI group compound, a III-V group compound, a III-II-V group compound, a IV-VI group compound, a IV group element, a IV group compound, and one or more combinations thereof.

The II-VI group compound may be selected from the group including (e.g., consisting of): a binary compound selected from the group including (e.g., consisting of) CdSe, CdTe, CdS, ZnS, ZnSe, ZnTe, ZnO, HgS, HgSe, HgTe, MgSe, MgS, and mixtures thereof; a ternary compound selected from the group including (e.g., consisting of) CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and a quaternary compound selected from the group including (e.g., consisting of) HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The III-VI group compound may include a binary compound such as $In_2S_3$, and $In_2Se_3$, a ternary compound such as $InGaS_3$, and/or $InGaSe_3$, or one or more combinations thereof.

The I-III-VI group compound may be selected from a ternary compound selected from the group including (e.g., consisting of) AgInS, $AgInS_2$, CuInS, $CuInS_2$, $AgGaS_2$, $CuGaS_2$, $CuGaO_2$, $AgGaO_2$, $AgAlO_2$ and mixtures thereof, or a quaternary compound such as $AgInGaS_2$, and/or $CuInGaS_2$.

The III-V group compound may be selected from the group including (e.g., consisting of) a binary compound selected from the group including (e.g., consisting of) GaN, GaP, GaAs, GaSb, AlN, AlP, AlAs, AlSb, InN, InP, InAs, InSb, and mixtures thereof, a ternary compound selected from the group including (e.g., consisting of) GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof, and a quaternary compound selected from the group including (e.g., consisting of) GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. In some embodiments, the III-V group compound may further include a II group metal. For example, InZnP, etc. may be selected as a III-II-V group compound.

The IV-VI group compound may be selected from the group including (e.g., consisting of) a binary compound selected from the group including (e.g., consisting of) SnS, SnSe, SnTe, PbS, PbSe, PbTe, and mixtures thereof, a ternary compound selected from the group including (e.g., consisting of) SnSeS, SnSeTe, SnSTe, PbSeS, PbSeTe, PbSTe, SnPbS, SnPbSe, SnPbTe, and mixtures thereof, and a quaternary compound selected from the group including (e.g., consisting of) SnPbSSe, SnPbSeTe, SnPbSTe, and mixtures thereof. The IV group element may be selected from the group including (e.g., consisting of) Si, Ge, and a mixture thereof. The IV group compound may be a binary compound selected from the group including (e.g., consisting of) SiC, SiGe, and a mixture thereof.

In this embodiment, the binary compound, the ternary compound or the quaternary compound may be present at a substantially uniform concentration in a particle (particle form) or may be present at a partially different concentration distribution state in the same particle. In some embodiments, a core/shell structure in which one quantum dot wraps (surrounds) another quantum dot may be possible. The interface of the core and the shell may have a concentration gradient in which the concentration of an element present in the shell is decreased toward the center.

In some embodiments, the quantum dot may have the above-described core-shell structure including a core including a nanocrystal and a shell wrapping (surrounding) the core. The shell of the quantum dot may play the role of a protection layer for preventing (or reducing) the chemical deformation of the core to maintain semiconductor properties and/or a charging layer for imparting the quantum dot with electrophoretic properties. The shell may have a single layer or a multilayer. Examples of the shell of the quantum dot may include a metal or non-metal oxide, a semiconductor compound, or one or more combinations thereof.

For example, the metal or non-metal oxide may include a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$ and/or $NiO$, or a ternary compound such as $MgAl_2O_4$, $CoFe_2O_4$, $NiFe_2O_4$ and/or $CoMn_2O_4$, but an embodiment of the present disclosure is not limited thereto.

In some embodiments, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but an embodiment of the present disclosure is not limited thereto.

The quantum dot may have a full width of half maximum (FWHM) of emission wavelength spectrum of about 45 nm or less, about 40 nm or less or about 30 nm or less. Within these ranges, color purity or color reproducibility may be improved (increased). In some embodiments, light emitted via such a quantum dot is emitted in all directions, and light view angle properties may be improved (increased).

In some embodiments, the shape of the quantum dot may be generally used shapes in the art, without limitation. For example, substantially spherical, pyramidal, multi-arm, or cubic nanoparticle, nanotube, nanowire, nanofiber, nanoplate particle, etc. shapes may be used.

The quantum dot may control the color of light emitted according to the particle size, and accordingly, the quantum dot may have one or more suitable emission colors such as blue, red and/or green.

In the light emitting elements ED of embodiments, as shown in FIG. 3 to FIG. 6, the electron transport region ETR is provided on the emission layer EML. The electron transport region ETR may include at least one of a hole blocking layer HBL, an electron transport layer ETL or an electron injection layer EIL. However, an embodiment of the present disclosure is not limited thereto.

The electron transport region ETR may have a single layer formed using a single material, a single layer formed using multiple different materials, or a multilayer structure having multiple layers formed using multiple different materials.

For example, the electron transport region ETR may have a single layer structure of an electron injection layer EIL or an electron transport layer ETL, or a single layer structure formed using an electron injection material and an electron transport material. In some embodiments, the electron transport region ETR may have a single layer structure formed using multiple different materials, or a structure stacked from the emission layer EML of electron transport layer ETL/electron injection layer EIL, or hole blocking layer HBL/electron transport layer ETL/electron injection layer EIL, without limitation. The thickness of the electron transport region ETR may be, for example, from about 1,000 Å to about 1,500 Å.

The electron transport region ETR may be formed using one or more suitable methods such as a vacuum deposition method, a spin coating method, a cast method, a Langmuir-Blodgett (LB) method, an inkjet printing method, a laser printing method, and/or a laser induced thermal imaging (LITI) method.

The electron transport region ETR may include a compound represented by Formula ET-1.

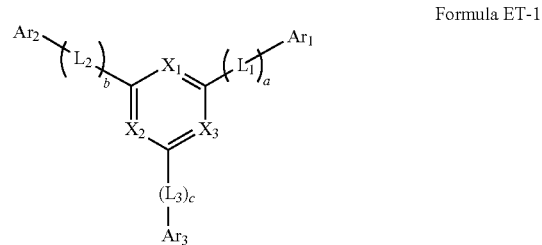

Formula ET-1

In Formula ET-1, at least one selected from among $X_1$ to $X_3$ may be N, and the remainder (substituents that not N) are $CR_a$. $R_a$ may be a hydrogen atom, a deuterium atom, a substituted or unsubstituted alkyl of 1 to 20 carbon atoms, a substituted or unsubstituted aryl group of 6 to 30 ring-forming carbon atoms, or a substituted or unsubstituted heteroaryl group of 2 to 30 ring-forming carbon atoms. $Ar_1$ to $Ar_3$ may each independently be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula ET-1, "a" to "c" may each independently be an integer from 0 to 10. In Formula ET-1, "$L_1$" to "$L_3$" may each independently be a direct linkage, a substituted or unsubstituted arylene group of 6 to 30 ring-forming carbon atoms, or a substituted or unsubstituted heteroarylene group of 2 to 30 ring-forming carbon atoms. In some embodiments, when "a" to "c" are integers of 2 or more, "$L_1$" to "$L_3$" may each independently be a substituted or unsubstituted arylene group of 6 to 30 ring-forming carbon atoms, or a substituted or unsubstituted heteroarylene group of 2 to 30 ring-forming carbon atoms.

The electron transport region ETR may include an anthracene-based compound. However, an embodiment of the present disclosure is not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate (Bebq$_2$), 9,10-di(naphthalene-2-yl)anthracene (ADN), 1,3-bis[3,5-di(pyridin-3-yl)phenyl]benzene (BmPyPhB), and/or one or more mixtures thereof, without limitation.

The electron transport region ETR may include at least one selected from among Compounds ET1 to ET36.

ET1
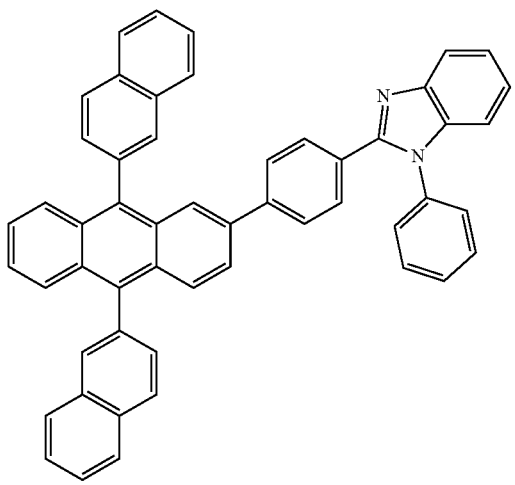
ET2
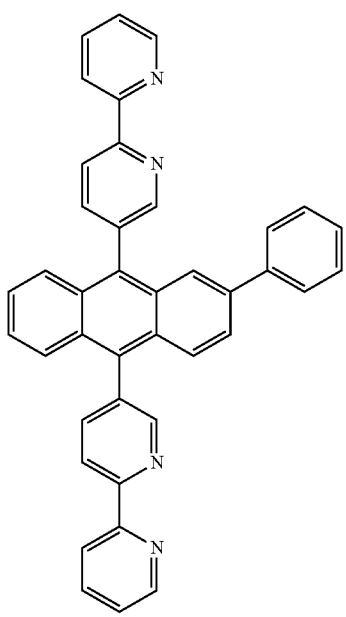
ET3
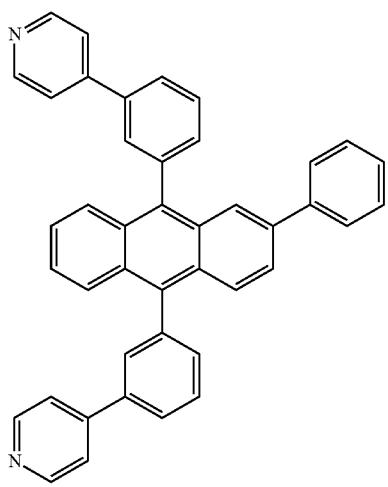
ET4
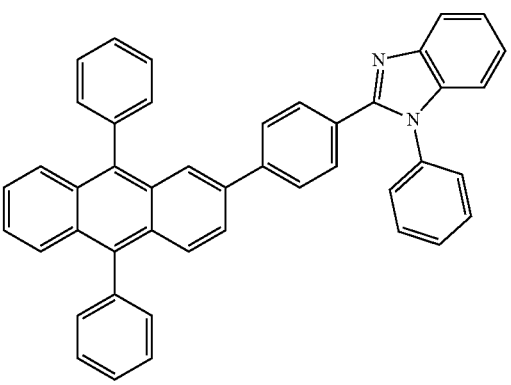
ET5
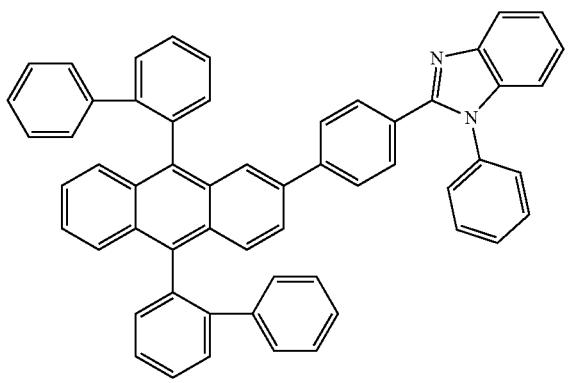
ET6
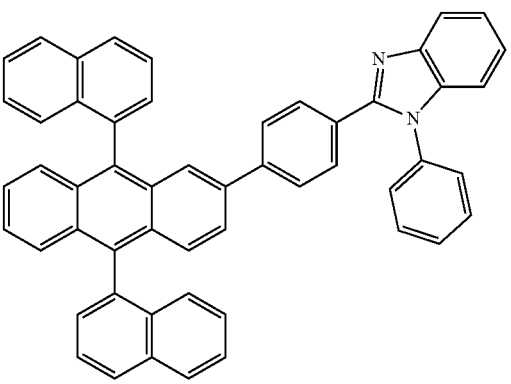

ET10
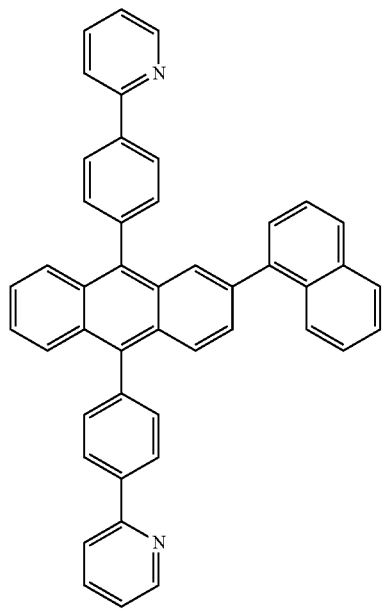
ET13
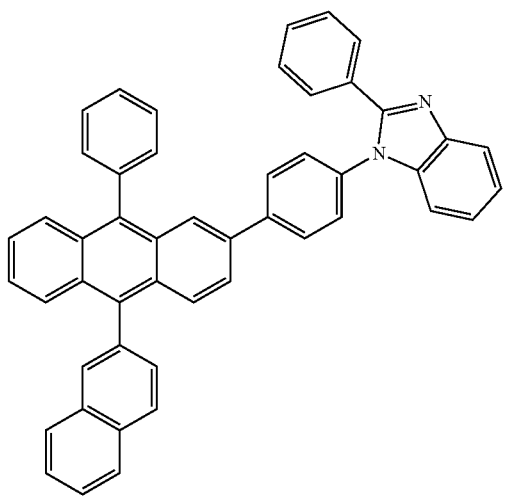
ET11
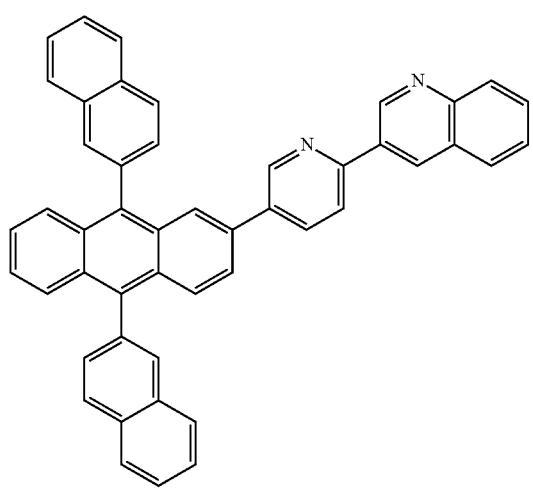
ET14
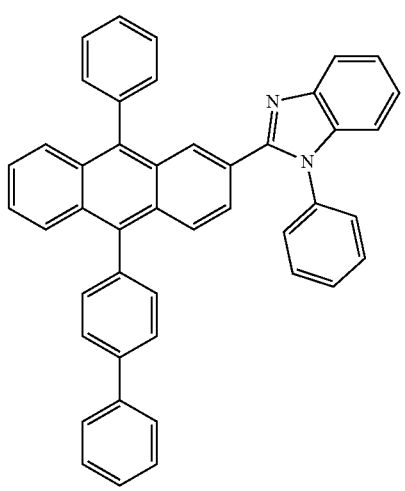
ET12
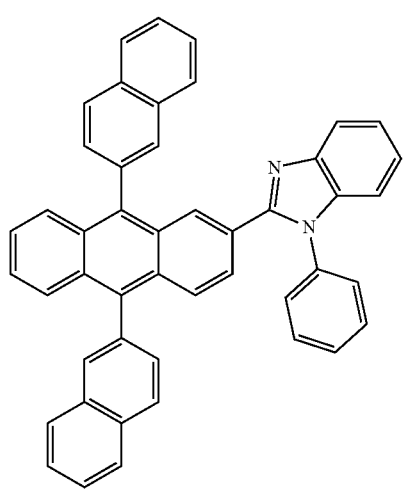
ET15
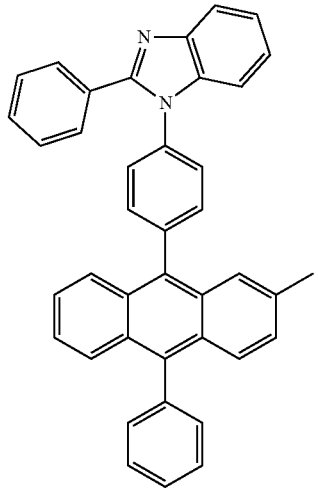

ET16
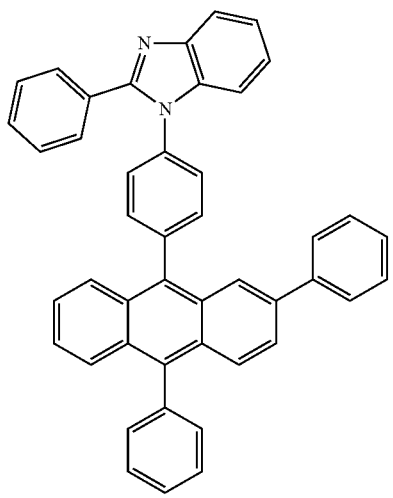
ET17
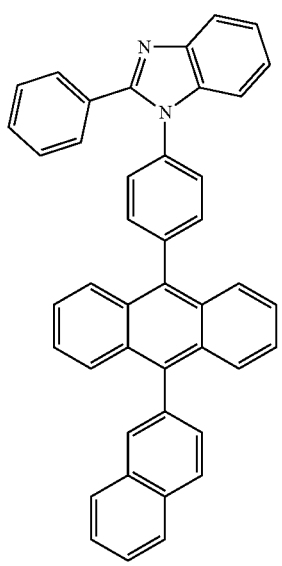
ET18
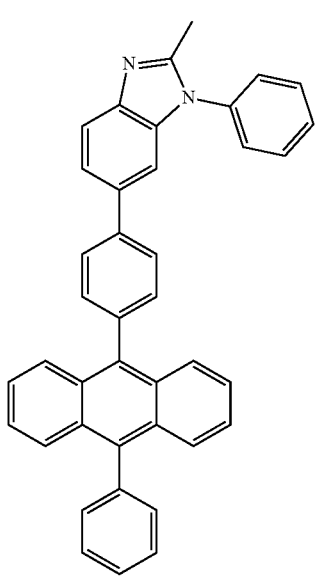
ET19
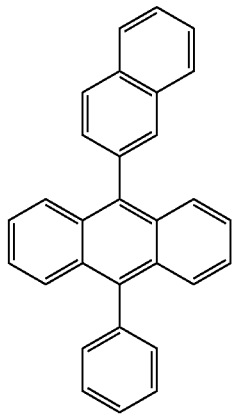
ET20
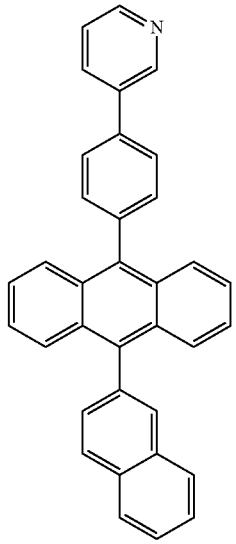
ET21
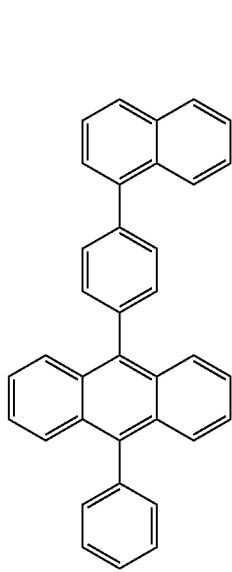

ET22
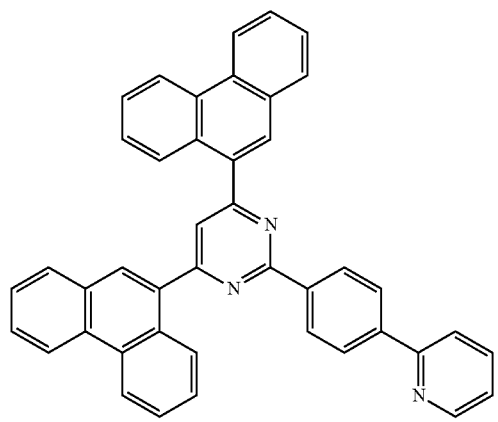
ET23
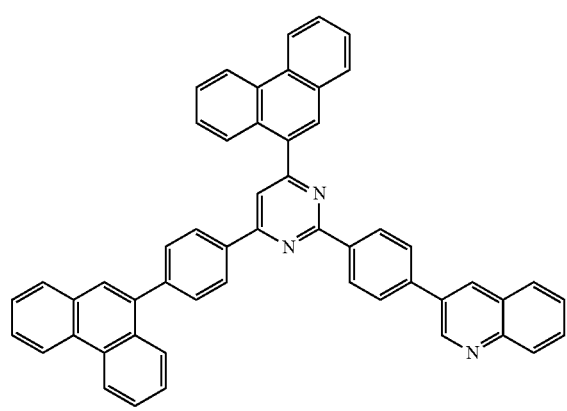
ET24
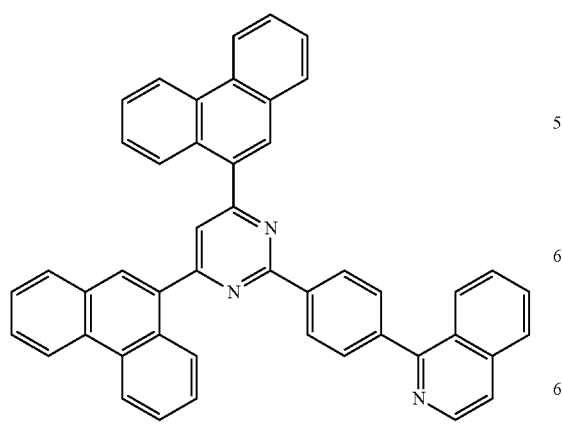
ET25
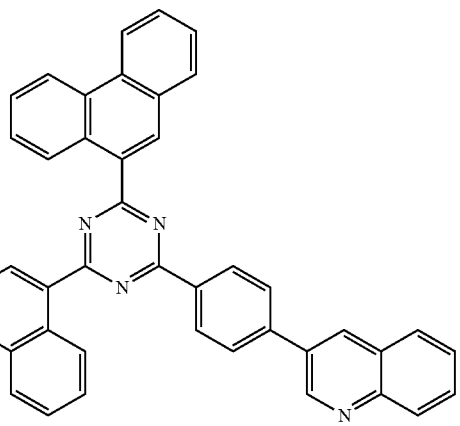
ET26
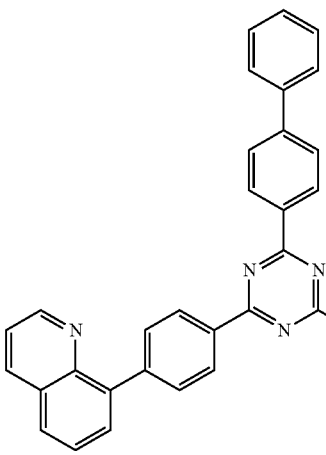
ET27
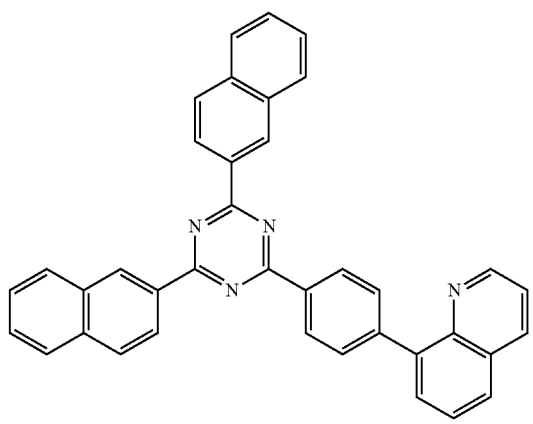

ET28
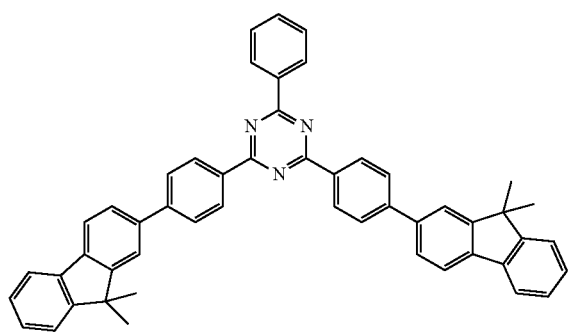
ET29
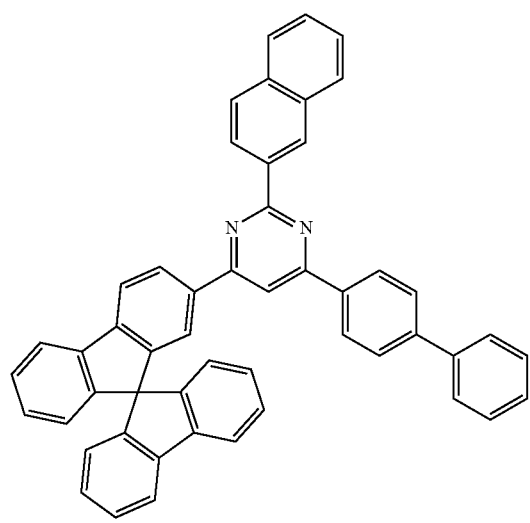
ET30
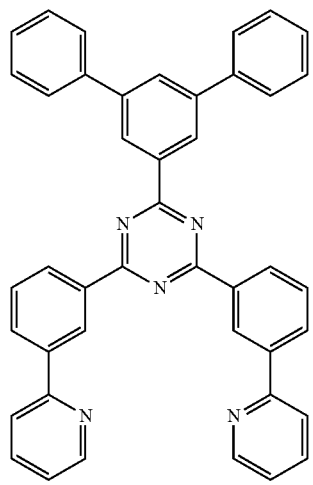
ET31
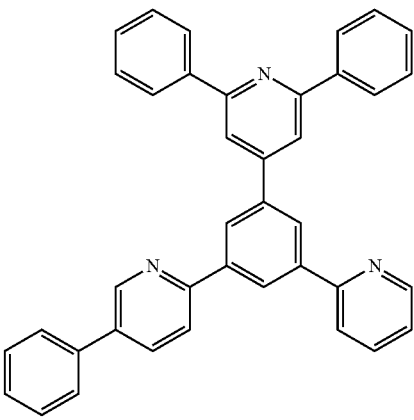
ET32
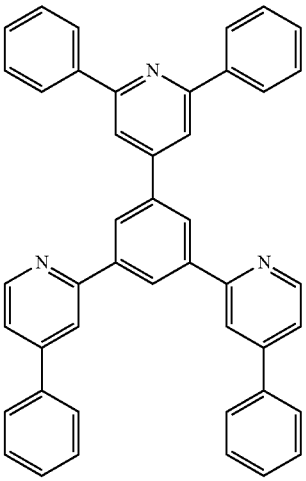
ET33
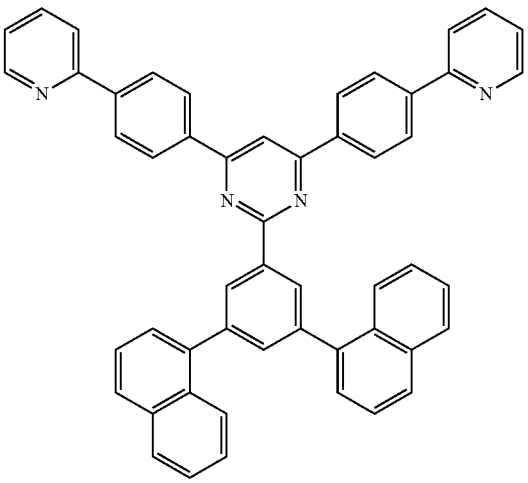

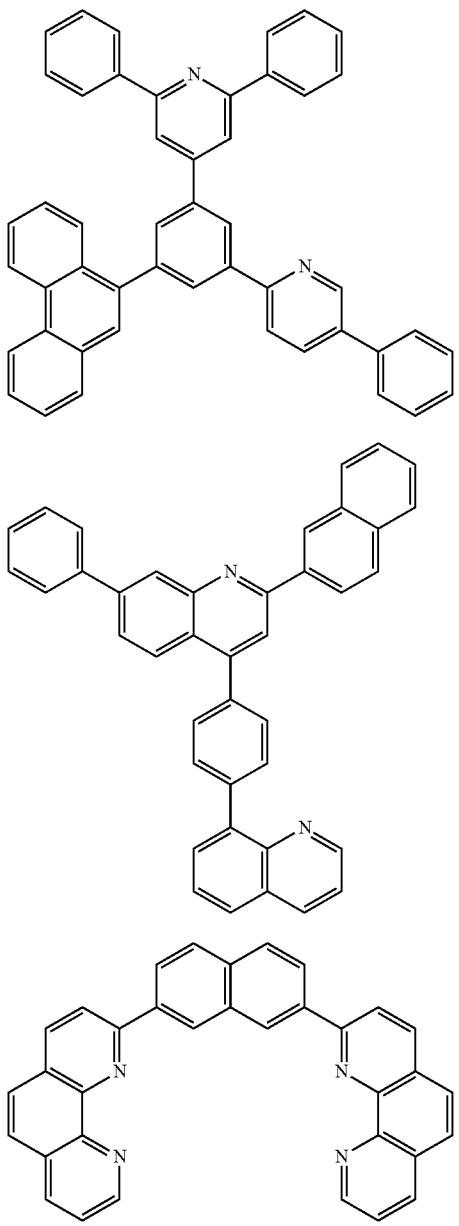

In some embodiments, the electron transport region ETR may include a metal halide such as LiF, NaCl, CsF, RbCl, RbI, CuI and/or KI, a metal in lanthanoides such as Yb, or a co-depositing material of the metal halide and the metal in lanthanoides. For example, the electron transport region ETR may include KI:Yb, RbI:Yb, LiF:Yb, etc., as the co-depositing material. In some embodiments, the electron transport region ER may use a metal oxide such as $Li_2O$ and BaO, or 8-hydroxy-lithium quinolate (Liq). However, an embodiment of the present disclosure is not limited thereto. The electron transport region ETR also may be formed using a mixture material of an electron transport material and an insulating organo metal salt. The organo metal salt may be a material having an energy band gap of about 4 eV or more. For example, the organo metal salt may include, for example, metal acetates, metal benzoates, metal acetoacetates, metal acetylacetonates, or metal stearates.

The electron transport region ETR may include at least one of 2,9-dimethyl-4,7-diphenyl-1,10-phenanthroline (BCP), diphenyl(4-(triphenylsilyl)phenyl)phosphine oxide (TSPO1) or 4,7-diphenyl-1,10-phenanthroline (Bphen) in addition to the aforementioned materials. However, an embodiment of the present disclosure is not limited thereto.

The electron transport region ETR may include the compounds of the electron transport region in at least one selected from among an electron injection layer EIL, an electron transport layer ETL, and a hole blocking layer HBL.

When the electron transport region ETR includes the electron transport layer ETL, the thickness of the electron transport layer ETL may be from about 100 Å to about 1,000 Å, for example, from about 150 Å to about 500 Å. When the thickness of the electron transport layer ETL satisfies the above-described range, satisfactory (suitable) electron transport properties may be obtained without substantial increase of a driving voltage. When the electron transport region ETR includes the electron injection layer EIL, the thickness of the electron injection layer EIL may be from about 1 Å to about 100 Å, or from about 3 Å to about 90 Å. When the thickness of the electron injection layer EIL satisfies the above described range, satisfactory (suitable) electron injection properties may be obtained without inducing substantial increase of a driving voltage.

The second electrode EL2 may be provided on the electron transport region ETR. The second electrode EL2 may be a common electrode. The second electrode EL2 may be a cathode or an anode, but an embodiment of the present disclosure is not limited thereto. For example, when the first electrode EL1 is an anode, the second cathode EL2 may be a cathode, and when the first electrode EL1 is a cathode, the second electrode EL2 may be an anode.

The second electrode EL2 may be a transmissive electrode, a transflective electrode or a reflective electrode. When the second electrode EL2 is the transmissive electrode, the second electrode EL2 may include a transparent metal oxide, for example, ITO, IZO, ZnO, ITZO, etc.

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, or one or more compounds or mixtures thereof (for example, AgMg, AgYb, or MgAg). Or the second electrode EL2 may have a multilayered structure including a reflective layer or a transflective layer formed using the above-described materials and a transparent conductive layer formed using ITO, IZO, ZnO, ITZO, etc. For example, the second electrode EL2 may include the aforementioned metal materials, combinations of two or more metal materials selected from the aforementioned metal materials, and/or oxides of the aforementioned metal materials.

The second electrode EL2 may be connected with an auxiliary electrode. When the second electrode EL2 is connected with the auxiliary electrode, the resistance of the second electrode EL2 may decrease.

In some embodiments, on the second electrode EL2 in the light emitting element ED, a capping layer CPL may be further disposed. The capping layer CPL may include a multilayer or a single layer.

In an embodiment, the capping layer CPL may be an organic layer or an inorganic layer. For example, when the capping layer CPL includes an inorganic material, the inorganic material may include an alkali metal compound such as LiF, an alkaline earth metal compound such as $MgF_2$, SiON, SiNx, SiOy, etc.

For example, when the capping layer CPL includes an organic material, the organic material may include α-NPD, NPB, TPD, m-MTDATA, Alq$_3$, CuPc, N4,N4,N4',N4'-tetra (biphenyl-4-yl) biphenyl-4,4'-diamine (TPD15), 4,4',4"-tris (carbazol sol-9-yl) triphenylamine (TCTA), etc., or may include an epoxy resin, or acrylate such as methacrylate. In some embodiments, a capping layer CPL may include at least one selected from among Compounds P1 to P5, but an embodiment of the present disclosure is not limited thereto.

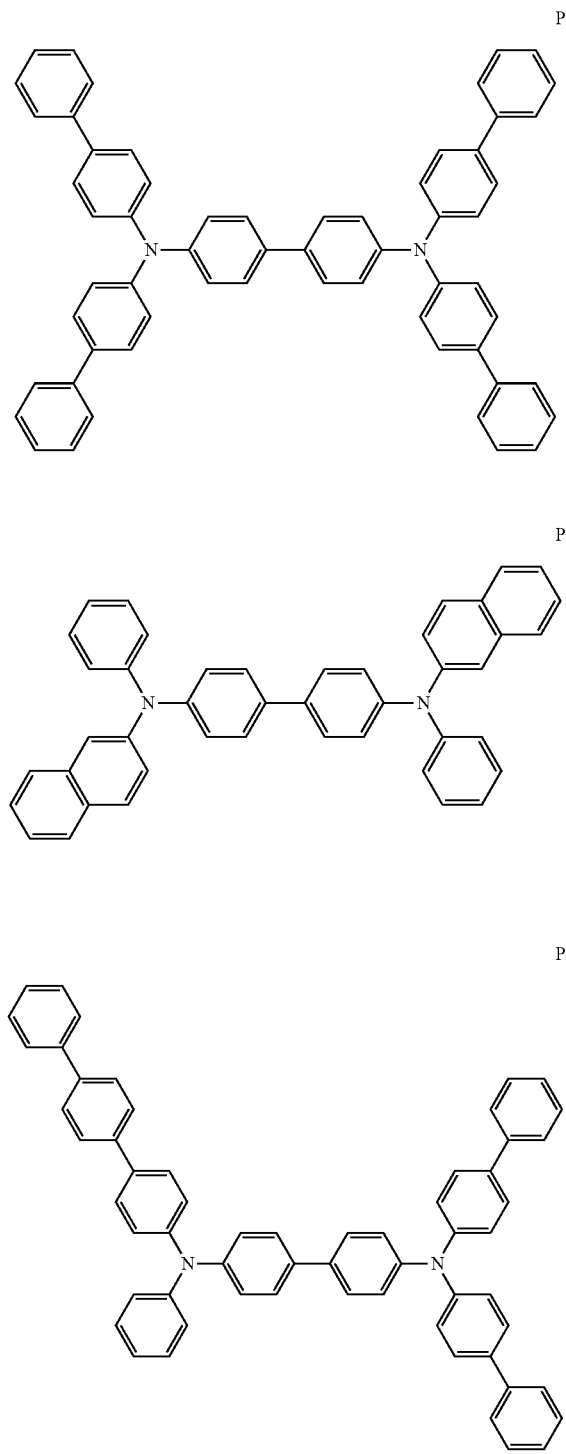

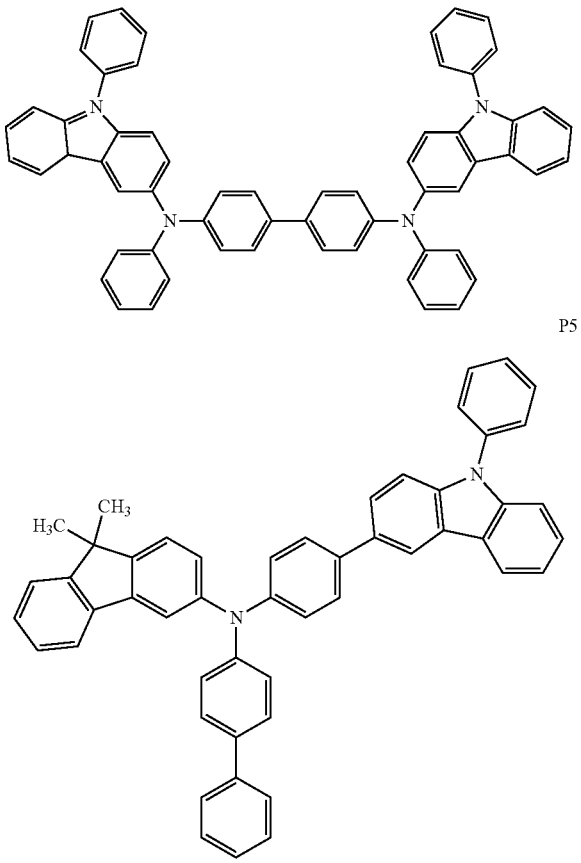

In some embodiments, the refractive index of the capping layer CPL may be about 1.6 or more. For example, the refractive index of the capping layer CPL with respect to light in a wavelength range of about 550 nm to about 660 nm may be about 1.6 or more.

Figure 7:
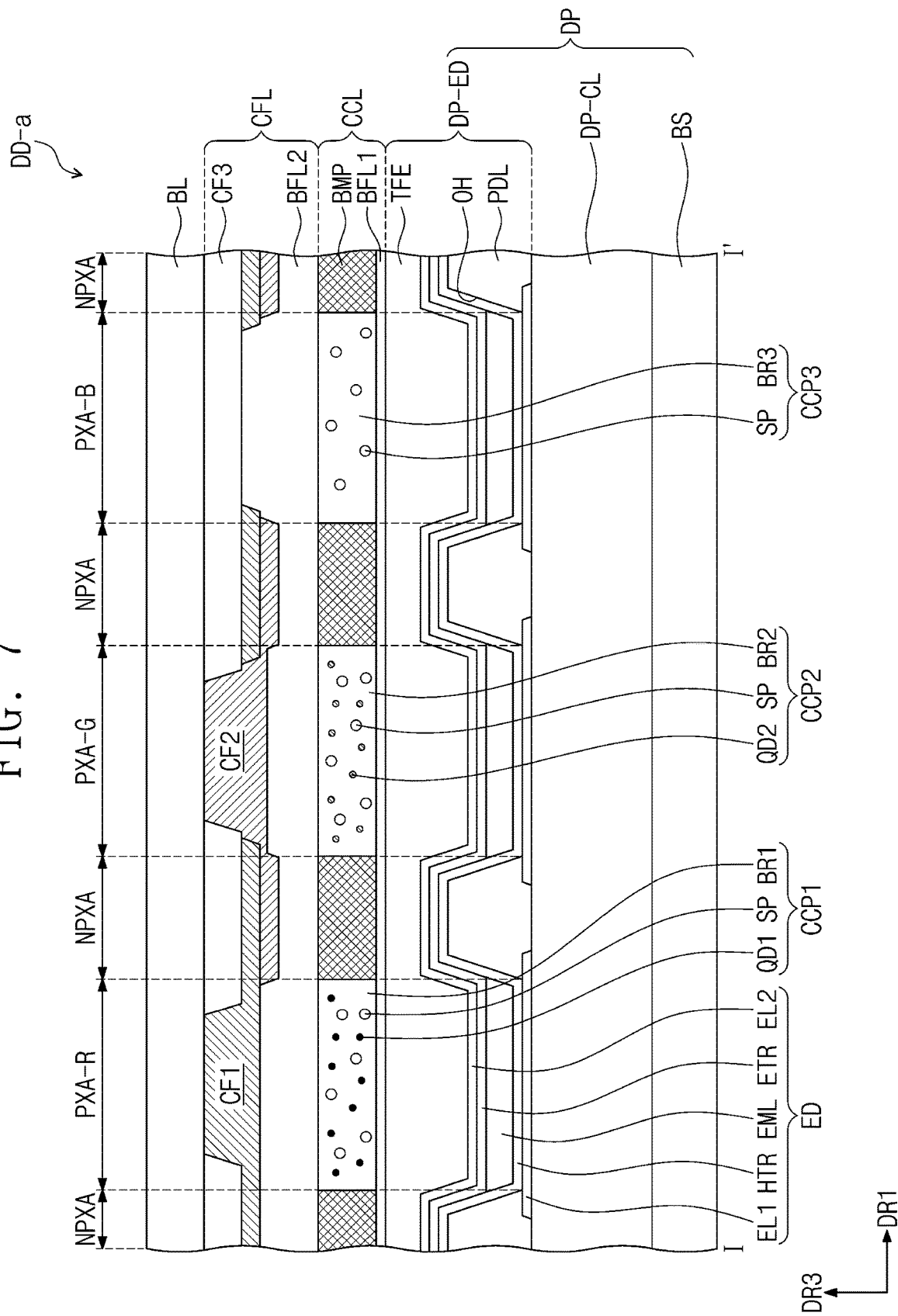
FIG. 7 is a cross-sectional view of a display apparatus according to an embodiment.
Figure 8:
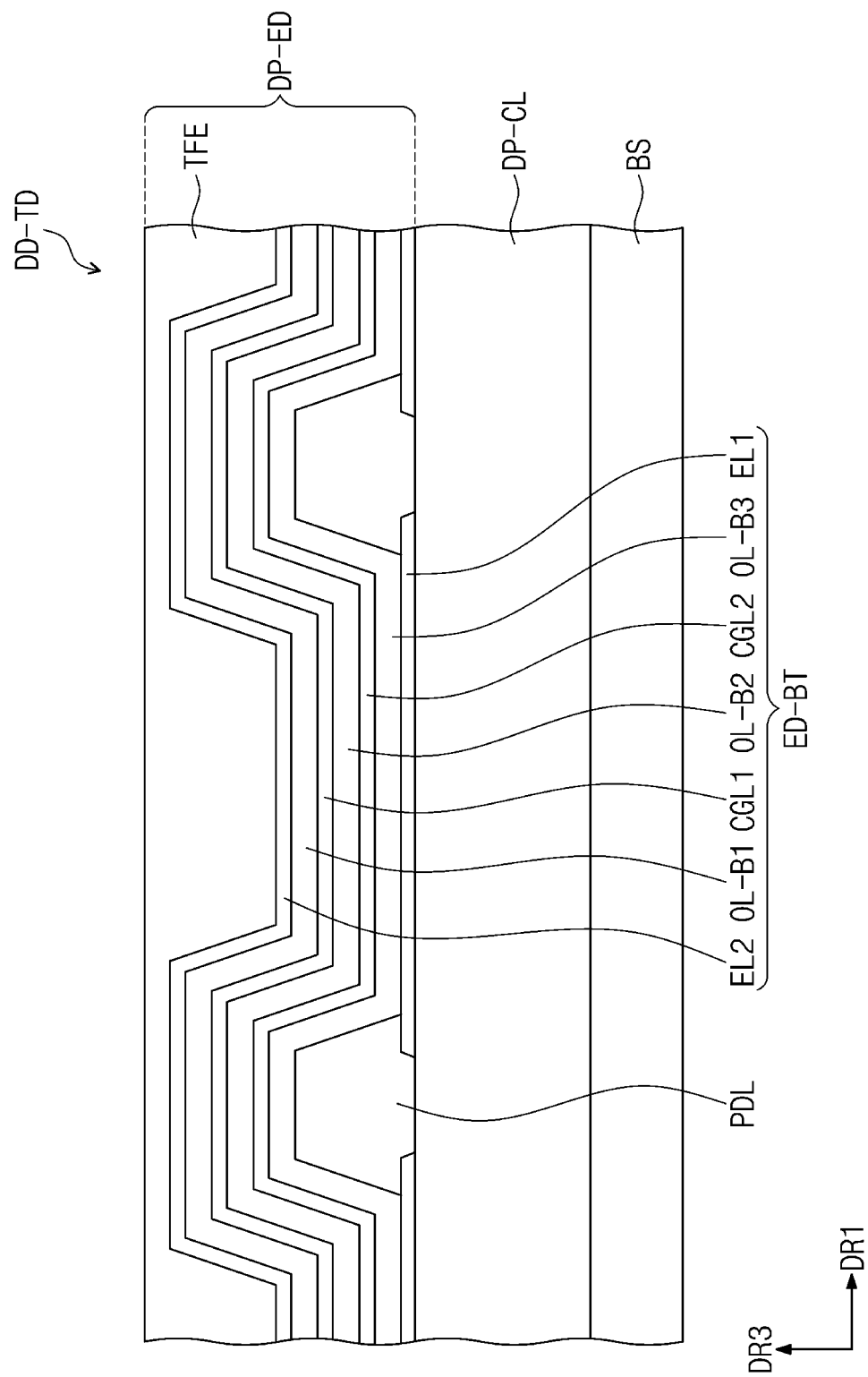
FIG. 8 is a cross-sectional view of a display apparatus according to an embodiment.

FIG. 7 and FIG. 8 are cross-sectional views on display apparatuses according to embodiments. In describing the display apparatuses of embodiments with reference to FIG. 7 and FIG. 8, the duplicated features which have been described in FIG. 1 to FIG. 6 may not be described again, but their differences will be mainly described.

Referring to FIG. 7, a display apparatus DD-a according to an embodiment may include a display panel DP including a display device layer DP-ED, a light controlling layer CCL on the display panel DP, and a color filter layer CFL.

In an embodiment shown in FIG. 7, the display panel DP includes a base layer BS, a circuit layer DP-CL provided on the base layer BS and a display device layer DP-ED, and the display device layer DP-ED may include a light emitting element ED.

The light emitting element ED may include a first electrode EL1, a hole transport region HTR on the first electrode EL1, an emission layer EML on the hole transport region HTR, an electron transport region ETR on the emission layer EML, and a second electrode EL2 on the electron transport region ETR. The same structures of the light emitting elements of FIG. 3 to FIG. 6 may be applied to the structure of the light emitting element ED shown in FIG. 7.

Referring to FIG. 7, the emission layer EML may be in an opening part OH defined in a pixel definition layer PDL. For example, the emission layer EML divided by the pixel definition layer PDL and correspondingly provided to each of luminous areas PXA-R, PXA-G and PXA-B may emit light in the same wavelength region. In the display apparatus DD-a of an embodiment, the emission layer EML may emit blue light. In some embodiments, the emission layer EML may be provided as a common layer for all luminous areas PXA-R, PXA-G and PXA-B.

The light controlling layer CCL may be on the display panel DP. The light controlling layer CCL may include a light converter. The light converter may be a quantum dot or a phosphor. The light converter may transform the wavelength of light provided and then emit. For example, the light controlling layer CCL may be a layer including a quantum dot or a layer including a phosphor.

The light controlling layer CCL may include multiple light controlling parts CCP1, CCP2 and CCP3. The light controlling parts CCP1, CCP2 and CCP3 may be separated from one another.

Referring to FIG. 7, a partition pattern BMP may be between the separated light controlling parts CCP1, CCP2 and CCP3, but an embodiment of the present disclosure is not limited thereto. In FIG. 8, the partition pattern BMP is shown not to overlap the light controlling parts CCP1, CCP2 and CCP3, but at least a portion of the edges of the light controlling parts CCP1, CCP2 and CCP3 may overlap the partition pattern BMP.

The light controlling layer CCL may include a first light controlling part CCP1 including a first quantum dot QD1 converting first color light provided from the light emitting element ED into second color light, a second light controlling part CCP2 including a second quantum dot QD2 converting first color light into third color light, and a third light controlling part CCP3 transmitting first color light.

In an embodiment, the first light controlling part CCP1 may provide red light which is the second color light, and the second light controlling part CCP2 may provide green light which is the third color light. The third color controlling part CCP3 may transmit and provide blue light which is the first color light provided from the light emitting element ED. For example, the first quantum dot QD1 may be a red quantum dot, and the second quantum dot QD2 may be a green quantum dot. Regarding the quantum dots QD1 and QD2, the same description used above may be applied.

In some embodiments, the light controlling layer CCL may further include a scatterer SP. The first light controlling part CCP1 may include the first quantum dot QD1 and the scatterer SP, the second light controlling part CCP2 may include the second quantum dot QD2 and the scatterer SP, and the third light controlling part CCP3 may not include (e.g., may exclude) a quantum dot but include the scatterer SP.

The scatterer SP may be an inorganic particle. For example, the scatterer SP may include at least one selected from among $TiO_2$, $ZnO$, $Al_2O_3$, $SiO_2$, and hollow silica. The scatterer SP may include at least one selected from among $TiO_2$, $ZnO$, $Al_2O_3$, $SiO_2$, and hollow silica, or may be a mixture of two or more materials selected selected from among $TiO_2$, $ZnO$, $Al_2O_3$, $SiO_2$, and hollow silica.

Each of the first light controlling part CCP1, the second light controlling part CCP2, and the third light controlling part CCP3 may include base resins BR1, BR2 and BR3 dispersing the quantum dots QD1 and QD2 and the scatterer SP. In an embodiment, the first light controlling part CCP1 may include the first quantum dot QD1 and the scatterer SP dispersed in the first base resin BR1, the second light controlling part CCP2 may include the second quantum dot QD2 and the scatterer SP dispersed in the second base resin BR2, and the third light controlling part CCP3 may include the scatterer particle SP dispersed in the third base resin BR3. The base resins BR1, BR2 and BR3 are mediums in which the quantum dots QD1 and QD2 and the scatterer SP are dispersed, and may be composed of one or more suitable resin compositions which may be generally referred to as a binder. For example, the base resins BR1, BR2 and BR3 may be acrylic resins, urethane-based resins, silicone-based resins, epoxy-based resins, etc. The base resins BR1, BR2 and BR3 may be transparent resins. In an embodiment, the first base resin BR1, the second base resin BR2 and the third base resin BR3 may be the same or different from each other.

The light controlling layer CCL may include a barrier layer BFL1. The barrier layer BFL1 may play the role of blocking (reducing) the penetration of moisture and/or oxygen (hereinafter, will be referred to as "humidity/oxygen"). The barrier layer BFL1 may be on the light controlling parts CCP1, CCP2 and CCP3 to block (reduce) the exposure of the light controlling parts CCP1, CCP2 and CCP3 to humidity/oxygen. In some embodiments, the barrier layer BFL1 may cover the light controlling parts CCP1, CCP2 and CCP3. In some embodiments, the barrier layer BFL2 may be provided between the light controlling parts CCP1, CCP2 and CCP3 and a color filter layer CFL.

The barrier layers BFL1 and BFL2 may include at least one inorganic layer. For example, the barrier layers BFL1 and BFL2 may be formed by including an inorganic material. For example, the barrier layers BFL1 and BFL2 may be formed by including silicon nitride, aluminum nitride, zirconium nitride, titanium nitride, hafnium nitride, tantalum nitride, silicon oxide, aluminum oxide, titanium oxide, tin oxide, cerium oxide and silicon oxynitride or a metal thin film securing light transmittance. In some embodiments, the barrier layers BFL1 and BFL2 may further include an organic layer. The barrier layers BFL1 and BFL2 may be composed of a single layer of multiple layers.

In the display apparatus DD-a of an embodiment, the color filter layer CFL may be on the light controlling layer CCL. For example, the color filter layer CFL may be directly on the light controlling layer CCL. In this embodiment, the barrier layer BFL2 may not be provided.

The color filter layer CFL may include a light blocking part (not shown) and filters CF1, CF2 and CF3. The color filter layer CFL may include a first filter CF1 transmitting second color light, a second filter CF2 transmitting third color light, and a third filter CF3 transmitting first color light. For example, the first filter CF1 may be a red filter, the second filter CF2 may be a green filter, and the third filter CF3 may be a blue filter. Each of the filters CF1, CF2 and CF3 may include a polymer photosensitive resin and a pigment or dye. The first filter CF1 may include a red pigment or dye, the second filter CF2 may include a green pigment or dye, and the third filter CF3 may include a blue pigment or dye. However, an embodiment of the present disclosure is not limited thereto, and the third filter CF3 may not include (e.g., may exclude) the pigment or dye. The third filter CF3 may include a polymer photosensitive resin and not include a pigment or dye. The third filter CF3 may be transparent. The third filter CF3 may be formed using a transparent photosensitive resin.

In some embodiments, the first filter CF1 and the second filter CF2 may be yellow filters. The first filter CF1 and the second filter CF2 may be provided in one body without distinction.

The light blocking part (not shown) may be a black matrix. The light blocking part (not shown) may be formed by including an organic light blocking material or an inorganic light blocking material including a black pigment or black dye. The light blocking part (not shown) may prevent (reduce) light leakage phenomenon and divide the boundaries among adjacent filters CF1, CF2 and CF3. In some embodiments, the light blocking part (not shown) may be formed as a blue filter.

Each of the first to third filters CF1, CF2 and CF3 may be disposed corresponding to each of a red luminous area PXA-R, green luminous area PXA-G, and blue luminous area PXA-B, respectively.

On the color filter layer CFL, a base substrate BL may be disposed. The base substrate BL may be a member providing a base surface on which the color filter layer CFL, the light controlling layer CCL, etc. are disposed. The base substrate BL may be a glass substrate, a metal substrate, a plastic substrate, etc. However, an embodiment of the present disclosure is not limited thereto, and the base substrate BL may be an inorganic layer, an organic layer or a composite material layer. In some embodiments, the base substrate BL may not be provided.

FIG. 8 is a cross-sectional view showing a portion of the display apparatus according to an embodiment. In FIG. 8, the cross-sectional view of a portion corresponding to the display panel DP in FIG. 7 is shown. In a display apparatus DD-TD of an embodiment, the light emitting element ED-BT may include multiple light emitting structures OL-B1, OL-B2 and OL-B3. The light emitting element ED-BT may include an oppositely disposed first electrode EL1 and second electrode EL2, and the multiple light emitting structures OL-B1, OL-B2 and OL-B3 stacked in order in a thickness direction and provided between the first electrode EL1 and the second electrode EL2. Each of the light emitting structures OL-B1, OL-B2 and OL-B3 may include an emission layer EML (FIG. 7), and a hole transport region HTR and an electron transport region ETR, disposed with the emission layer EML (FIG. 7) therebetween.

For example, the light emitting element ED-BT included in the display apparatus DD-TD of an embodiment may be a light emitting element of a tandem structure including multiple emission layers.

In an embodiment shown in FIG. 8, light emitted from the light emitting structures OL-B1, OL-B2 and OL-B3 may all be blue light. However, an embodiment of the present disclosure is not limited thereto, and the wavelength regions of light emitted from the light emitting structures OL-B1, OL-B2 and OL-B3 may be different from each other. For example, the light emitting element ED-BT including the multiple light emitting structures OL-B1, OL-B2 and OL-B3 emitting light in different wavelength regions may emit white light.

Between neighboring light emitting structures OL-B1, OL-B2 and OL-B3, charge generating layers CGL1 and CGL2 may be disposed. The charge generating layers CGL1 and CGL2 may include a p-type or kind charge generating layer and/or an n-type or kind charge generating layer.

Figure 9:
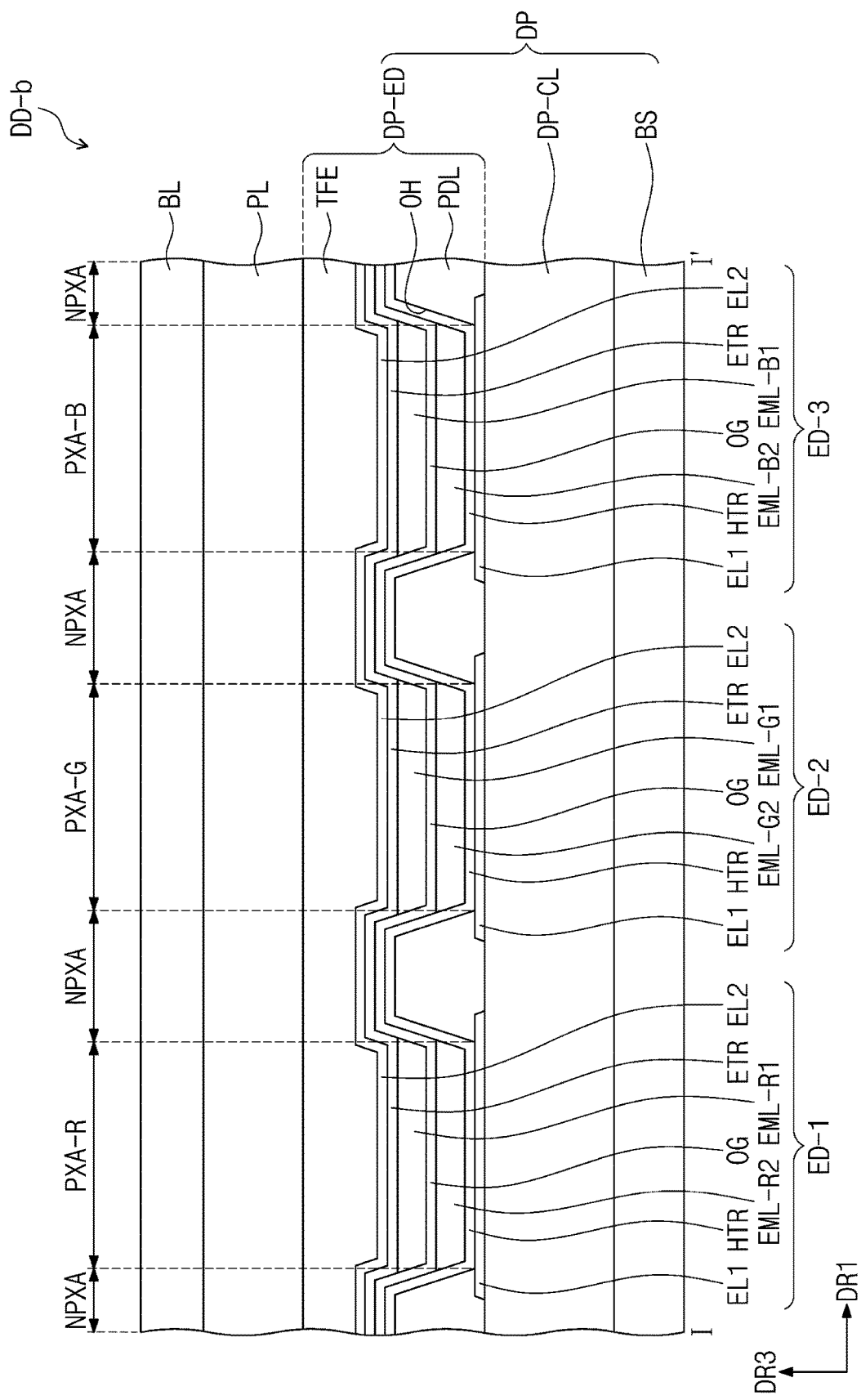
FIG. 9 is a cross-sectional view of a display apparatus according to an embodiment.

FIG. 9 is a cross-sectional view on a display apparatus according to an embodiment. Hereinafter, in the explanation on the display apparatus of an embodiment, referring to FIG. 9, duplicative features which were explained in reference to FIG. 1 to FIG. 6 may not be explained again, and different features will be primarily explained.

Referring to FIG. 9, different from the display apparatuses DD shown in FIG. 1 to FIG. 6, a display apparatus DD-b of an embodiment is different in that light emitting elements ED-1, ED-2 and ED-3, provided correspondingly to luminous areas PXA-R, PXA-G and PXA-B, respectively, each include multiple emission layers.

In an embodiment, the first to third light emitting elements ED-1, ED-2 and ED-3 respectively include first emission layers EML-R2, EML-G2 and EML-B2, and second emission layers EML-R1, EML-G1, and EML-B1, stacked in order (sequentially stacked) between the first electrode EL1 and the second electrode EL2. In the first to third light emitting elements ED-1, ED-2 and ED-3, the first emission layers EML-R2, EML-G2 and EML-B2, and the second emission layers EML-R1, EML-G1, and EML-B1 may emit light of the same wavelength, respectively. For example, both the first emission layer EML-R2 and the second emission layer EML-R1 of the first light emitting element ED1 may emit red light, both the first emission layer EML-G2 and the second emission layer EML-G1 of the second light emitting element ED2 may emit green light, and both the first emission layer EML-B2 and the second emission layer EML-B1 of the third light emitting element ED3 may emit blue light.

The first to third light emitting elements ED-1, ED-2 and ED-3 may include a hole transport region HTR and an electron transport region ETR disposed with the first emission layers EML-R2, EML-G2 and EML-B2, and the second emission layers EML-R$_1$, EML-G1, and EML-B1 therebetween.

Between the first emission layers EML-R2, EML-G2 and EML-B2, and the second emission layers EML-R1, EML-G1, and EML-B1, an organic layer OG may be disposed. The organic layer OG may include an electron transport region ETR, charge generating layers CGL1 and CGL2 (FIG. 8) and a hole transport region HTR, stacked in order. Each of the charge generating layers CGL1 and CGL2 (FIG. 8) may include a p-type or kind charge generating layer and/or an n-type or kind charge generating layer.

Figure 10:
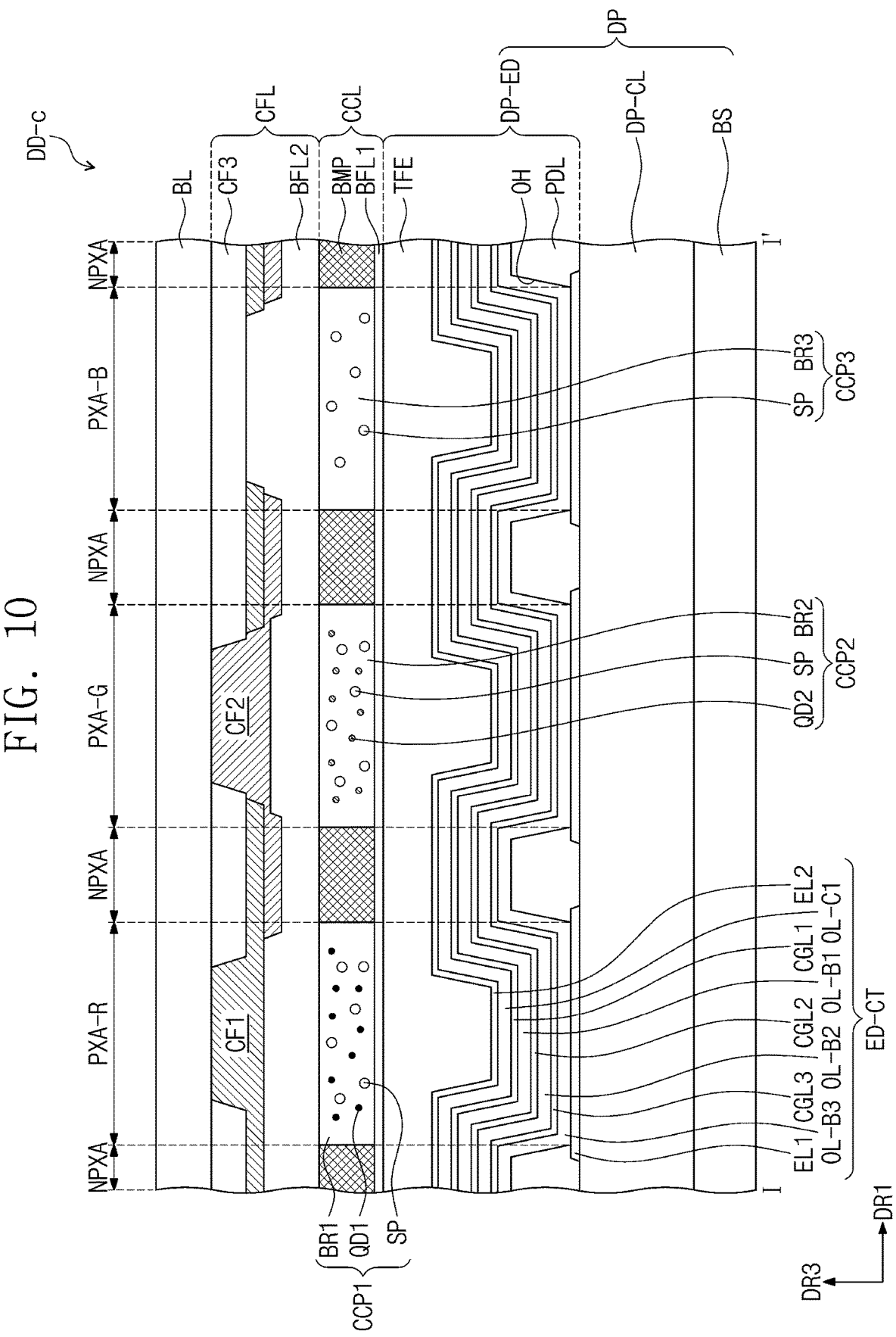
FIG. 10 is a cross-sectional view of a display apparatus according to an embodiment.

FIG. 10 is a cross-sectional view on a display apparatus according to an embodiment. Hereinafter, in the explanation on the display apparatus of an embodiment referring to FIG. 10, duplicative features which were explained in reference to FIG. 1 to FIG. 7 may not be explained again, and different features will be primarily explained.

Referring to FIG. 10, a display apparatus DD-c of an embodiment is different from the display apparatus DD-a (FIG. 7) shown in FIG. 7 in further including a fourth light emitting structure OL-C1 on the third light emitting structure OL-B1. In the display apparatus DD-c of an embodiment, each of the first to third light emitting structures OL-B1, OL-B2 and OL-B3 may emit blue light, and the fourth light emitting structure OL-C1 may emit green light. Among neighboring light emitting structures OL-B1, OL-B2, OL-B3 and OL-C1, charge generating layers CGL1, CGL2 and CGL3 may be disposed. The charge generating layers CGL1, CGL2 and CGL3 may include a p-type or kind charge generating layer and/or an n-type or kind charge generating layer.

Hereinafter, referring to embodiments and comparative embodiments, the polycyclic compound according to an embodiment and the light emitting element according to an embodiment of the present disclosure will be explained in more detail. In addition, the embodiments below are merely examples to assist the understanding of the present disclosure, and the scope of the present disclosure is not limited thereto.

Examples

1. Synthesis of Polycyclic Compound

First, the synthetic method of the polycyclic compound according to an embodiment of the present disclosure will be explained in more detail referring to the synthetic methods of Compound 17, Compound 41, Compound 46, and Compound 48 in Compound Group 1. In addition, the synthetic methods of the polycyclic compounds explained hereinafter are merely embodiments, and the synthetic method of the polycyclic compound according to an embodiment of the present disclosure is not limited to the embodiments below.

1. Synthesis of Compounds 17 and 48

Compounds 17 and 48 according to embodiments may be synthesized by, for example, the steps of Reaction 1-1 to Reaction 1-4.

Reaction 1-1

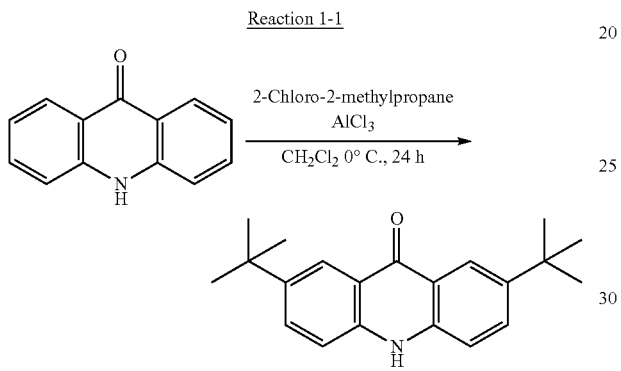

9(10H)-acridone (25 g, 128 mmol), and AlCl₃ (34 g, 256 mmol) were added to 630 ml of CH₂Cl₂, followed by stirring at about 0° C. for about 1 hour. Then, 2-chloro-2-methylpropane was added thereto dropwise, followed by stirring for about 24 hours. A NaOH aqueous solution was added, filtering with celite was performed, and liquid layers were separated. An organic layer was concentrated and then, separated by silica gel column chromatography to obtain a compound.

Reaction 1-2

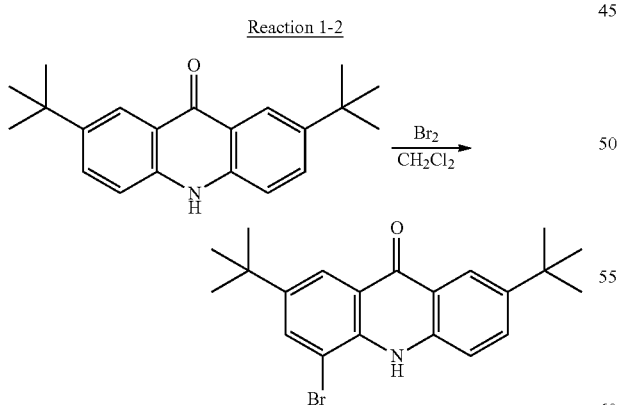

2,7-di-tert-butylacridin-9(10H)-one (5 g, 16.3 mmol) was added to 75 ml of CH₂Cl₂, followed by stirring at about 0° C. for about 1 hour. Then, Br₂ (5.2 ml, 16.3 mmol) was added thereto dropwise, followed by stirring for about 24 hours. A NaNO₂ aqueous solution was added, filtering with celite was performed, and liquid layers were separated. An organic layer was concentrated and then, separated by silica gel column chromatography to obtain a compound.

Reaction 1-3

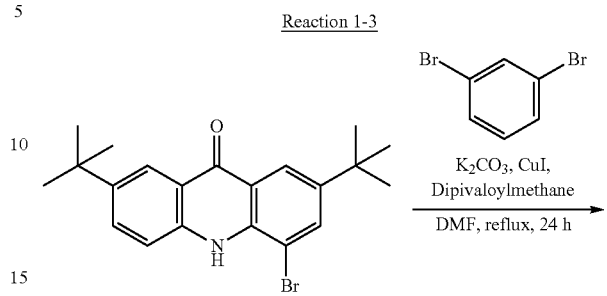

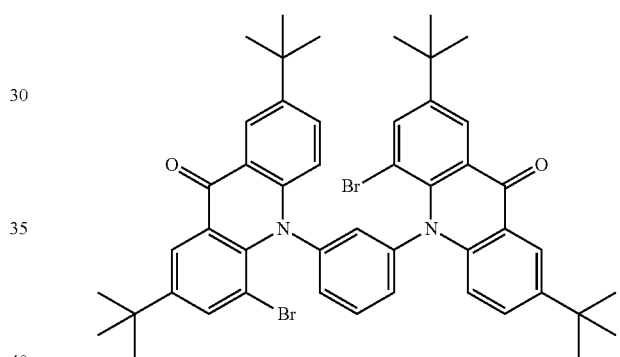

4-Bromo-2,7-di-tert-butylacridin-9(10H)-one (3.6 g, 9.3 mmol), 1,3-dibromobenzene (1.1 g, 4.7 mmol), dipivaloylmethane (0.69 g, 3.7 mmol), CuI (0.25 g, 1.9 mmol), and K₂CO₃ (1.9 g, 14 mmol) were added to 37 ml of DMF, followed by stirring for about 24 hours. Water was added, filtering with celite was performed, and liquid layers were separated. An organic layer was concentrated and then, separated by silica gel column chromatography to obtain a compound.

Reaction 1-4

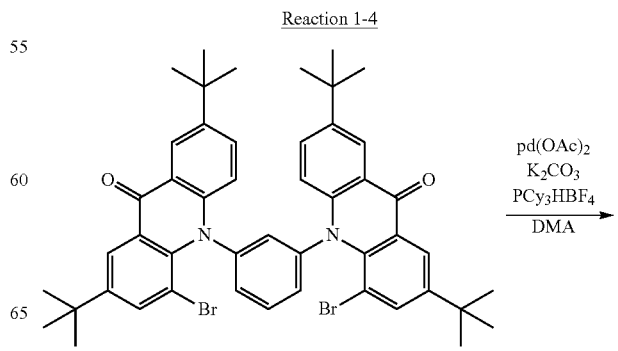

-continued

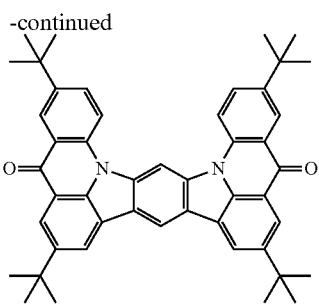

17

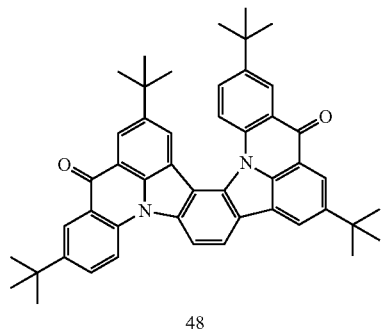

48

10,10'-(1,3-Phenylene)bis(4-bromo-2,7-di-tert-butylacridin-9(10H)-one) (2.6 g, 3.1 mmol), Pd(OAc)2 (40 mg, 0.18 mmol), PCy₃HBF₄ (0.14 g, 0.37 mmol), and K₂CO₃ (0.85 g, 6.2 mmol) were added to 15 ml of DMA (dimethylacetamide), followed by stirring at about 80° C. for about 6 hours. Water was added, filtering with celite was performed, and liquid layers were separated. An organic layer was concentrated and then, separated by silica gel column chromatography to obtain Compounds 17 and 48.

2. Synthesis of Compound 41

Compound 41 according to an embodiment may be synthesized by, for example, the steps of Reaction 2-5 and Reaction 2-6.

Reaction 2-5

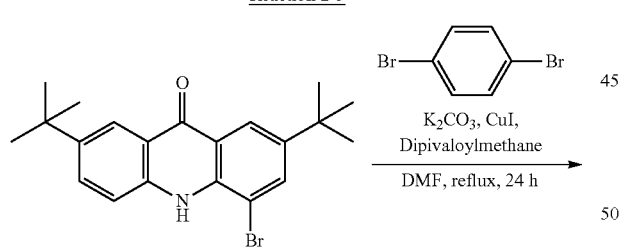

4-Bromo-2,7-di-tert-butylacridin-9(10H)-one (3.0 g, 7.8 mmol), 1,4-dibromobenzene (0.91 g, 3.9 mmol), dipivaloylmethane (0.58 g, 3.1 mmol), CuI (0.21 g, 1.6 mmol), and K₂CO₃ (1.6 g, 12 mmol) were added to 31 ml of DMF, followed by refluxing for about 24 hours. Water was added, filtering with celite was performed, and liquid layers were separated. An organic layer was concentrated and then, separated by silica gel column chromatography to obtain a compound.

Reaction 2-6

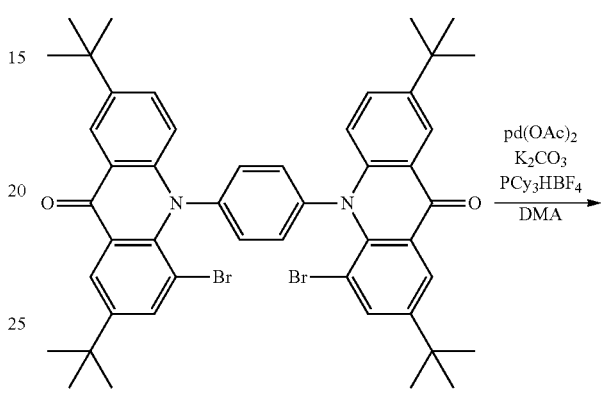

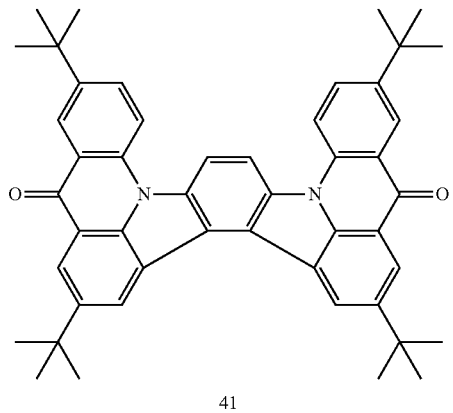

41

10,10'-(1,4-Phenylene)bis(4-bromo-2,7-di-tert-butylacridin-9(10H)-one) (2.5 g, 3.0 mmol), Pd(OAc)₂ (40 mg, 0.18 mmol), PCy₃HBF₄ (0.14 g, 0.37 mmol), and K₂CO₃ (0.85 g, 6.2 mmol) were added to 15 ml of DMA, followed by stirring at about 80° C. for about 6 hours. Water was added, filtering with celite was performed, and liquid layers were separated. An organic layer was concentrated and then, separated by silica gel column chromatography to obtain Compound 41.

3. Synthesis of Compound 46

Compound 46 according to an embodiment may be synthesized by, for example, the steps of Reaction 3-7 to Reaction 3-9.

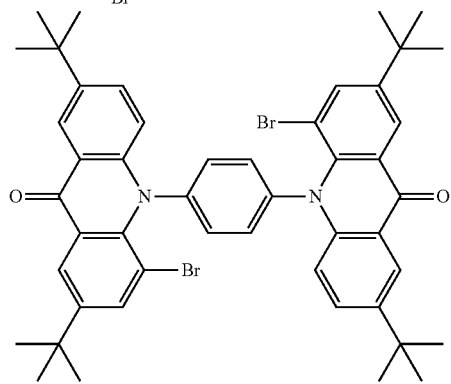

Reaction 3-7

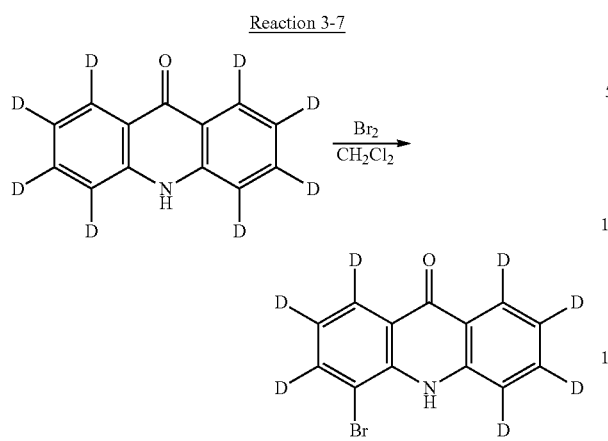

Deuterated acridine-9(10)-one (5 g, 24.6 mmol) was added to 75 ml of CH$_2$Cl$_2$, followed by stirring at about 0° C. for about 1 hour. Then, Br$_2$ (7.5 ml, 24.6 mmol) was added thereto dropwise, followed by stirring for about 24 hours. A NaNO$_2$ aqueous solution was added, filtering with celite was performed, and liquid layers were separated. An organic layer was concentrated and then, separated by silica gel column chromatography to obtain a compound.

Reaction 3-8

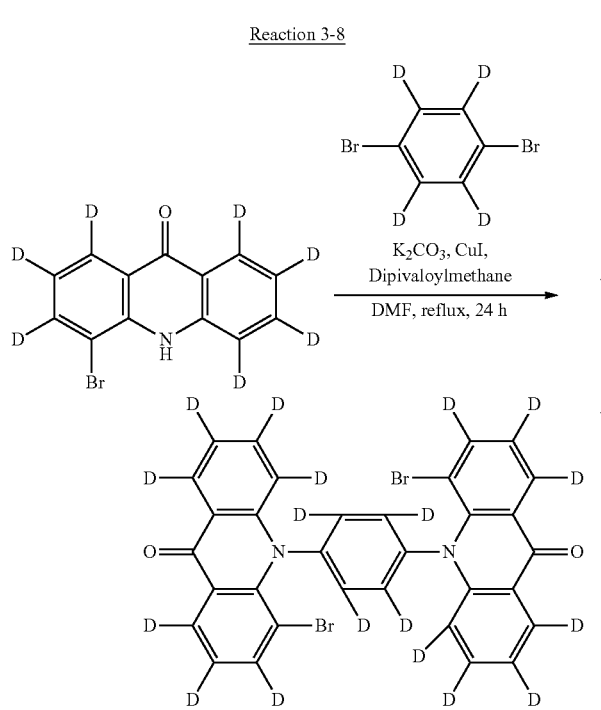

Deuterated 4-bromo-acridin-9(10H)-one (3.0 g, 10.6 mmol), deuterated 1,4-dibromobenzene (1.3 g, 5.3 mmol), dipivaloylmethane (0.58 g, 3.1 mmol), CuI (0.21 g, 1.6 mmol), and K$_2$CO$_3$ (3.2 g, 21 mmol) were added to 31 ml of DMF, followed by refluxing and stirring for about 24 hours. Water was added, filtering with celite was performed, and liquid layers were separated. An organic layer was concentrated and then, separated by silica gel column chromatography to obtain a compound.

Reaction 3-9

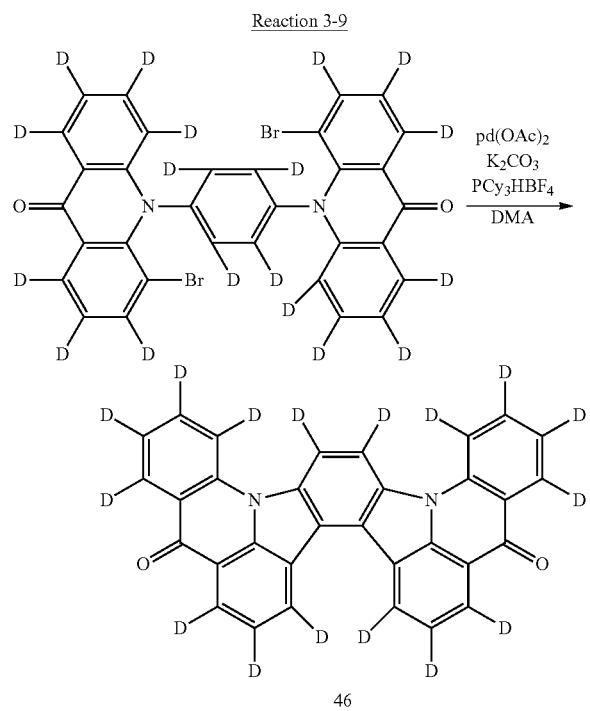

Deuterated 10,10'-(1,4-phenylene)bis(4-bromo-acridin-9(10H)-one) (1.9 g, 3.0 mmol), Pd(OAc)$_2$ (40 mg, 0.18 mmol), PCy$_3$HBF$_4$ (0.14 g, 0.37 mmol), and K$_2$CO$_3$ (0.85 g, 6.2 mmol) were added to 15 ml of DMA, followed by heating and stirring at about 80° C. for about 6 hours. Water was added, filtering with celite was performed, and liquid layers were separated. An organic layer was concentrated and then, separated by silica gel column chromatography to obtain Compound 46.

2. Manufacture and Evaluation of Light Emitting Element

Manufacture of Light Emitting Elements

Light emitting elements of embodiments, including polycyclic compounds of embodiments were manufactured by methods below. Light emitting elements of Examples 1 to 3 were manufactured using the polycyclic compounds of Compounds 17, 41 and 48 as light emitting dopants of emission layers.

Light emitting elements of Comparative Examples 1 to 3 were manufactured using Comparative Compounds X1 to X3 as light emitting dopant materials of emission layers.

The Comparative Compounds used for the manufacture of the elements are shown below.

Comparative Compounds PVS

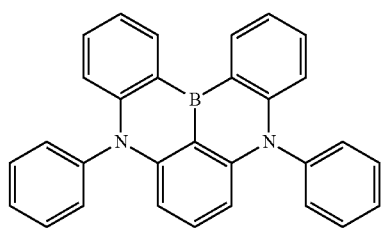

X1

X2

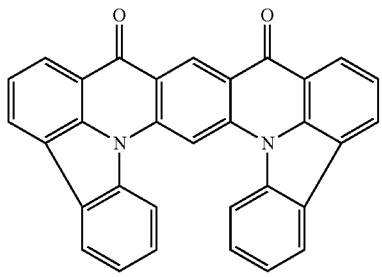

X3

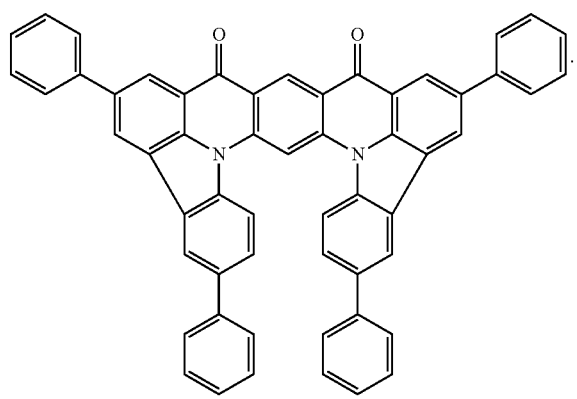

Additional compounds used for the manufacture of light emitting elements include the following:

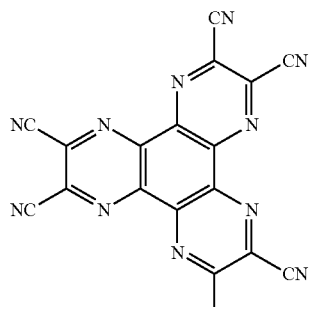

HAT-CN

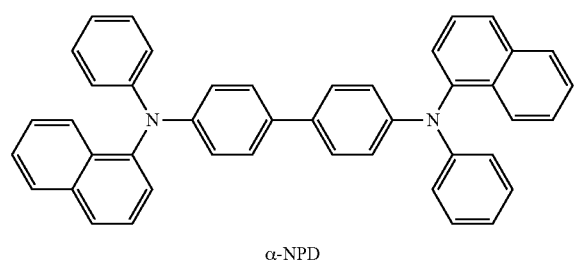

α-NPD

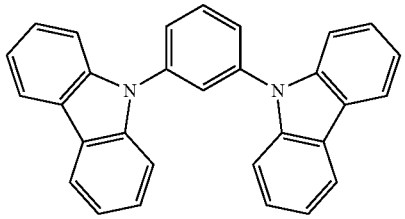

mCP

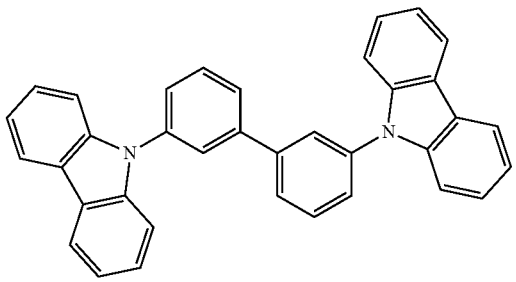

mCBP

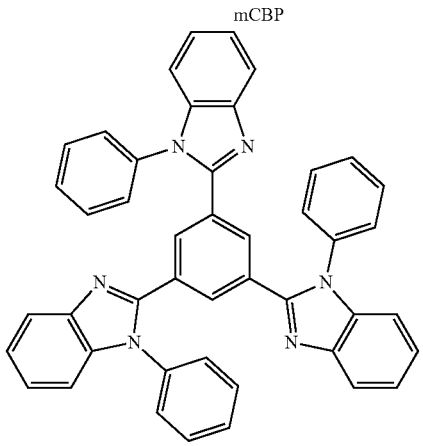

TPBi

A glass substrate on which ITO of 15 Ω/cm² (1500 Å) was patterned was cut into a size of 50 mm×50 mm×0.7 mm, washed by ultrasonic waves using isopropyl alcohol and pure water for about 5 minutes each, and cleaned by exposing to ultraviolet rays for about 30 minutes and exposing to ozone.

Then, HAT-CN was deposited to a thickness of about 100 Å, α-NPD was deposited to a thickness of about 800 Å, and mCP was deposited to a thickness of about 50 Å to form a hole transport region. Then, on the hole transport region, a dopant and a host were co-deposited in a ratio of about 1:99 to form an emission layer with a thickness of about 200 Å. The dopant used the compounds of Examples 1 to 3 or Comparative Examples 1 to 3, and the host used mCBP.

Then, on the emission layer, TPBI was deposited to a thickness of about 300 Å, and LiF was deposited to a thickness of about 5 Å to form an electron transport region. Then, on the electron transport region, Al was deposited to form a second electrode of a thickness of about 1000 Å to manufacture a light emitting element.

Evaluation of Properties of Light Emitting Elements

In Table 1, the evaluation results of the light emitting elements of Example 1 to Example 3, and Comparative Example 1 to Comparative Example 3 are shown. In Table 1, the full width at half maximum, maximum emission wavelength, roll-off rate, maximum external quantum efficiency, and relative life of the light emitting elements thus manufactured are compared and shown.

The maximum external quantum efficiency could be calculated by [internal quantum efficiency×charge balance×out coupling efficiency].

The roll-off rate could be calculated from (external quantum efficiency at 1 cd/m$^2$)−((external quantum efficiency at 1000 cd/m$^2$)]/(external quantum efficiency at 1 cd/in$^2$)]×100.

The relative life represents relative half-life values of Examples 1 to 3, if the half life of Comparative Example 1 was set to "1".

TABLE 1

| Element manufacturing example | Dopant | Full width at half maximum (nm) | λmax (nm) | Roll-off rate (%) | EQE$_{max}$ 1000 nit (%) | Relative life |
|---|---|---|---|---|---|---|
| Example 1 | 17 | 28 | 458 | 27.8 | 14.2 | 1.6 |
| Example 2 | 41 | 30 | 460 | 28.9 | 13.2 | 1.5 |
| Example 3 | 48 | 29 | 460 | 30.5 | 12.3 | 1.5 |
| Comparative Example 1 | X1 | 32 | 462 | 32.0 | 11.2 | 1.0 |
| Comparative Example 2 | X2 | 40 | 440 | 45.0 | 5.4 | 0.7 |
| Comparative Example 3 | X3 | 42 | 447 | 47.8 | 4.8 | 0.6 |

Referring to the results of Table 1, it could be confirmed that the light emitting elements of Examples 1 to 3 had smaller full width at half maximum, lower roll-off rate, higher maximum external quantum efficiency, and longer relative life when compared to the light emitting elements of Comparative Example 1 to Comparative Example 3.

It could be found that the light emitting elements of the Examples had smaller full width at half maximum and higher color purity when compared to the light emitting elements of the Comparative Examples. The light emitting elements of the Examples and the light emitting elements of the Comparative Examples showed the maximum emission wavelength of about 460 nm and emitted blue light.

It could be confirmed that the light emitting elements of the Examples had a lower roll-off rate when compared to the light emitting elements of the Comparative Examples. In addition, it could be confirmed that the light emitting elements of the Examples had higher maximum external quantum efficiency when compared to the light emitting elements of the Comparative Examples. Through this, it could be confirmed that the light emitting elements of the Examples had higher emission efficiency when compared to the light emitting elements of the Comparative Examples.

The Example Compounds are different from the Comparative Compounds in that a boron atom is not included in a polycyclic ring and an oxygen atom and a nitrogen atom are included in the polycyclic ring. The boron atom is weak to the attack by a nucleophile due to a vacant p-orbital, and accordingly, a polycyclic compound including a boron atom has defects of low structural stability. The Example Compounds do not include a boron atom in a polycyclic ring and have higher structural stability when compared to a polycyclic compound including a boron atom. Because the light emitting elements of the Examples include polycyclic compounds having high structural stability, it is thought that high emission efficiency and long-life characteristics are observed.

As described above, it could be confirmed that the light emitting elements of embodiments, including the Example Compounds in emission layers showed high emission efficiency and long-life characteristics when compared to the light emitting elements of the Comparative Examples.

The polycyclic compound according to an embodiment has a structure including an oxygen atom and a nitrogen atom in a core structure, and may have structural stability. In a polycyclic compound including a boron atom in a core structure, a vacant p-orbital is weak to the attack of a nucleophile, but the polycyclic compound of an embodiment does not include a boron atom in a core structure, and may have structural stability when compared to the polycyclic compound including a boron atom. In addition, the light emitting element according to an embodiment includes the polycyclic compound of an embodiment in an emission layer and may show high emission efficiency and long-life characteristics.

The light emitting element of an embodiment includes a polycyclic compound having high stability and may show high efficiency properties and long-life characteristics.

The polycyclic compound of an embodiment includes at least two acridone groups and may have high stability.

The use of "may" when describing embodiments of the present disclosure refers to "one or more embodiments of the present disclosure."

As used herein, the term "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this disclosure is intended to include all higher numerical limitations subsumed therein. Accordingly, Applicant reserves the right to amend this disclosure, including the claims, to expressly recite any sub-range subsumed within the ranges expressly recited herein.

The light emitting device or any other relevant devices or components according to embodiments of the present disclosure described herein may be implemented utilizing any suitable hardware, firmware (e.g., an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

Although the embodiments of the present disclosure have been described, it is understood that the present disclosure should not be limited to these embodiments, but one or more suitable changes and modifications can be made by one ordinary skilled in the art within the spirit and scope of the present disclosure as defined by the following claims and equivalents thereof.

What is claimed is:

1. A light emitting element, comprising:
a first electrode;
a second electrode on the first electrode; and
an emission layer between the first electrode and the second electrode, and comprising a first compound represented by Formula 1, and at least one selected from among a second compound to a fourth compound, wherein the first compound to the fourth compound are different from each other:

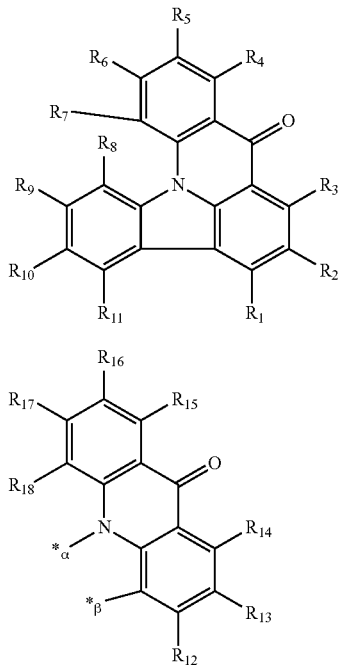

wherein in Formula 1,
$R_1$ to $R_{11}$ are each independently a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 3 to 30 ring-forming carbon atoms, or combined with an adjacent group to form a ring, at least one pair selected from among pairs of two neighboring substituents selected from among $R_8$ to $R_{11}$ is bonded to *α and *β of Formula 2, respectively, and wherein *α is bonded to $R_{10}$, and *β is bonded to $R_9$ is excluded, and $R_{12}$ to $R_{18}$ are each independently a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 3 to 30 ring-forming carbon atoms.

2. The light emitting element of claim 1, wherein Formula 1 is represented by any one selected from among the following Formula 3-1 to Formula 3-4:

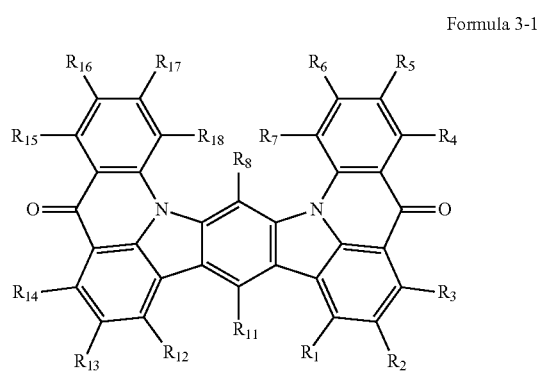

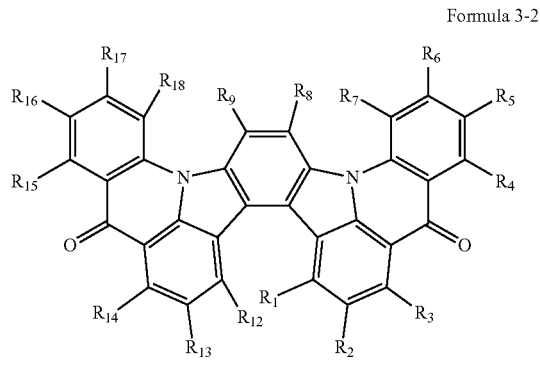

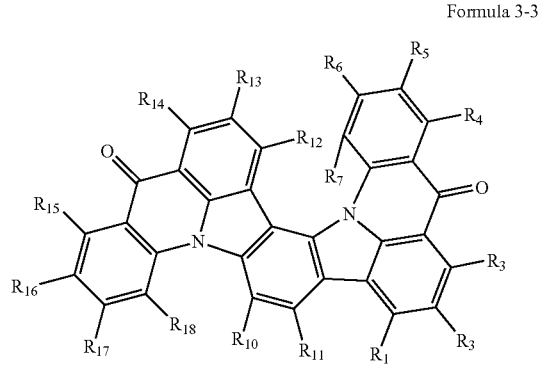

-continued

Formula 3-4

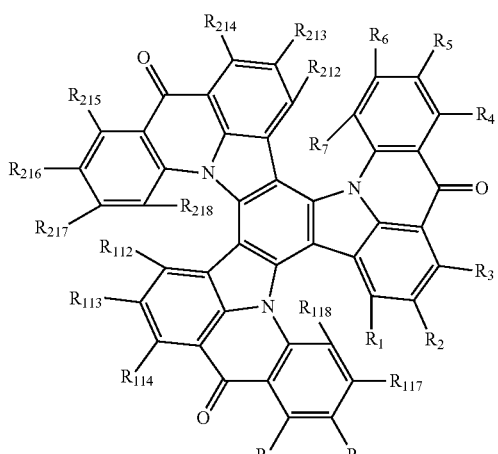

58 wherein in Formula 3-1 to Formula 3-4, $R_1$ to $R_{11}$ are the same as defined in Formula 1, wherein in Formula 3-1 to Formula 3-3, $R_{12}$ to $R_{18}$ are the same as defined in Formula 2, and wherein in Formula 3-4, $R_{112}$ to $R_{118}$, and $R_{212}$ to $R_{218}$ are each independently a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 3 to 30 ring-forming carbon atoms.

3. The light emitting element of claim 2, wherein, in Formula 3-1, $R_8$ and $R_{11}$ are all hydrogen atoms.

4. The light emitting element of claim 2, wherein, in Formula 3-3, $R_{10}$ and $R_{11}$ are the same.

5. The light emitting element of claim 1, wherein substituents selected from among $R_8$ to $R_{11}$ of Formula 1 that are not bonded to Formula 2 are each independently a hydrogen atom, a deuterium atom, a substituted or unsubstituted phenyl group, a substituted or unsubstituted naphthyl group, a substituted or unsubstituted phenanthryl group, a substituted or unsubstituted diphenyl amine group, a substituted or unsubstituted carbazole group, a substituted or unsubstituted acridine group, a substituted or unsubstituted phenothiazine group, or a substituted or unsubstituted phenoxazine group.

6. The light emitting element of claim 1, wherein $R_1$ to $R_7$ of Formula 1 and $R_{12}$ to $R_{18}$ of Formula 2 are each independently an amine group comprising at least two selected from among a substituted or unsubstituted phenyl group, an unsubstituted naphthyl group, an unsubstituted dibenzofuran group, an unsubstituted carbazole group, and a substituted or unsubstituted dibenzothiopen group, a hydrogen atom, a deuterium atom, a substituted or unsubstituted phenyl group, a substituted or unsubstituted carbazole group, a substituted or unsubstituted isopropyl group, or a substituted or unsubstituted t-butyl group.

7. The light emitting element of claim 1, wherein the emission layer is configured to emit blue light.

8. The light emitting element of claim 1, wherein the first compound is configured to emit thermally activated delayed fluorescence.

9. The light emitting element of claim 1, wherein the emission layer comprises the second compound and the third compound, and the second compound is represented by any one selected from among the following HT-1 to HT-4:

HT-1

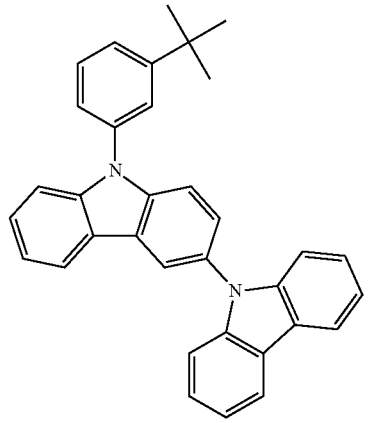

HT-2

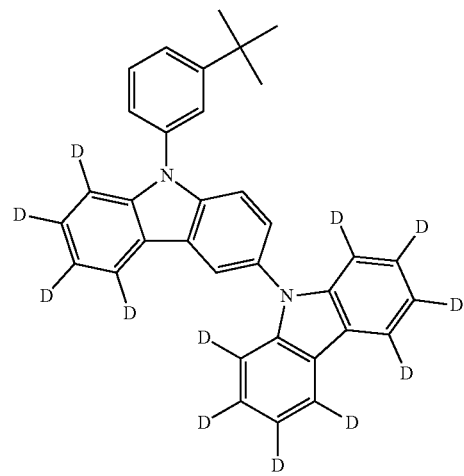

HT-3

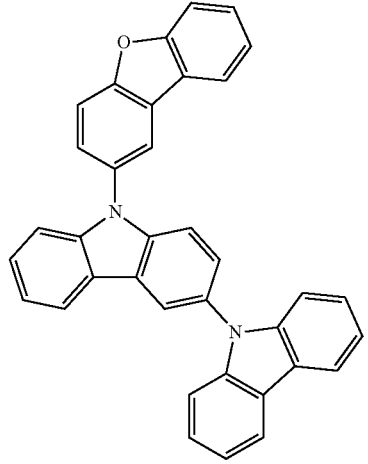

-continued

HT-4

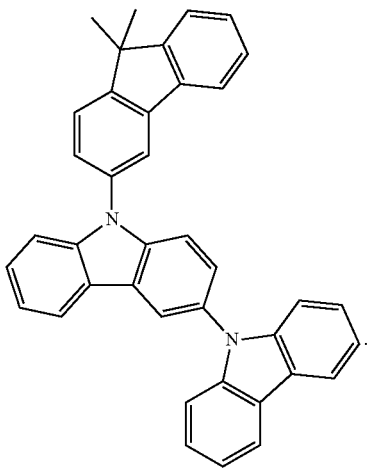

10. The light emitting element of claim 9, wherein the third compound is represented by any one selected from among the following ET-1 to ET-3:

ET-1

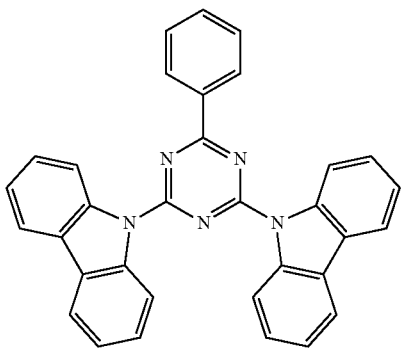

ET-2

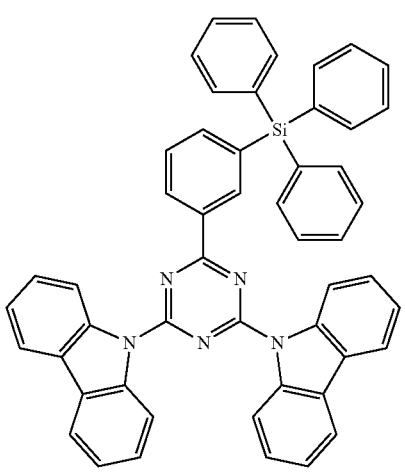

-continued

ET-3

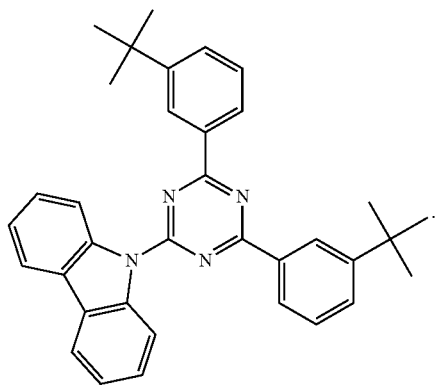

11. The light emitting element of claim 10, further comprising the fourth compound, wherein the fourth compound is represented by Formula M-b:

Formula M-b

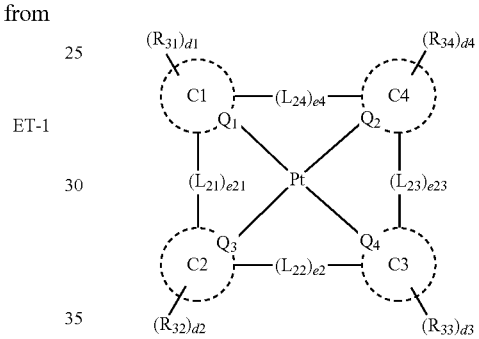

wherein in Formula M-b,
$Q_1$ to $Q_4$ are each independently C or N,
C1 to C4 are each independently a substituted or unsubstituted hydrocarbon ring of 5 to 30 ring-forming carbon atoms, or a substituted or unsubstituted heterocycle of 2 to 30 ring-forming carbon atoms,
$L_{21}$ to $L_{24}$ are each independently a direct linkage,

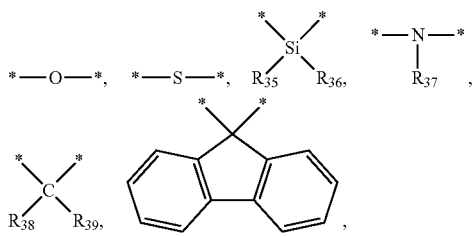

a substituted or unsubstituted divalent alkyl group of 1 to 20 carbon atoms, a substituted or unsubstituted arylene group of 6 to 30 ring-forming carbon atoms, or a substituted or unsubstituted heteroarylene group of 2 to 30 ring-forming carbon atoms,
e1 to e4 are each independently 0 or 1,
$R_{31}$ to $R_{39}$ are each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring, and d1 to d4 are each independently an integer from 0 to 4.

12. The light emitting element of claim 11, wherein the first compound is a light emitting dopant, the second compound is a hole transport host, the third compound is an electron transport host, and the fourth compound is an auxiliary dopant.

13. The light emitting element of claim 1, wherein the emission layer comprises at least one selected from among compounds represented in the following Compound Group 1:

Compound Group 1

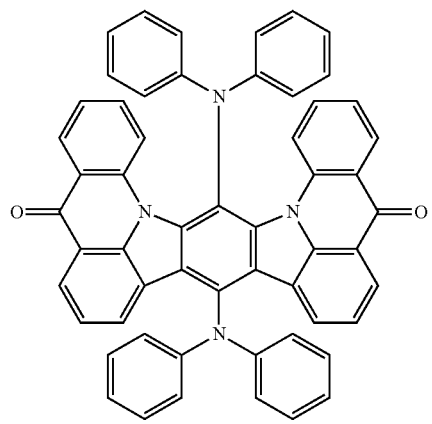

1

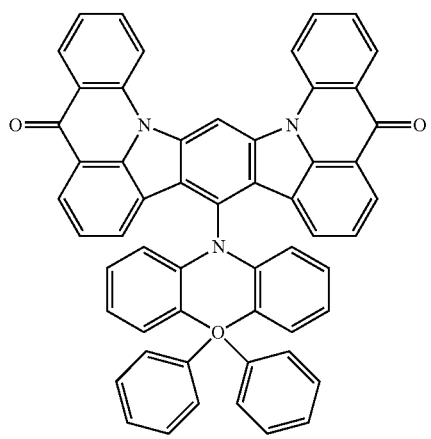

3

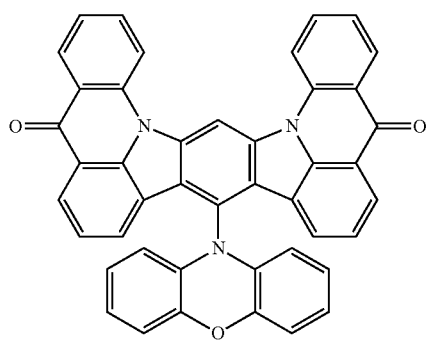

2

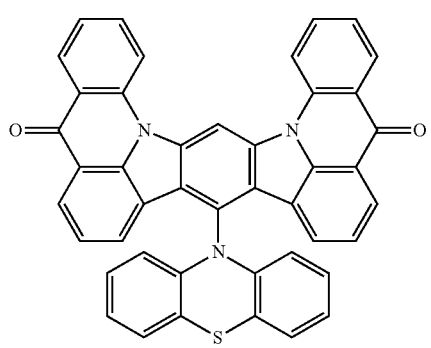

4

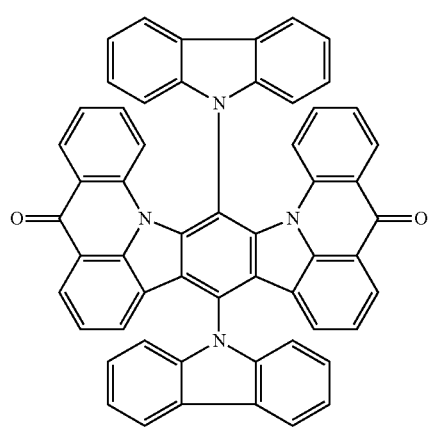

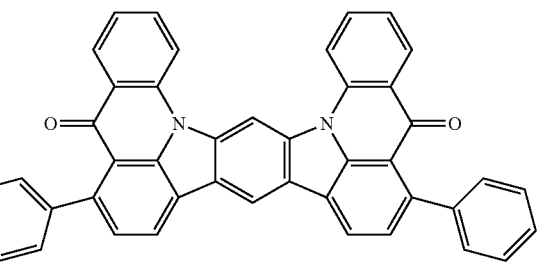

5

6

7
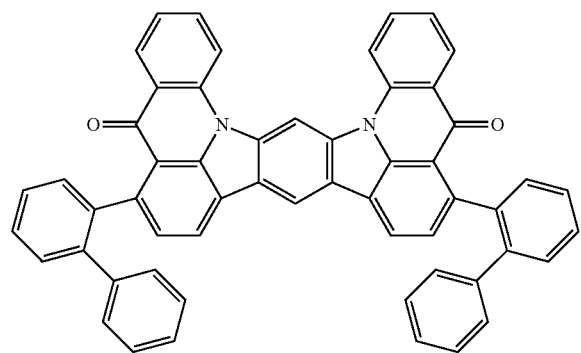
8
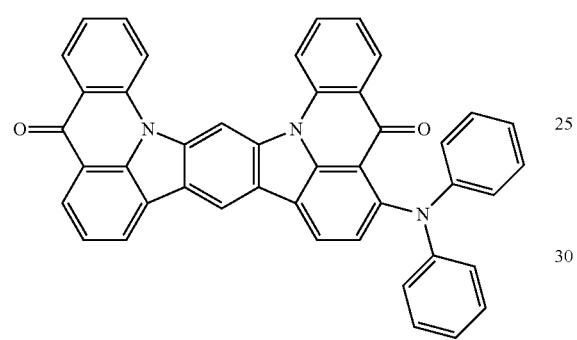
9
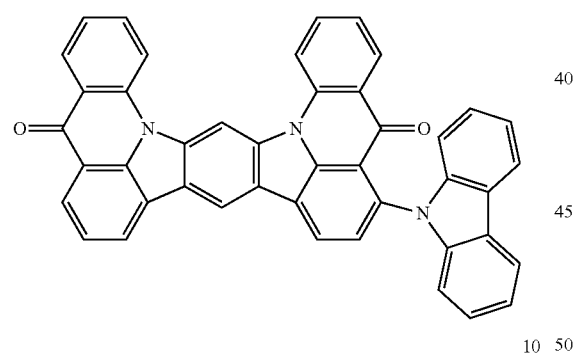
10
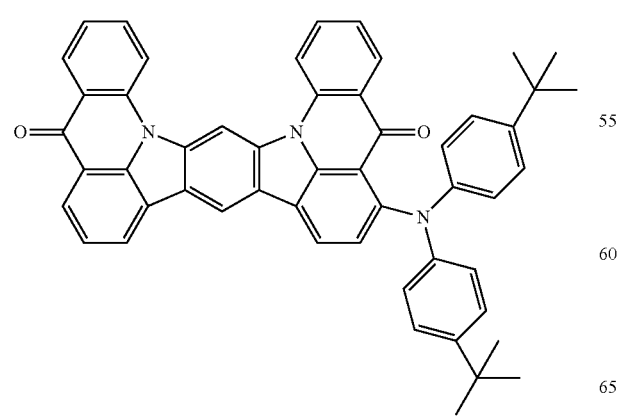
11
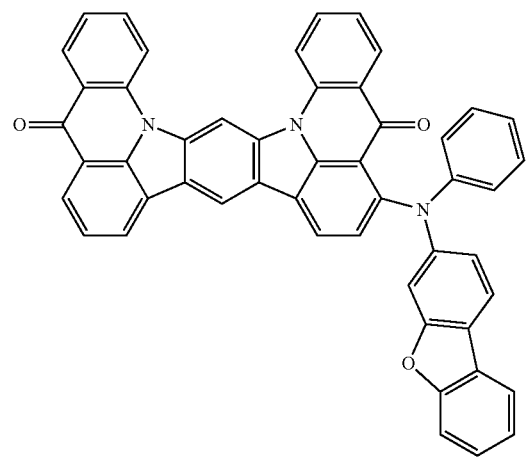
12
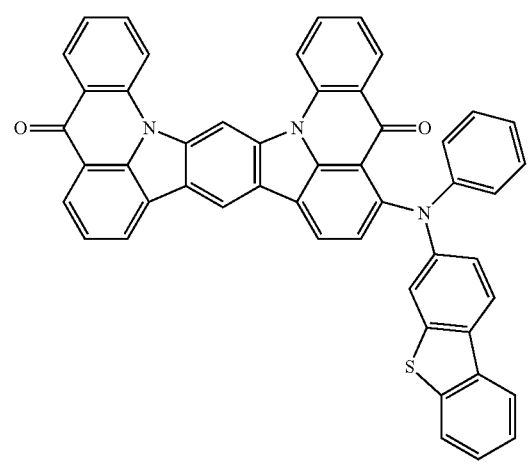
13
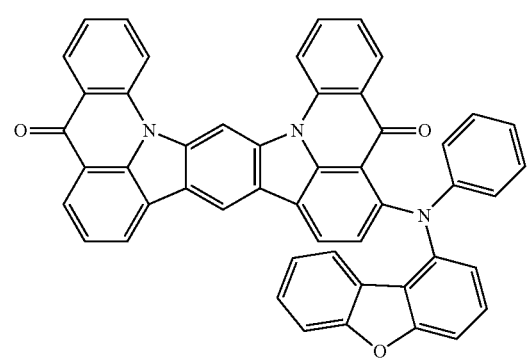

125
-continued
14
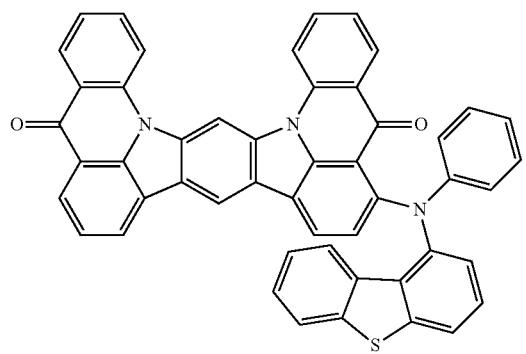
15
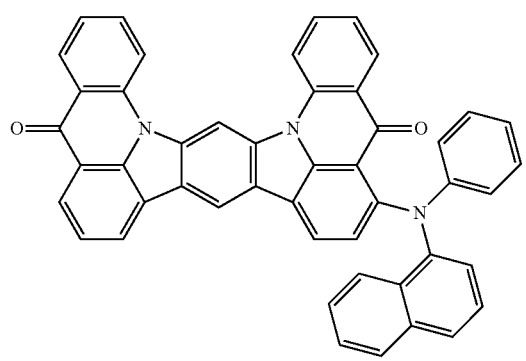
16
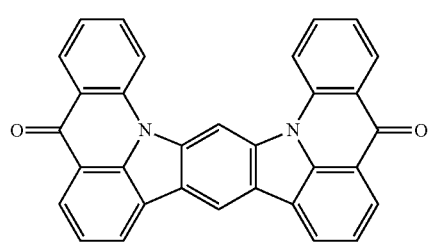
17
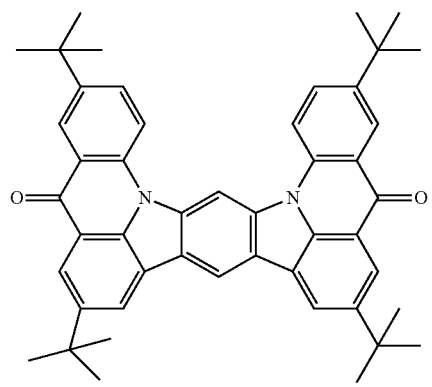
126
-continued
18
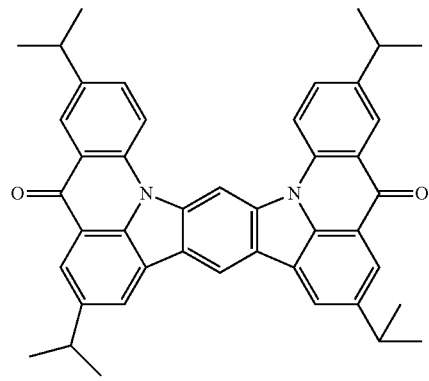
19
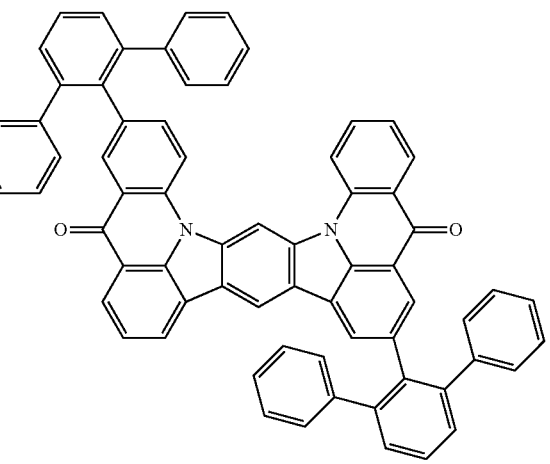
20

21
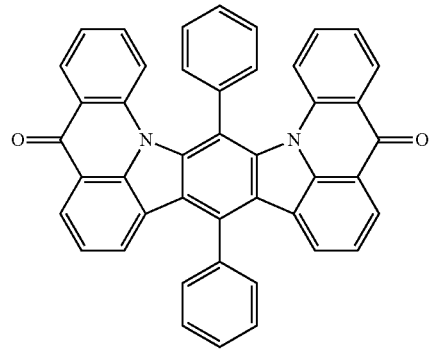
22
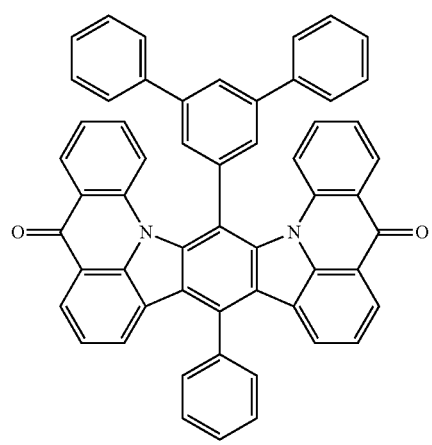
23
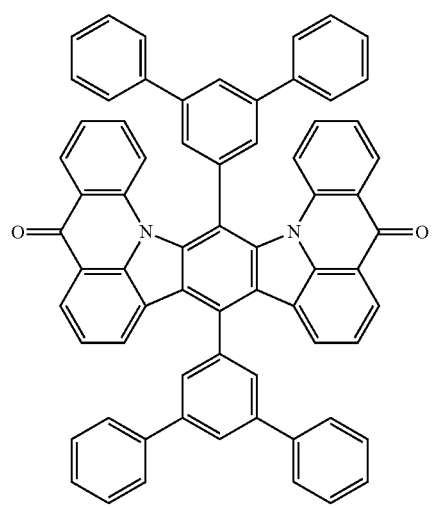
24
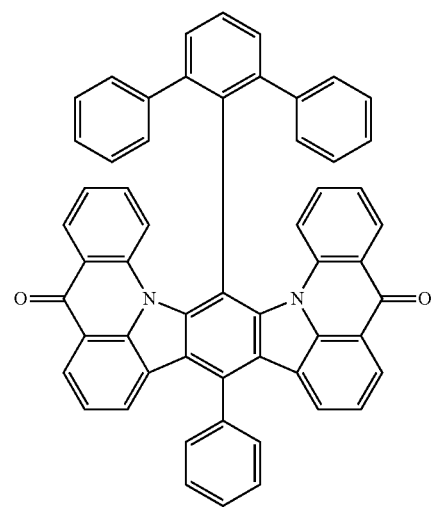
25
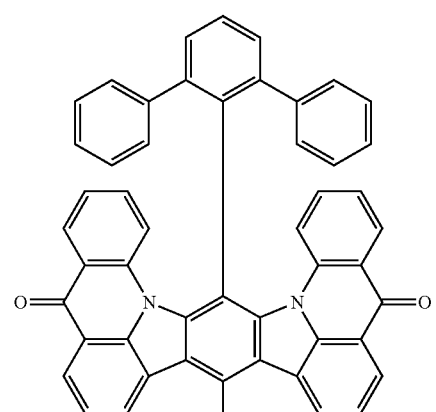
26
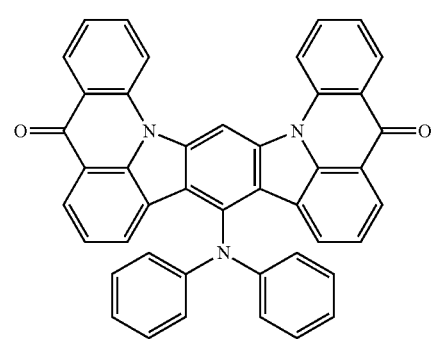

-continued
27
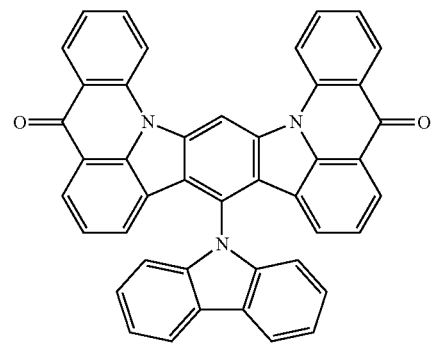
28
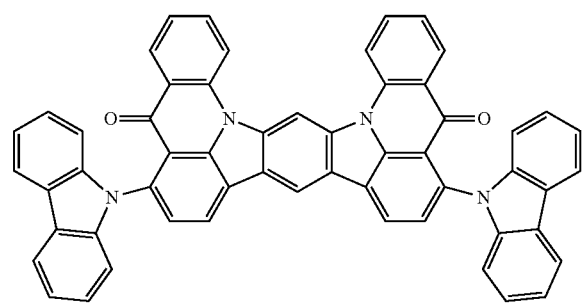
29
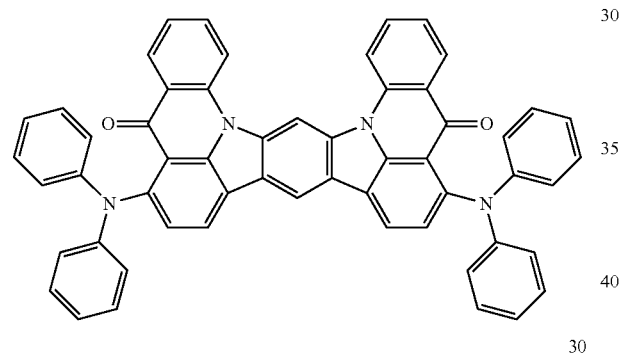
30
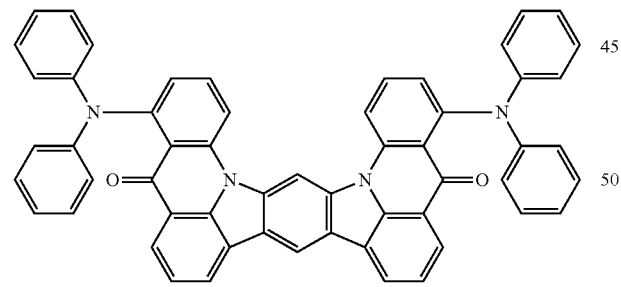
31
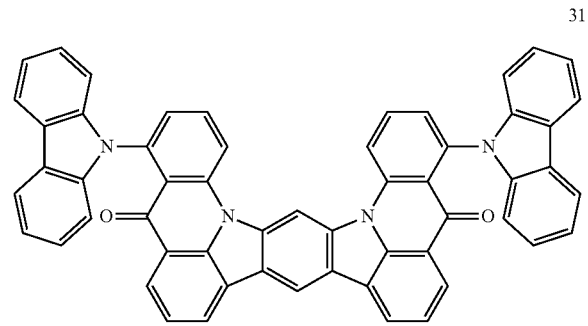
-continued
32
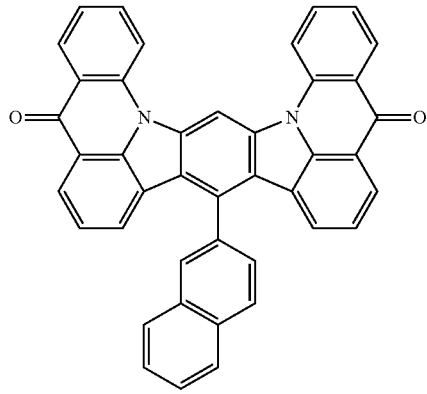
33
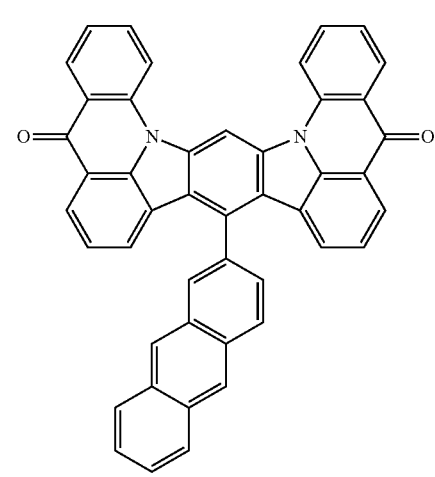
34
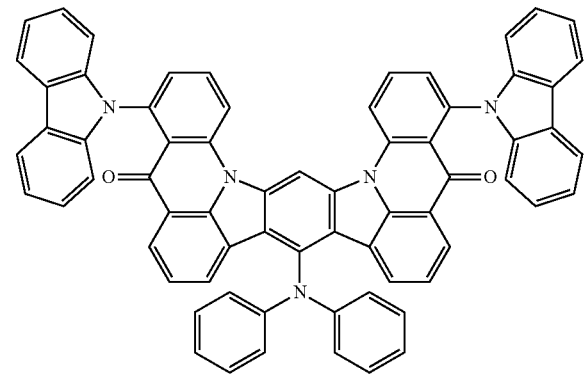

-continued
35
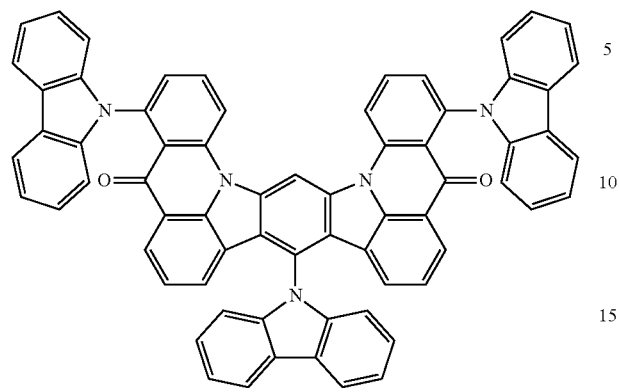
36
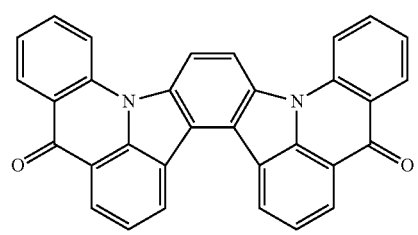
37
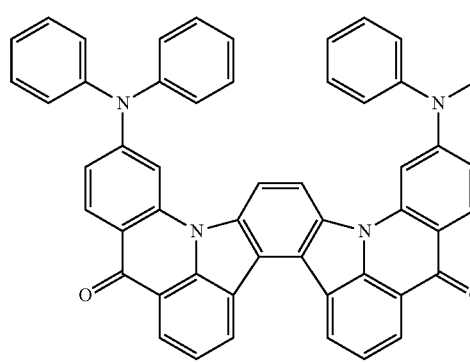
38
-continued
39
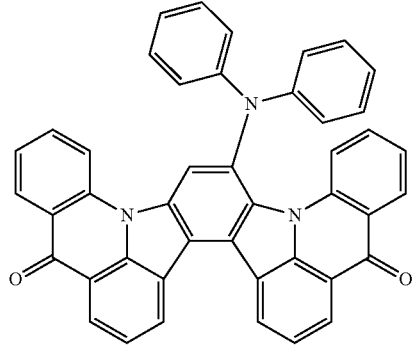
40
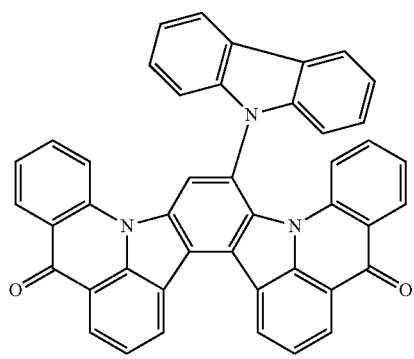
41
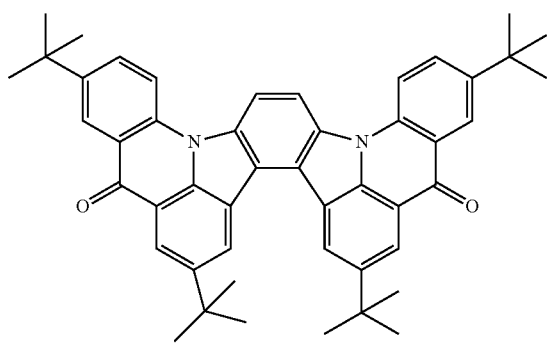
42
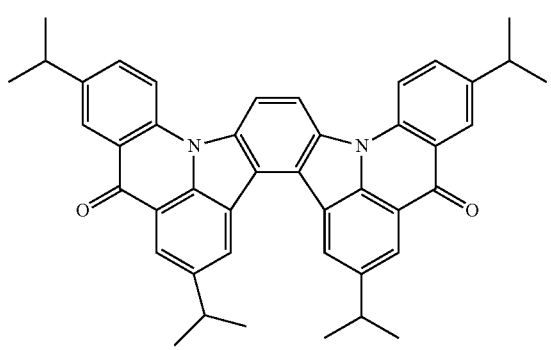

43
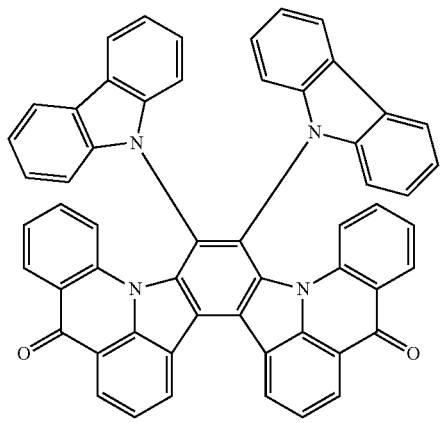
44
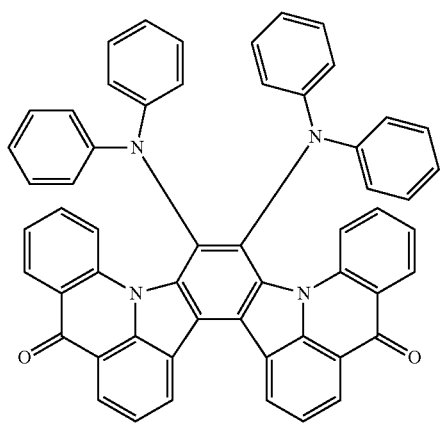
45
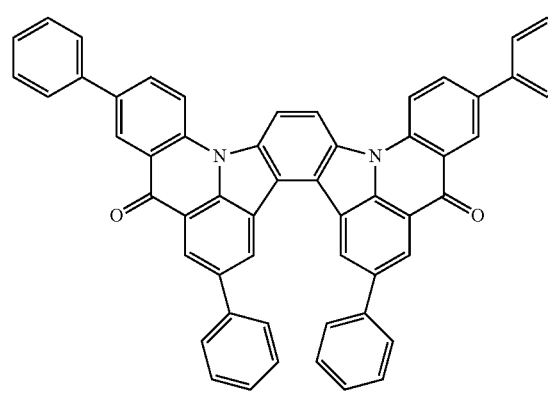
46
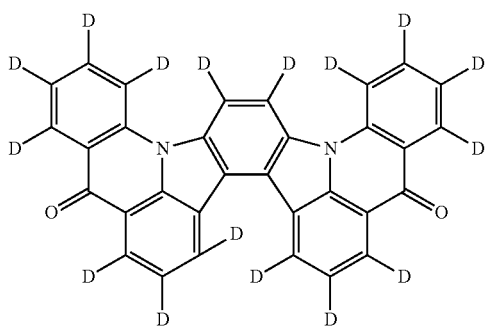
47
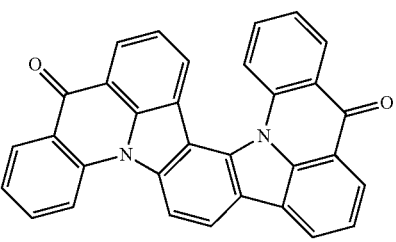
48
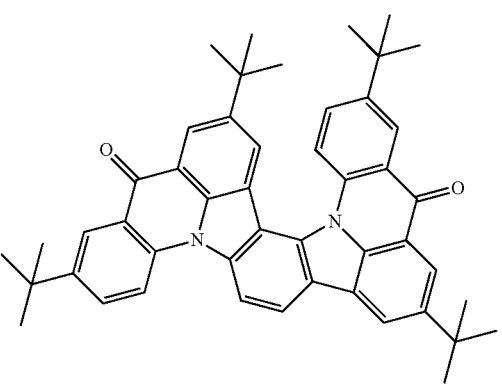
49
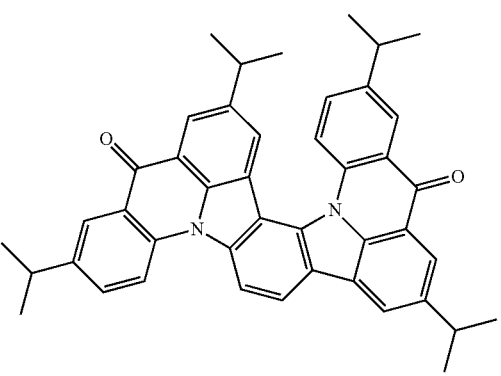
50
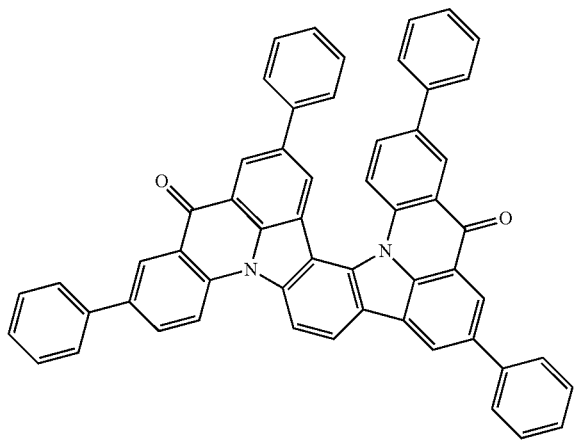

51
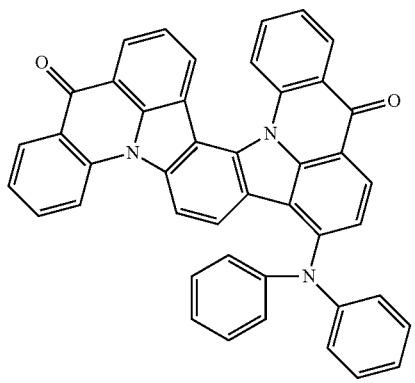
52
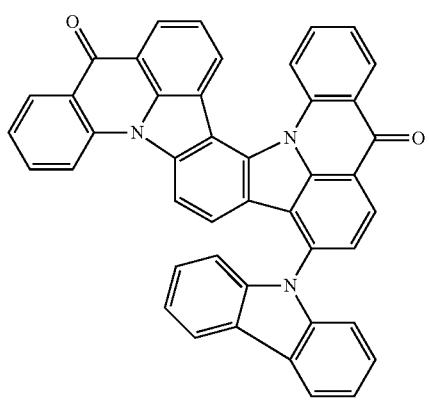
53
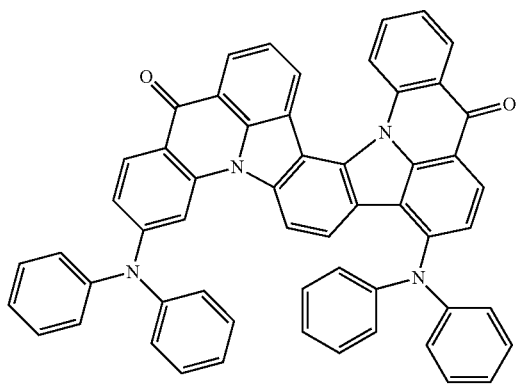
54
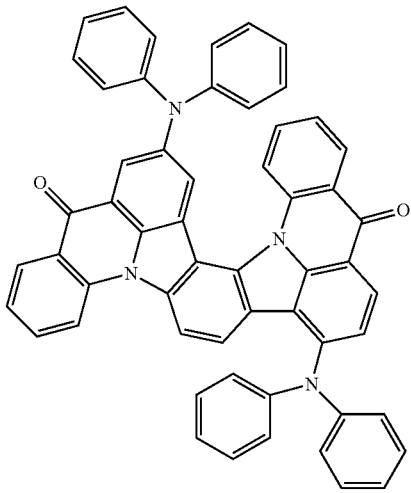
55
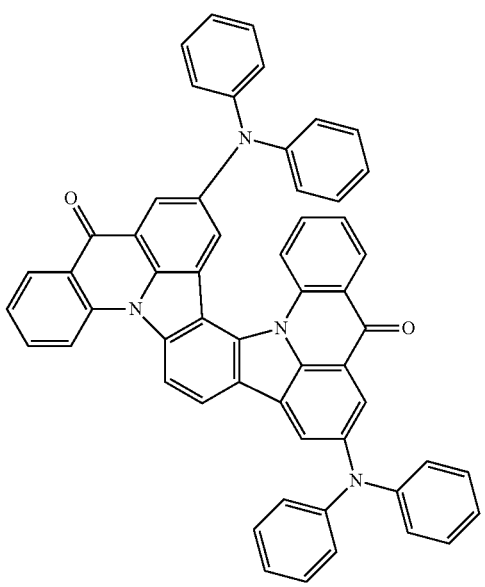
56
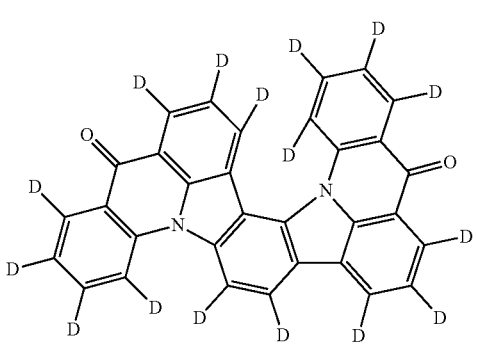

-continued

57
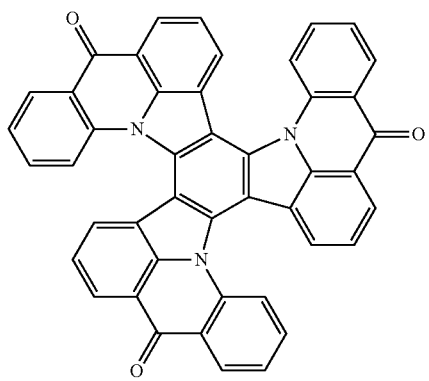

58
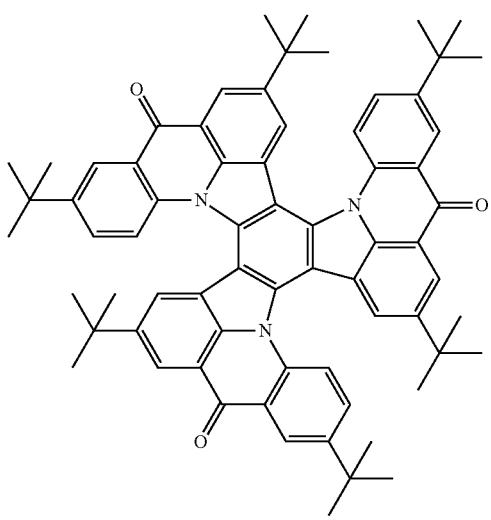

59
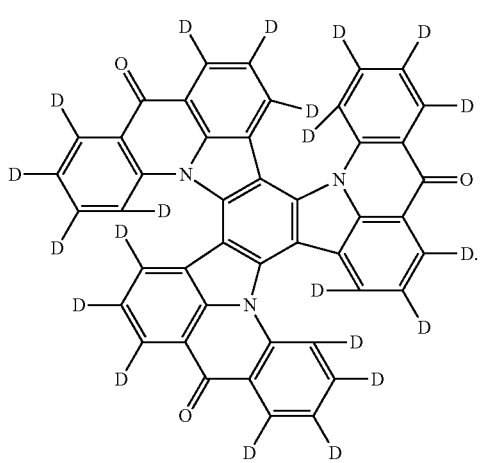

14. A polycyclic compound represented by Formula 1:

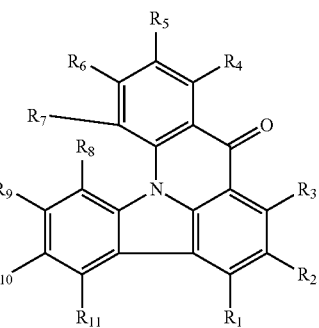

Formula 1

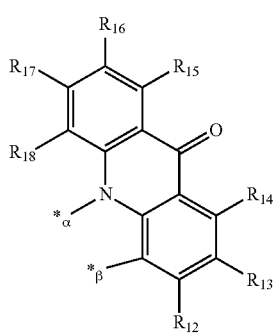

Formula 2 wherein in Formula 1, $R_1$ to $R_{11}$ are each independently a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 3 to 30 ring-forming carbon atoms, or combined with an adjacent group to form a ring, at least one pair selected from among pairs of two neighboring substituents selected from among $R_8$ to $R_{11}$ is bonded to $*\alpha$ and $*\beta$ of Formula 2, respectively, and wherein $*\alpha$ is bonded to $R_{10}$, and $*\beta$ is bonded to $R_9$ is excluded, and $R_{12}$ to $R_{18}$ are each independently a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 3 to 30 ring-forming carbon atoms.

15. The polycyclic compound of claim 14, wherein Formula 1 is represented by any one selected from among the following Formula 3-1 to Formula 3-4:

Formula 3-1

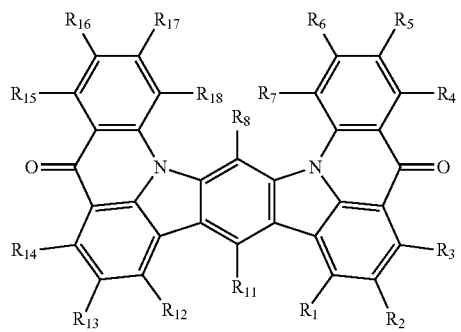

Formula 3-2

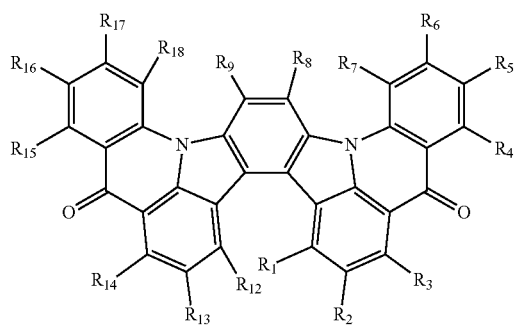

Formula 3-3

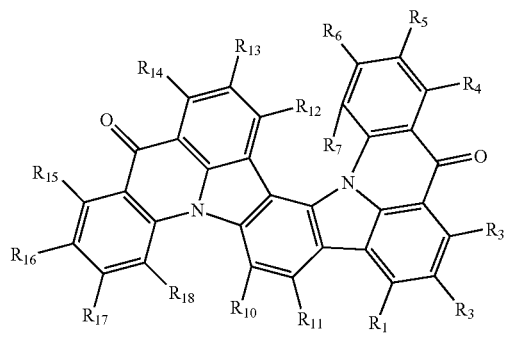

Formula 3-4

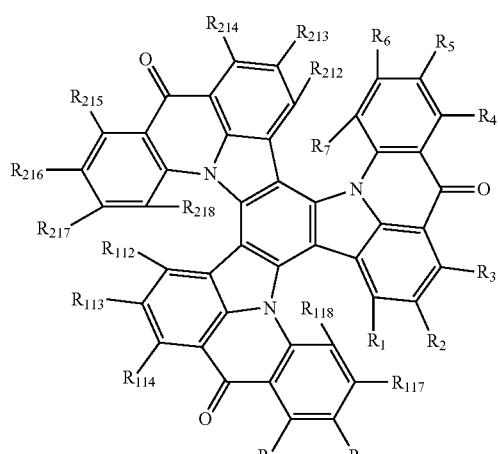

wherein in Formula 3-1 to Formula 3-4, $R_1$ to $R_{11}$ are the same as defined in Formula 1, wherein in Formula 3-1 to Formula 3-3, $R_{12}$ to $R_{18}$ are the same as defined in Formula 2, and in Formula 3-4, $R_{112}$ to $R_{118}$, and $R_{212}$ to $R_{218}$ are each independently a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 3 to 30 ring-forming carbon atoms.

16. The polycyclic compound of claim 15, wherein, in Formula 3-1, $R_8$ and $R_{11}$ are all hydrogen atoms.

17. The polycyclic compound of claim 14, wherein substituents selected from among $R_8$ to $R_{11}$ of Formula 1 that are not bonded to Formula 2 are each independently represented by any one selected from among compounds in the following Compound Group A:

Compound Group A

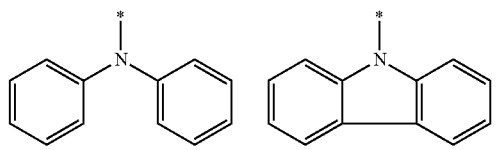

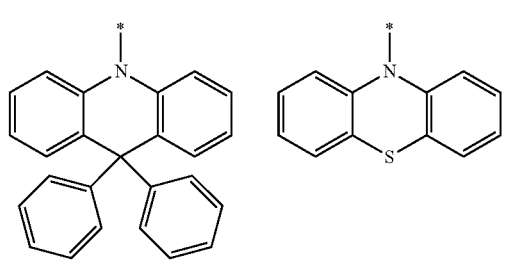

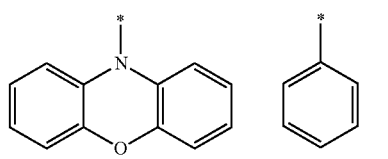

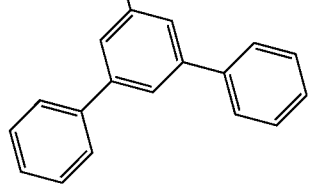

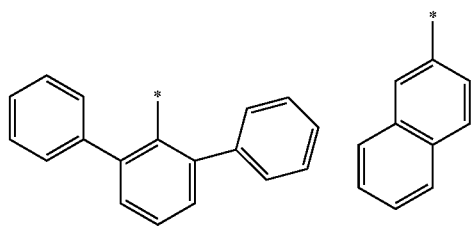

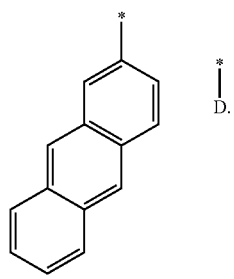

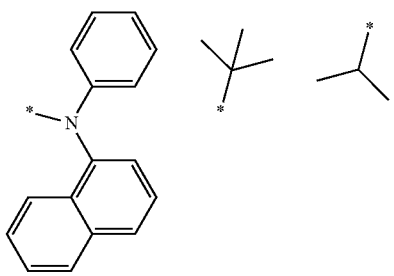

18. The polycyclic compound of claim 14, wherein $R_1$ to $R_7$ of Formula 1 and $R_{12}$ to $R_{18}$ of Formula 2 are each independently represented by any one selected from among compounds in the following Compound Group B:

Compound Group B

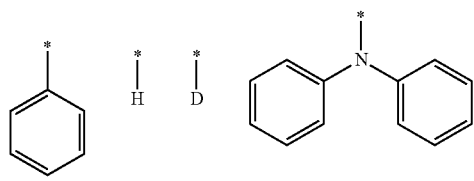

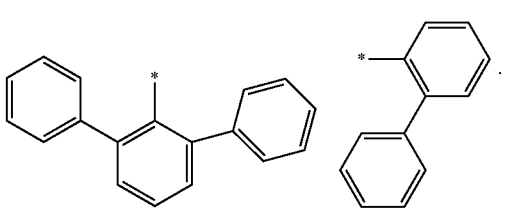

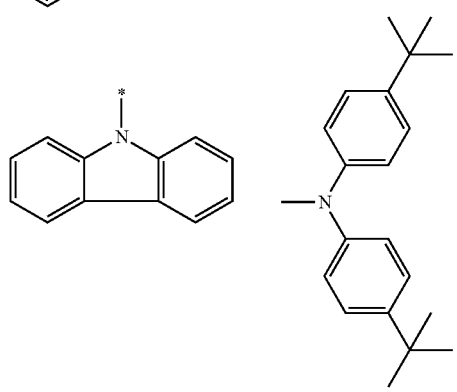

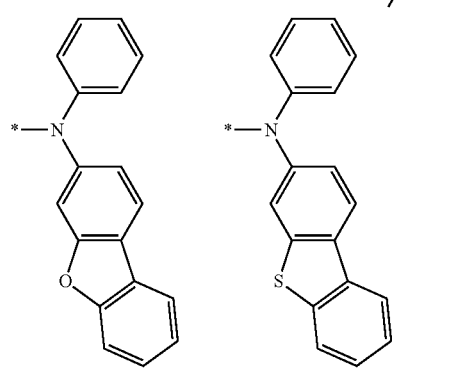

19. The polycyclic compound of claim 14, wherein the polycyclic compound is a blue emitting material.

20. The polycyclic compound of claim 14, wherein Formula 1 is represented by any one selected from among compounds in Compound Group 1:

Compound Group 1

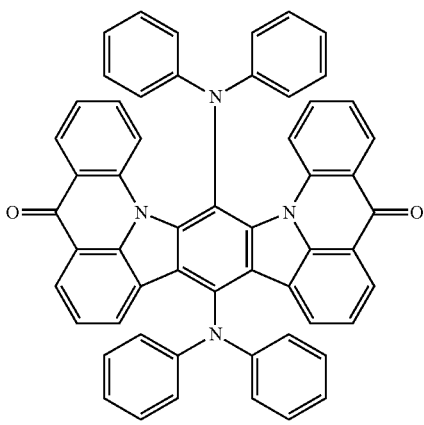

1

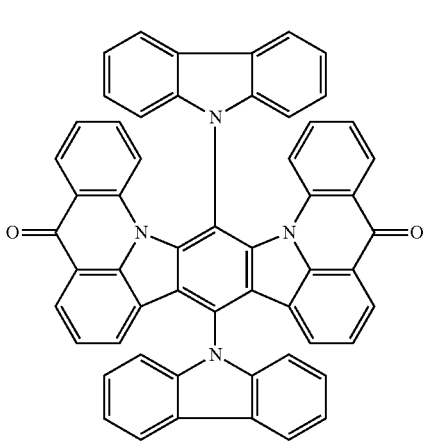

2

-continued
3
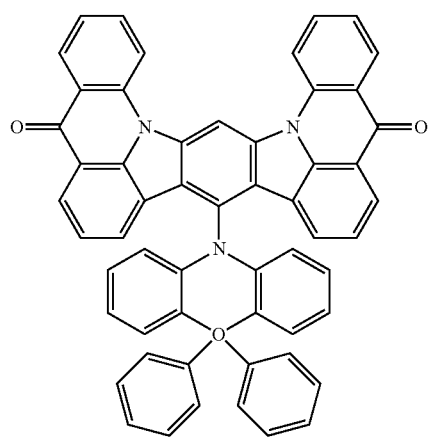
4
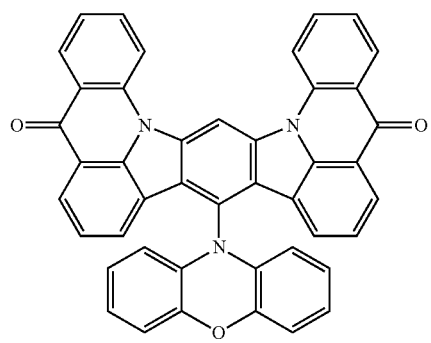
5
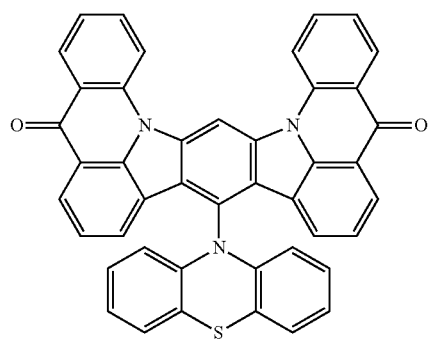
6
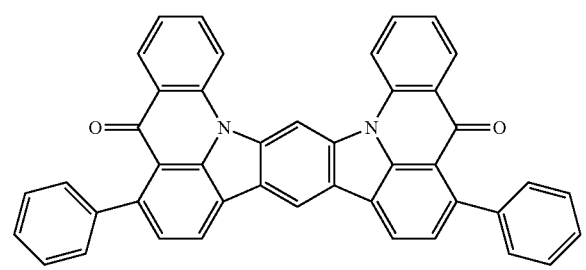
-continued
7
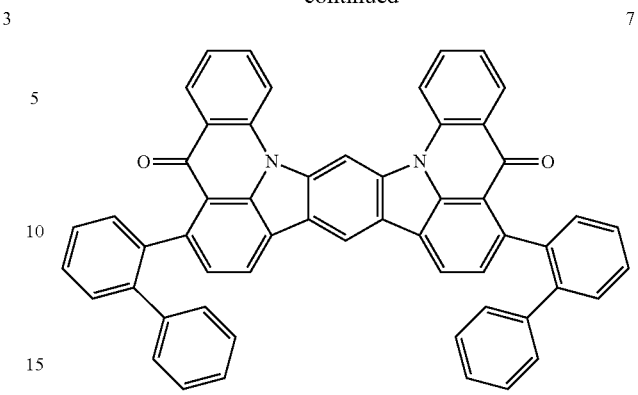
8
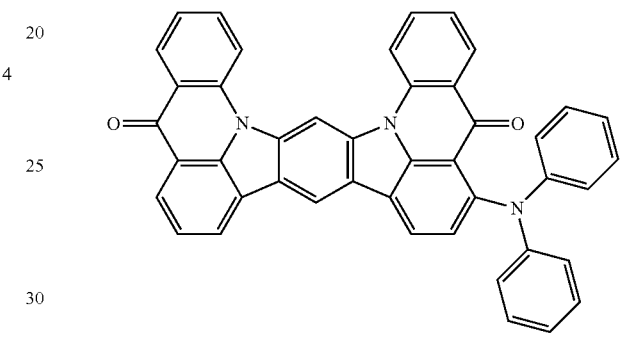
9
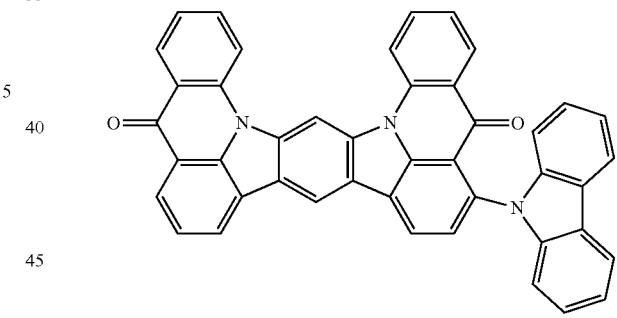
10
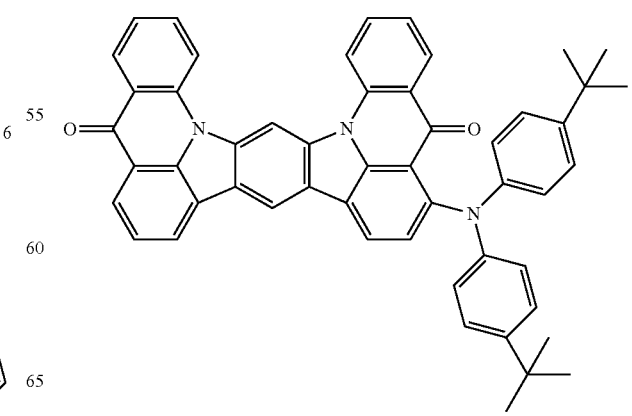

11
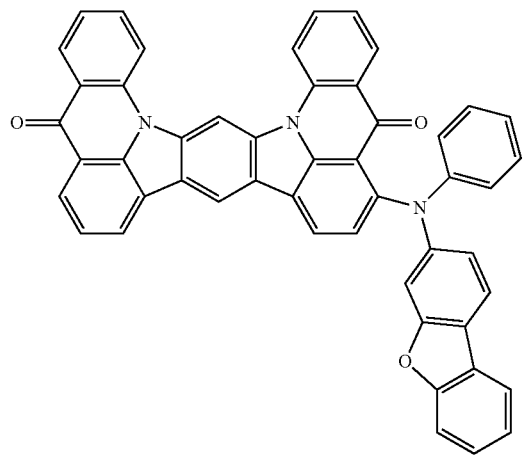
12
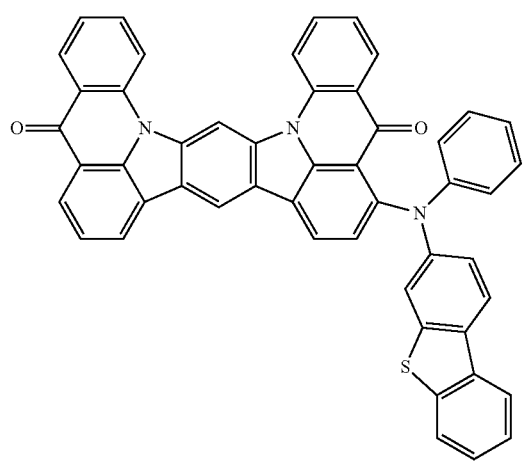
13
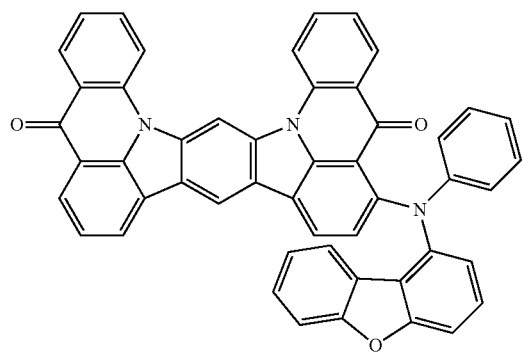
14
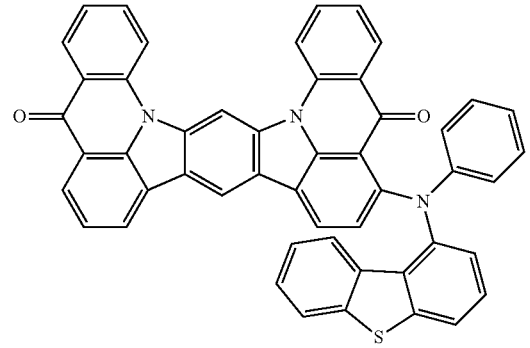
15
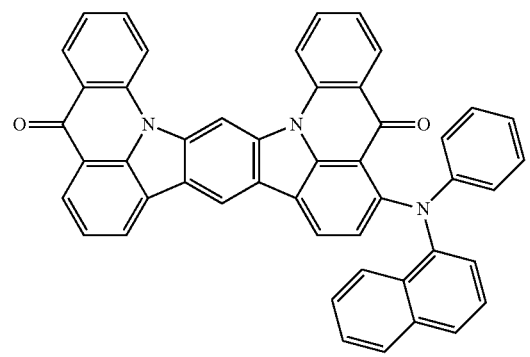
16
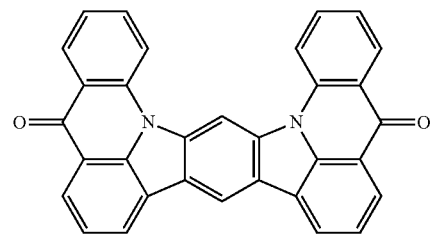
17
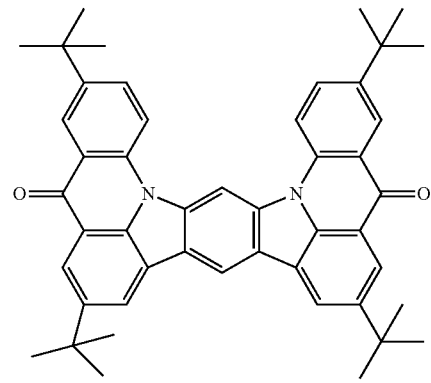

18
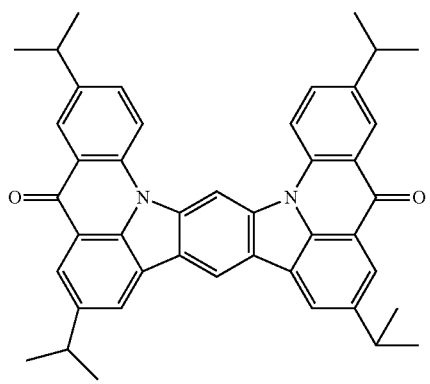
19
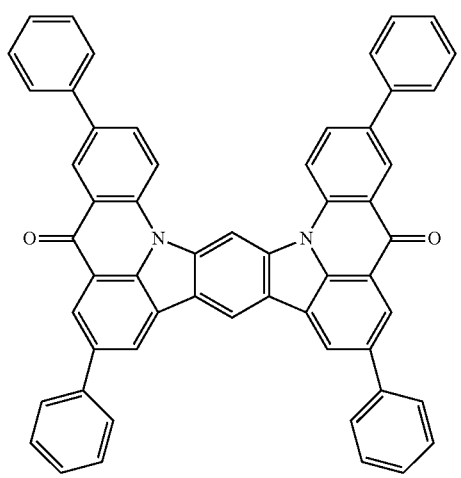
20
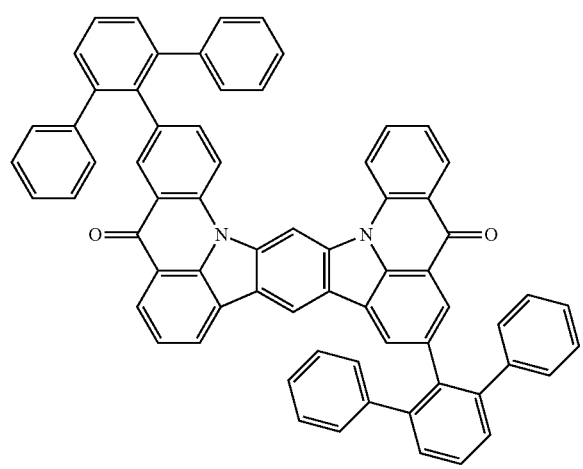
21
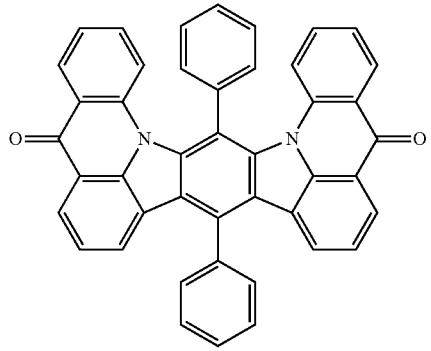
22
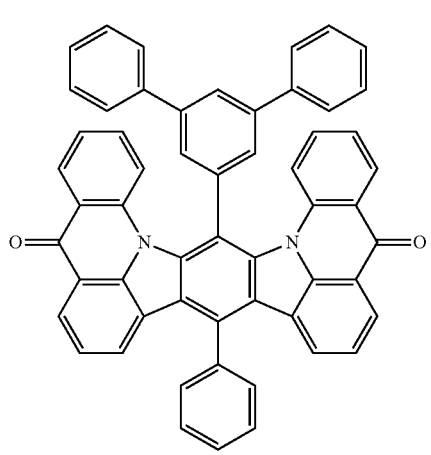
23
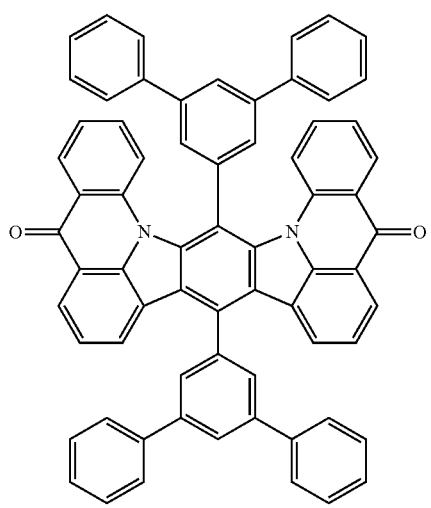

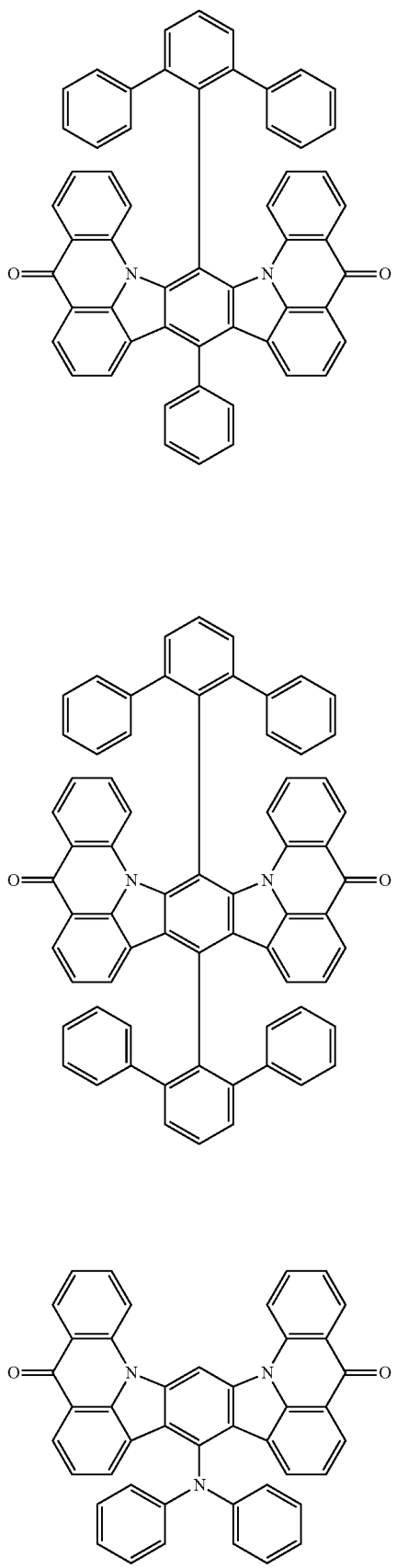
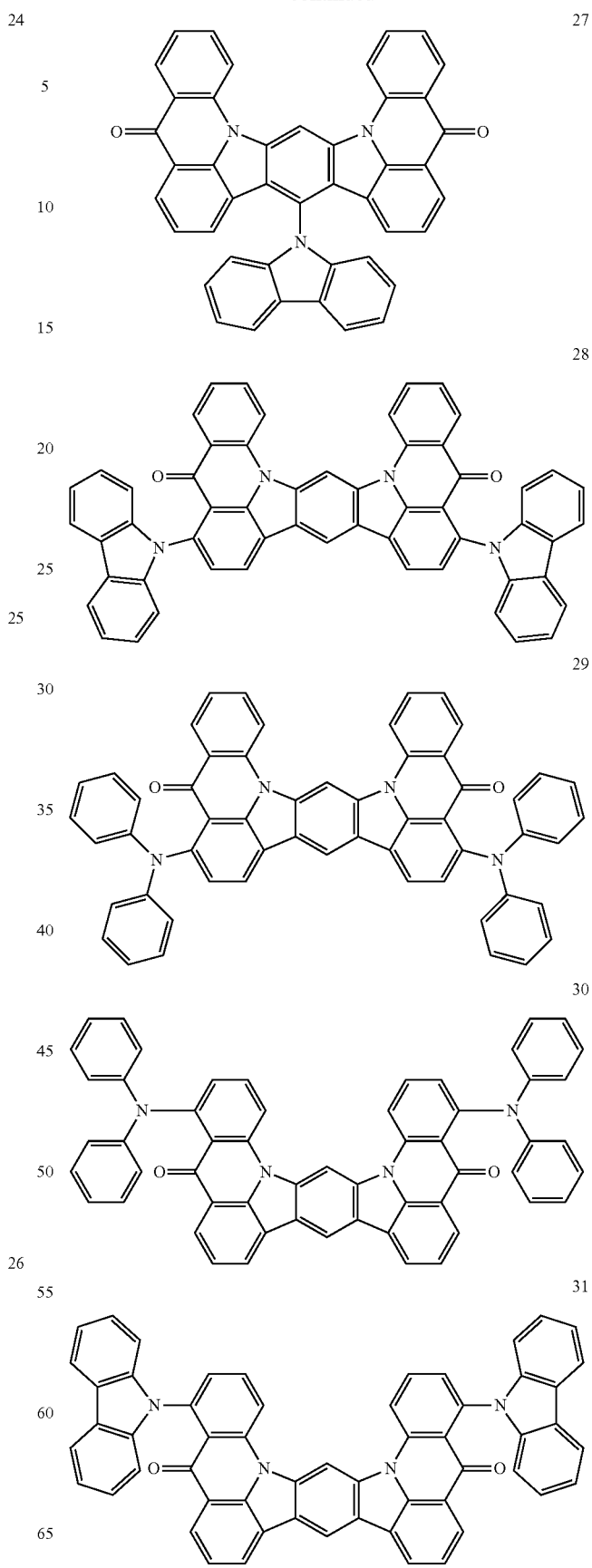

151
-continued
32
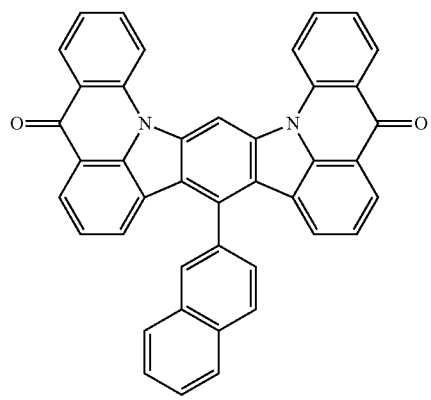
33
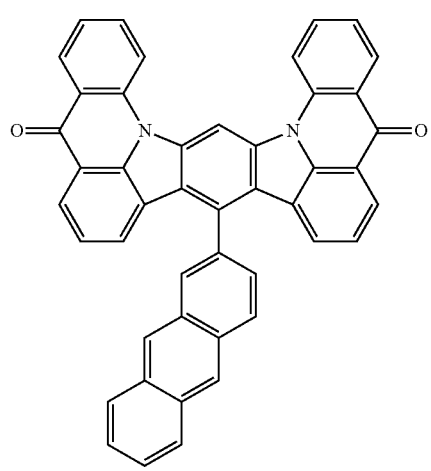
34
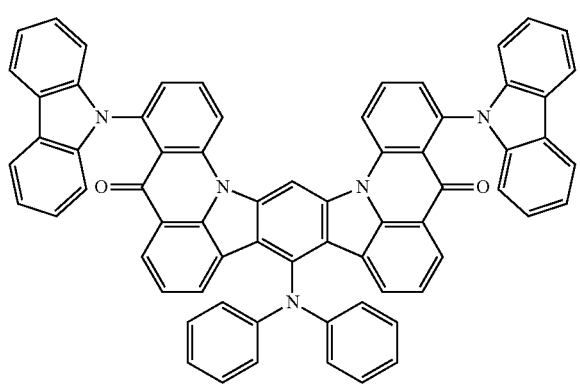
152
-continued
35
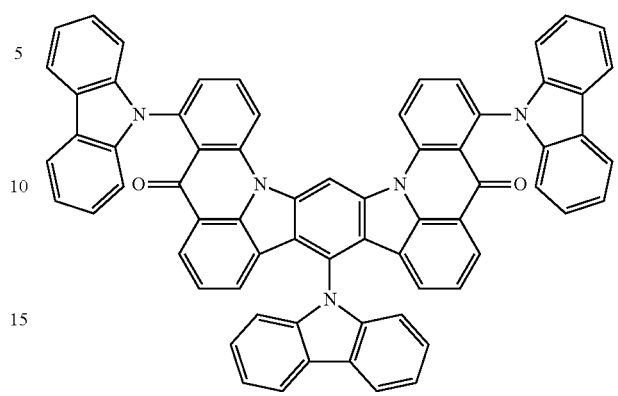
36
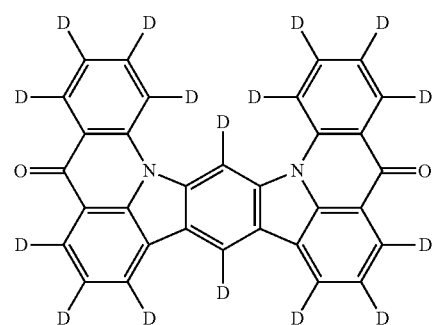
37
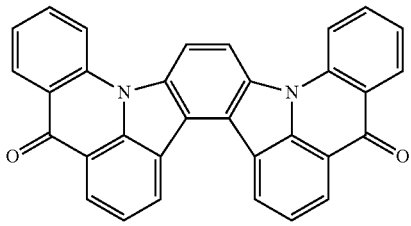
38
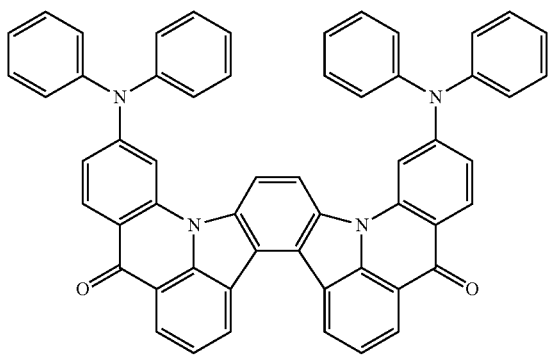

39
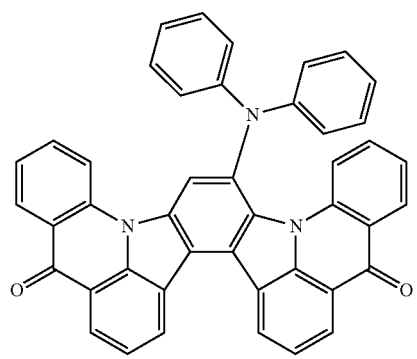
40
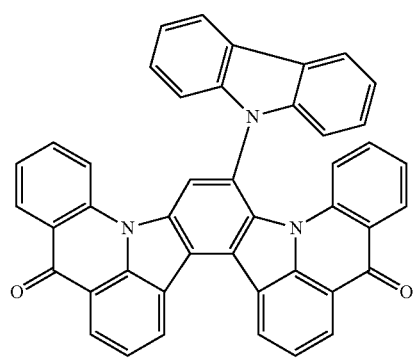
41
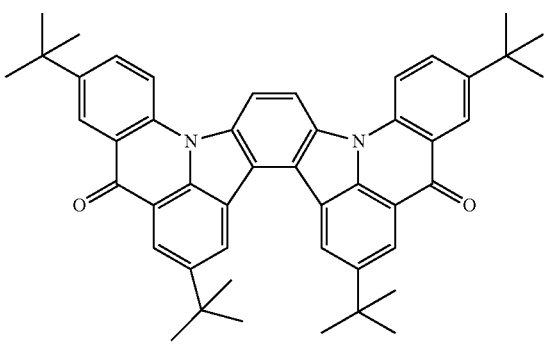
42
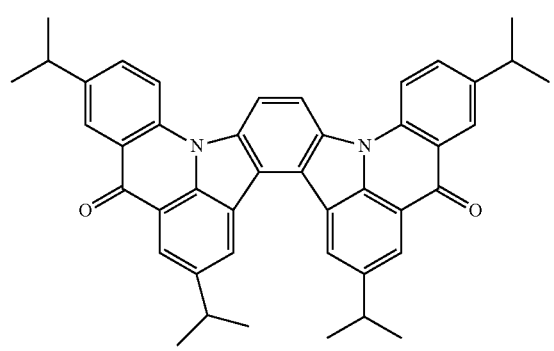
43
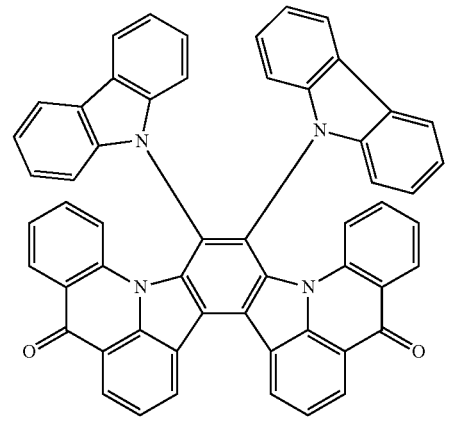
44
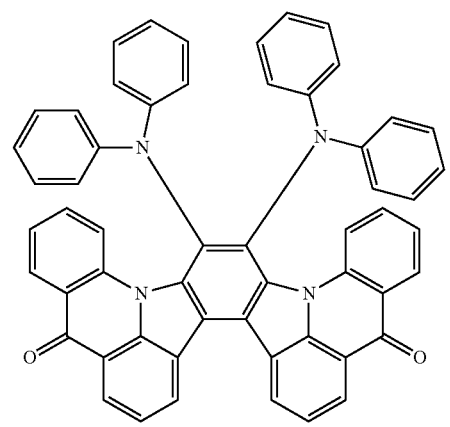
45
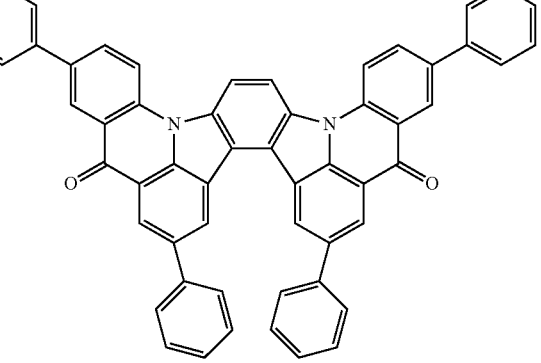
46
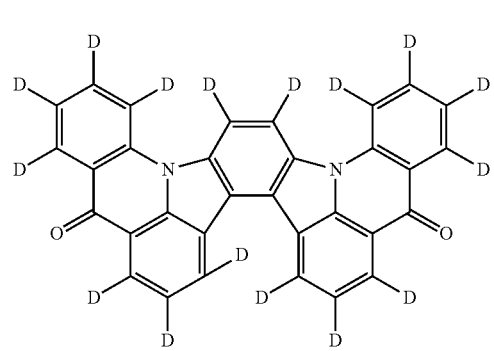

47
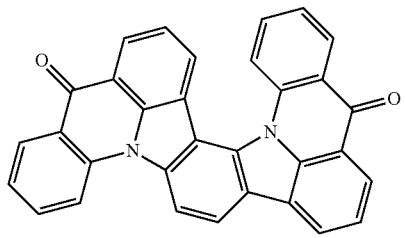
48
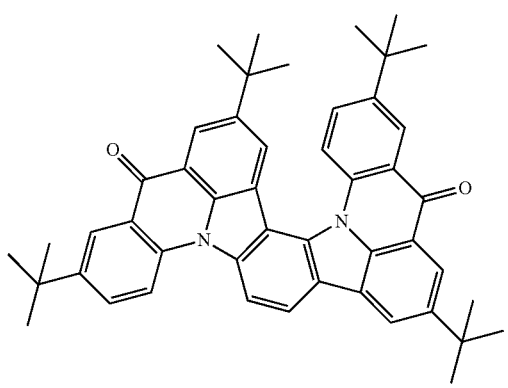
49
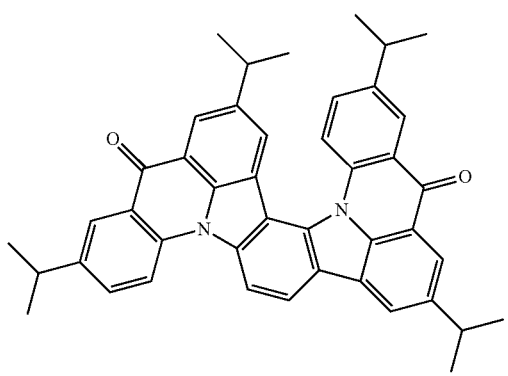
50
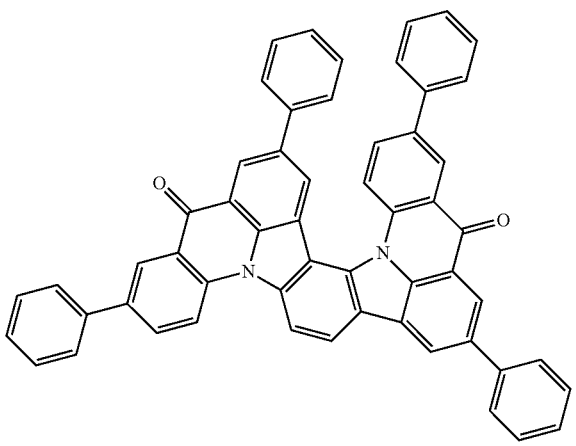
51
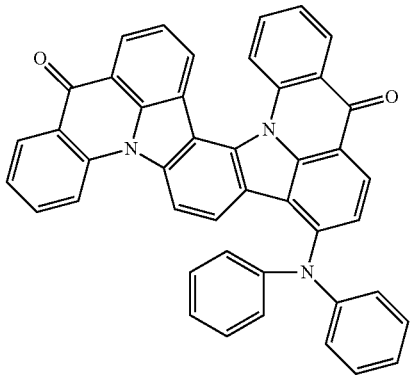
52
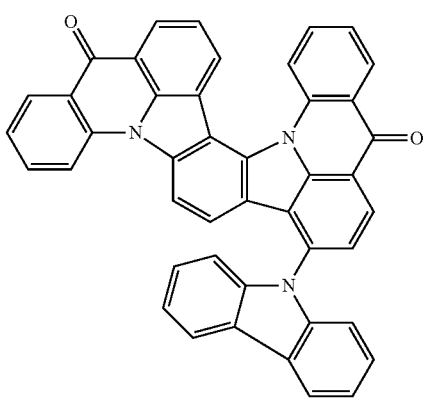
53
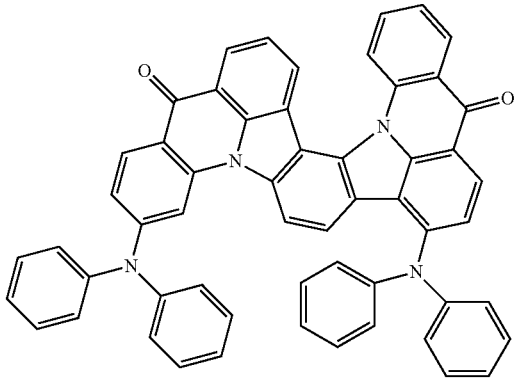

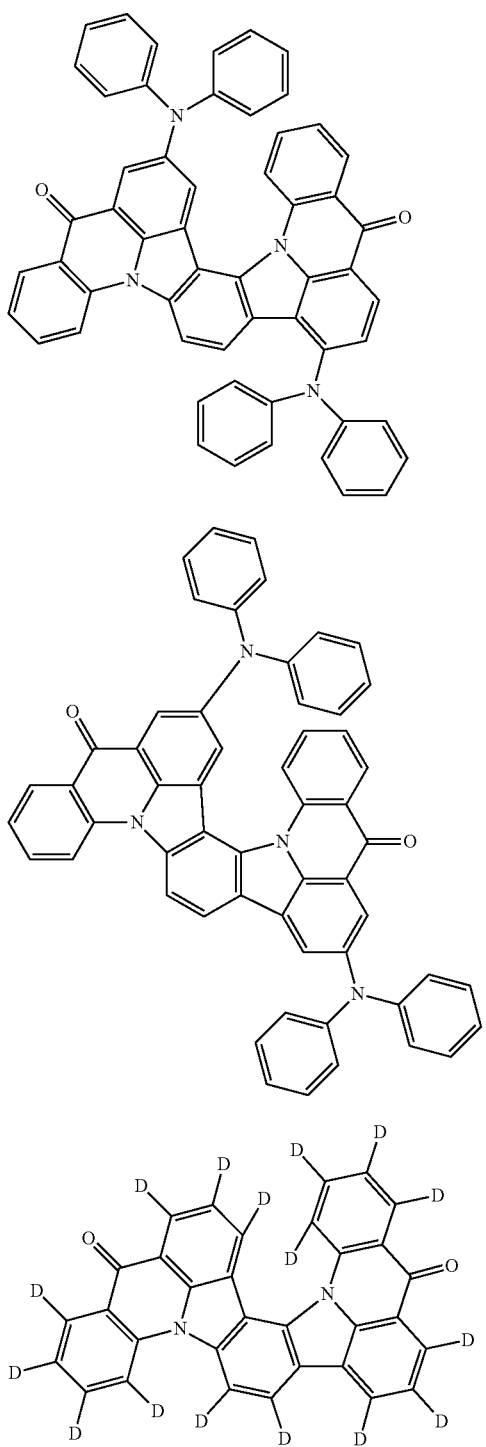
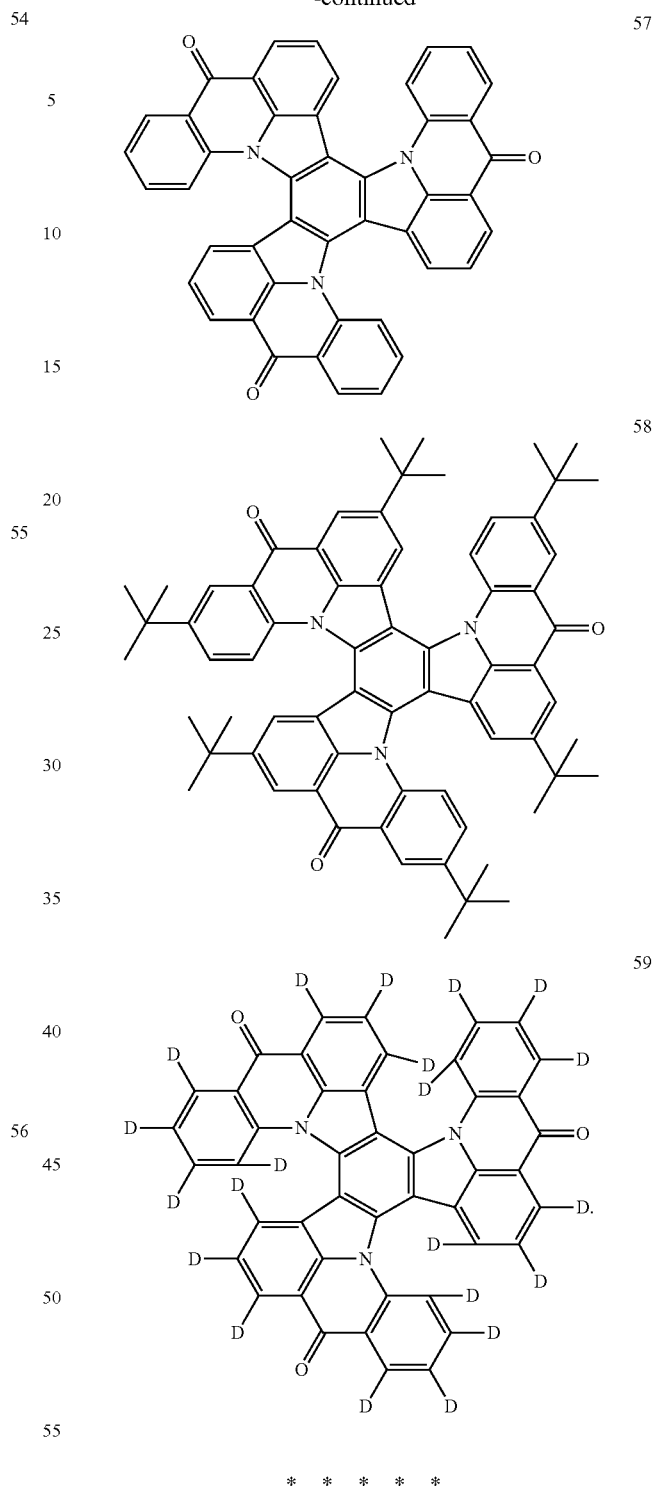
* * * * *